US012765382B2

(12) United States Patent
Huang et al.

(10) Patent No.: US 12,765,382 B2
(45) Date of Patent: Oct. 13, 2026

(54) SEMICONDUCTOR DEVICE COMPRISING GUARD RING AND METHODS OF FORMATION

(71) Applicant: Taiwan Semiconductor Manufacturing Company, Ltd., Hsinchu (TW)

(72) Inventors: Lin-Yu Huang, Hsinchu (TW); Shih-Fan Chen, Hsinchu City (TW); Sheng-Fu Hsu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 412 days.

(21) Appl. No.: 18/442,538

(22) Filed: Feb. 15, 2024

(65) Prior Publication Data

US 2025/0167140 A1 May 22, 2025

Related U.S. Application Data

(60) Provisional application No. 63/600,867, filed on Nov. 20, 2023.

(51) Int. Cl.
*H10W 42/00* (2026.01)
*H10W 20/00* (2026.01)
*H10W 20/43* (2026.01)

(52) U.S. Cl.
CPC ........... *H10W 42/00* (2026.01); *H10W 20/01* (2026.01); *H10W 20/43* (2026.01)

(58) Field of Classification Search
None
See application file for complete search history.

(56) References Cited

U.S. PATENT DOCUMENTS

2014/0070416 A1* 3/2014 Lu .......................... H10W 42/00 257/774
2016/0172359 A1* 6/2016 Yoon .................... H10D 84/834 257/401
2019/0067216 A1* 2/2019 Zhu ........................ H10W 42/00
2024/0162170 A1* 5/2024 Woo ...................... H10W 42/00

* cited by examiner

*Primary Examiner* — Nduka E Ojeh
(74) *Attorney, Agent, or Firm* — Harrity & Harrity, LLP

(57) ABSTRACT

A semiconductor device includes an integrated circuit and one or more guard rings around the integrated circuit in a top view of the semiconductor device. At least one guard ring of the one or more guard rings includes an active region in the substrate, a first plurality of elongated conductive structures extending in a first direction in the top view of the semiconductor device and arranged in a second direction in the top view of the semiconductor device, and a second plurality of elongated conductive structures extending in the second direction and arranged in the first direction. The combination of the first and second pluralities of elongated conductive structures forms a conductive grid above the active region, and provides increased coverage of the surface area of the active region relative to including only the first plurality of elongated conductive structures or only the second plurality of elongated conductive structures.

20 Claims, 33 Drawing Sheets

SEMICONDUCTOR DEVICE COMPRISING GUARD RING AND METHODS OF FORMATION

CROSS-REFERENCE TO RELATED APPLICATION

This Patent Application claims priority to U.S. Provisional Patent Application No. 63/600,867, filed on Nov. 20, 2023, and entitled "SEMICONDUCTOR DEVICE AND METHODS OF FORMATION." The disclosure of the prior Application is considered part of and is incorporated by reference into this Patent Application.

BACKGROUND

Guard rings are semiconductor structures that are often included around an integrated circuit of a semiconductor device to provide electrical isolation, electrostatic discharge (ESD) protection, and/or structural integrity, among other examples. A guard ring, for example, may be included to absorb charge carriers (e.g., electrons and/or holes) that form in a substrate of the semiconductor device due to substrate injection. These charge carriers, if accumulated in the substrate, may otherwise result in formation of a low-impedance path between the integrated circuit and an adjacent integrated circuit through the substrate. Such a low-impedance path may otherwise result in electrical shorting between the integrated circuits, which is referred to as "latch-up." Latch-up may lead to degraded operation of the semiconductor device and/or may cause damage to the semiconductor device, among other examples.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
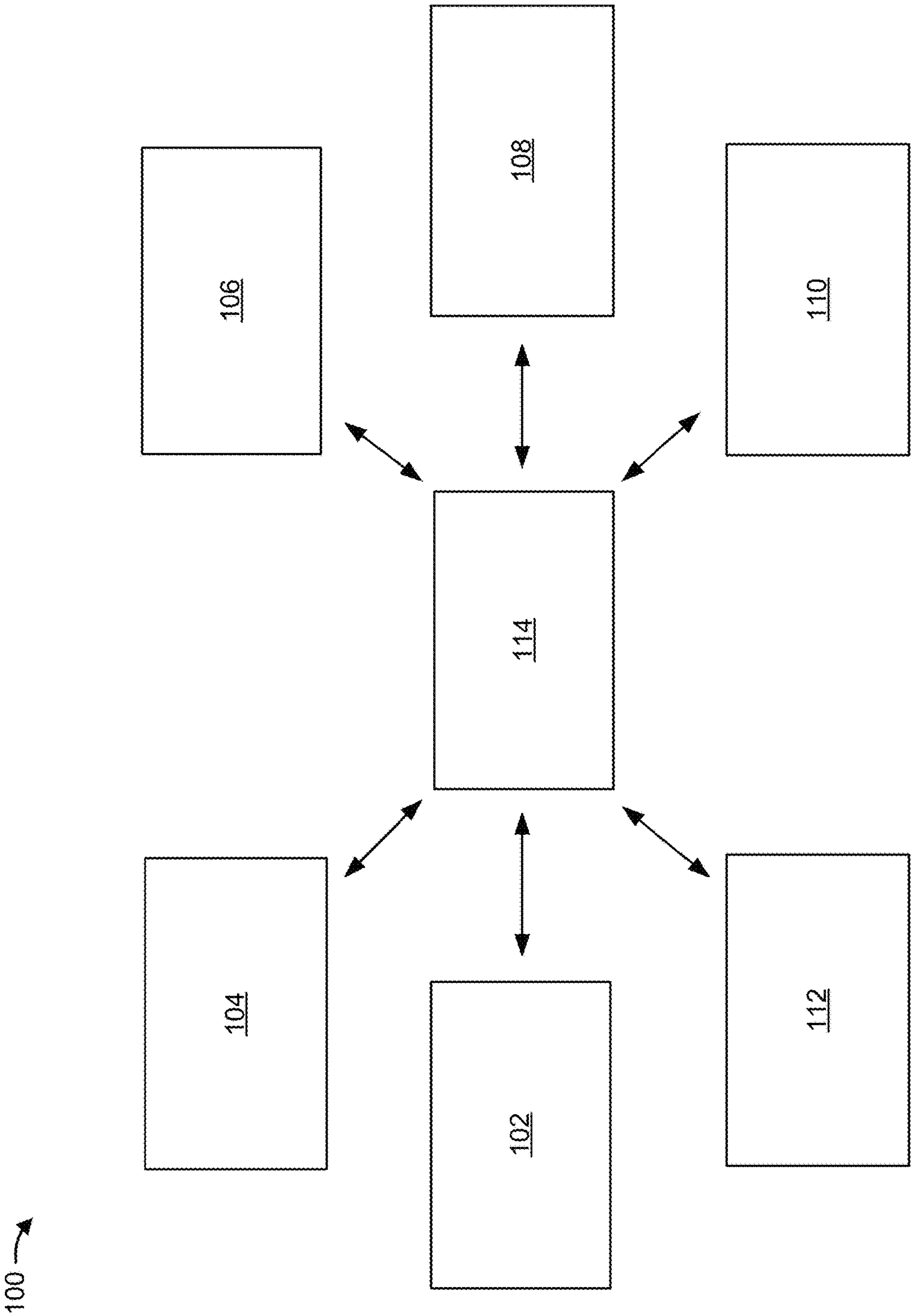
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some cases, a guard ring may conduct charge carriers through conductive structures above an active region of the guard ring. The charge carrier absorption performance in the guard ring may be based at least in part on the surface area of the active region covered by the conductive structures. If an insufficient surface area of the active region is covered by the conductive structures, the guard ring may not provide sufficient charge carrier absorption, which may increase the likelihood of latch-up in the semiconductor device. However, the size and/or density of the conductive structures may be limited due to the placement of the conductive structures within a footprint or boundary of an interconnect structure above the conductive structures. Thus, the size and/or density of the conductive structures cannot result in the conductive structures extending laterally outward from the footprint or boundary of the interconnect structure. Alternatively, the distance or spacing between adjacent integrated circuits in the semiconductor device may be increased in order to reduce the likelihood of latch-up, at the expense of reduced integrated circuit density and/or increased size of the semiconductor device.

In some implementations described herein, a semiconductor device includes an integrated circuit and one or more guard rings around the integrated circuit in a top view of the semiconductor device. At least one guard ring of the one or more guard rings includes an active region in the substrate, a first plurality of elongated conductive structures extending in a first direction in the top view of the semiconductor device and arranged in a second direction in the top view of the semiconductor device, and a second plurality of elongated conductive structures extending in the second direction and arranged in the first direction. The combination of the first and second pluralities of elongated conductive structures forms a conductive grid above the active region, and provides increased coverage of the surface area of the active region relative to including only the first plurality of elongated conductive structures or only the second plurality of elongated conductive structures. The combination of the first and second pluralities of elongated conductive structures enables the coverage of the surface area to be increased in both the first direction and the second direction within a footprint or boundary of an interconnect structure above the first and second pluralities of conductive structures. In this way, the first and second pluralities of conductive structures enable a high amount of charge carrier absorption to be achieved in the semiconductor device (which may reduce the likelihood of latch-up in the semiconductor device) while enabling a short distance or spacing between adjacent integrated circuits in the semiconductor device to be achieved.

FIG. 1 is a diagram of an example environment 100 in which systems and/or methods described herein may be implemented. As shown in FIG. 1, the example environment 100 may include a plurality of semiconductor processing tools 102-112 and a wafer/die transport tool 114. The plurality of semiconductor processing tools 102-112 may include a deposition tool 102, an exposure tool 104, a developer tool 106, an etch tool 108, a planarization tool 110, an ion implantation tool 112, and/or another type of semiconductor processing tool. The tools included in example environment 100 may be included in a semiconductor clean room, a semiconductor foundry, a semiconductor processing facility, and/or manufacturing facility, among other examples.

The deposition tool 102 is a semiconductor processing tool that includes a semiconductor processing chamber and one or more devices capable of depositing various types of materials onto a substrate. In some implementations, the deposition tool 102 includes a spin coating tool that is capable of depositing a photoresist layer on a substrate such as a wafer. In some implementations, the deposition tool 102 includes a chemical vapor deposition (CVD) tool such as a plasma-enhanced CVD (PECVD) tool, a high-density plasma CVD (HDP-CVD) tool, a sub-atmospheric CVD (SACVD) tool, a low-pressure CVD (LPCVD) tool, an atomic layer deposition (ALD) tool, a plasma-enhanced atomic layer deposition (PEALD) tool, or another type of CVD tool. In some implementations, the deposition tool 102 includes a physical vapor deposition (PVD) tool, such as a sputtering tool or another type of PVD tool. In some implementations, the deposition tool 102 includes an epitaxial tool that is configured to form layers and/or regions of a device by epitaxial growth. In some implementations, the example environment 100 includes a plurality of types of deposition tools 102.

In some implementations, a deposition tool 102 includes an electroplating tool and/or another type of plating tool that is capable of plating a substrate (e.g., a wafer, a semiconductor device, and/or the like) or a portion thereof with one or more metals. For example, a deposition tool 102 may include a copper electroplating device, an aluminum electroplating device, a nickel electroplating device, a tin electroplating device, a compound material or alloy (e.g., tin-silver, tin-lead, and/or the like) electroplating device, and/or an electroplating device for one or more other types of conductive materials, metals, and/or similar types of materials.

The exposure tool 104 is a semiconductor processing tool that is capable of exposing a photoresist layer to a radiation source, such as an ultraviolet light (UV) source (e.g., a deep UV light source, an extreme UV light (EUV) source, and/or the like), an x-ray source, an electron beam (e-beam) source, and/or the like. The exposure tool 104 may expose a photoresist layer to the radiation source to transfer a pattern from a photomask to the photoresist layer. The pattern may include one or more semiconductor device layer patterns for forming one or more semiconductor devices, may include a pattern for forming one or more structures of a semiconductor device, may include a pattern for etching various portions of a semiconductor device, and/or the like. In some implementations, the exposure tool 104 includes a scanner, a stepper, or a similar type of exposure tool.

The developer tool 106 is a semiconductor processing tool that is capable of developing a photoresist layer that has been exposed to a radiation source to develop a pattern transferred to the photoresist layer from the exposure tool 104. In some implementations, the developer tool 106 develops a pattern by removing unexposed portions of a photoresist layer. In some implementations, the developer tool 106 develops a pattern by removing exposed portions of a photoresist layer. In some implementations, the developer tool 106 develops a pattern by dissolving exposed or unexposed portions of a photoresist layer through the use of a chemical developer.

The etch tool 108 is a semiconductor processing tool that is capable of etching various types of materials of a substrate, wafer, or semiconductor device. For example, the etch tool 108 may include a wet etch tool, a dry etch tool, and/or the like. In some implementations, the etch tool 108 includes a chamber that is filled with an etchant, and the substrate is placed in the chamber for a particular time period to remove particular amounts of one or more portions of the substrate. In some implementations, the etch tool 108 may etch one or more portions of the substrate using a plasma etch or a plasma-assisted etch, which may involve using an ionized gas to isotropically or directionally etch the one or more portions.

The planarization tool 110 is a semiconductor processing tool that is capable of polishing or planarizing various layers of a wafer or semiconductor device. For example, a planarization tool 110 may include a chemical mechanical planarization (CMP) tool and/or another type of planarization tool that polishes or planarizes a layer or surface of deposited or plated material. The planarization tool 110 may polish or planarize a surface of a semiconductor device with a combination of chemical and mechanical forces (e.g., chemical etching and free abrasive polishing). The planarization tool 110 may utilize an abrasive and corrosive chemical slurry in conjunction with a polishing pad and retaining ring (e.g., typically of a greater diameter than the semiconductor device). The polishing pad and the semiconductor device may be pressed together by a dynamic polishing head and held in place by the retaining ring. The dynamic polishing head may rotate with different axes of rotation to remove material and even out any irregular topography of the semiconductor device, making the semiconductor device flat or planar.

The ion implantation tool 112 is a semiconductor processing tool that is used to implant ions into a substrate such as a semiconductor wafer. The ion implantation tool 112 generates ions in an arc chamber from a source material such as a gas or a solid. The source material is provided into the arc chamber, and an arc voltage is discharged between a cathode and an electrode to produce a plasma containing ions of the source material. One or more extraction electrodes are used to extract the ions from the plasma in the arc chamber and accelerate the ions to form an ion beam. The ion beam may be directed toward the substrate such that the ions are implanted below the surface of the substrate to dope the substrate.

Wafer/die transport tool 114 includes a mobile robot, a robot arm, a tram or rail car, an overhead hoist transport (OHT) system, an automated materially handling system (AMHS), and/or another type of device that is configured to transport substrates and/or semiconductor devices between semiconductor processing tools 102-112, that is configured to transport substrates and/or semiconductor devices between processing chambers of the same semiconductor processing tool, and/or that is configured to transport substrates and/or semiconductor devices to and from other locations such as a wafer rack, a storage room, and/or the like. In some implementations, wafer/die transport tool 114 may be a programmed device that is configured to travel a particular path and/or may operate semi-autonomously or autonomously. In some implementations, the example environment 100 includes a plurality of wafer/die transport tools 114.

For example, the wafer/die transport tool 114 may be included in a cluster tool or another type of tool that includes a plurality of processing chambers, and may be configured to transport substrates and/or semiconductor devices between the plurality of processing chambers, to transport substrates and/or semiconductor devices between a processing chamber and a buffer area, to transport substrates and/or semiconductor devices between a processing chamber and an interface tool such as an equipment front end module (EFEM), and/or to transport substrates and/or semiconductor devices between a processing chamber and a transport carrier (e.g., a front opening unified pod (FOUP)), among other examples. In some implementations, a wafer/die transport tool 114 may be included in a multi-chamber (or cluster) deposition tool 102, which may include a pre-clean processing chamber (e.g., for cleaning or removing oxides, oxidation, and/or other types of contamination or byproducts from a substrate and/or semiconductor device) and a plurality of types of deposition processing chambers (e.g., processing chambers for depositing different types of materials, processing chambers for performing different types of deposition operations). In these implementations, the wafer/die transport tool 114 is configured to transport substrates and/or semiconductor devices between the processing chambers of the deposition tool 102 without breaking or removing a vacuum (or an at least partial vacuum) between the processing chambers and/or between processing operations in the deposition tool 102, as described herein.

In some implementations, one or more of the semiconductor processing tools 102-112 and/or the wafer/die transport tool 114 may be used to perform one or more semiconductor processing operations described herein. For example, one or more of the semiconductor processing tools 102-112 and/or the wafer/die transport tool 114 may be used to provide an active region around an integrated circuit device of a semiconductor device; form, above the active region, a first plurality of conductive structures extending in a first direction of the semiconductor device and arranged in a second direction in the semiconductor device that is approximately perpendicular with the first direction; form, above the active region, a second plurality of conductive structures extending in the second direction and arranged in the first direction, where the first plurality of conductive structures and the second plurality of conductive structures intersect to form a guard ring structure above the active region; and/or form one or more interconnect structures above the guard ring structure, among other examples.

In some implementations, one or more of the semiconductor processing tools 102-112 and/or the wafer/die transport tool 114 may be used to perform one or more semiconductor processing operations described in connection with FIGS. 3A-3D, 5A-5E, and/or 13, among other examples.

The number and arrangement of devices shown in FIG. 1 is provided as an example. In practice, there may be additional devices, fewer devices, different devices, or differently arranged devices than those shown in FIG. 1. Furthermore, two or more devices shown in FIG. 1 may be implemented within a single device, or a single device shown in FIG. 1 may be implemented as multiple, distributed devices. Additionally, or alternatively, a set of devices (e.g., one or more devices) of the example environment 100 may perform one or more functions described as being performed by another set of devices of the example environment 100.

FIGS. 2A-2I are diagrams of example implementations of a semiconductor device 200 described herein. The semiconductor device 200 includes an example of a semiconductor device, such as a microprocessor (e.g., a central processing units (CPU)), a graphics processing units (GPU)), a memory device, an image sensor, and/or radio frequency (RF) device (e.g., an RF amplifier, an RF front-end device), among other examples.

Figure 2A:
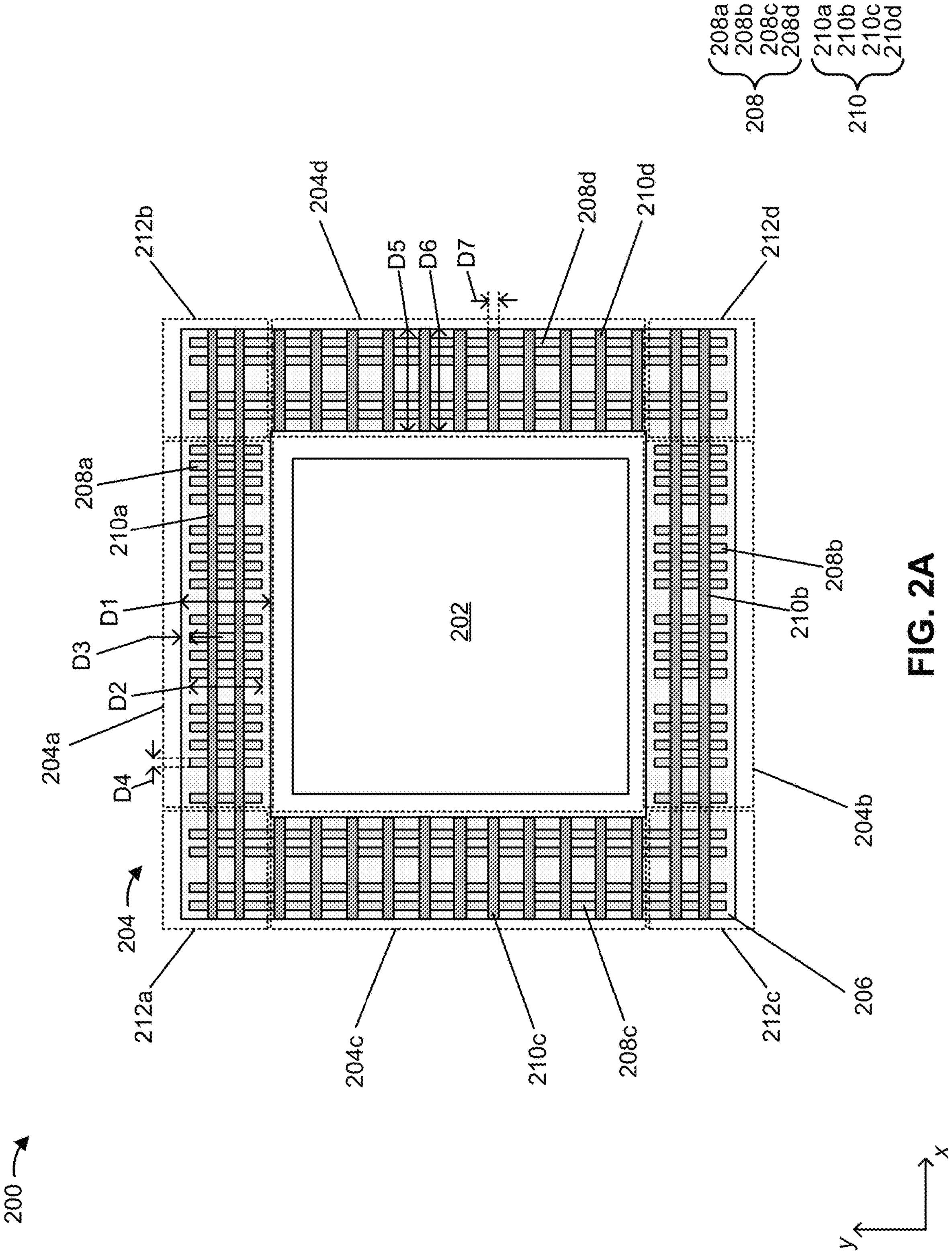
FIGS. 2A-2I are diagrams of example implementations of a semiconductor device described herein.
Figure 2B:
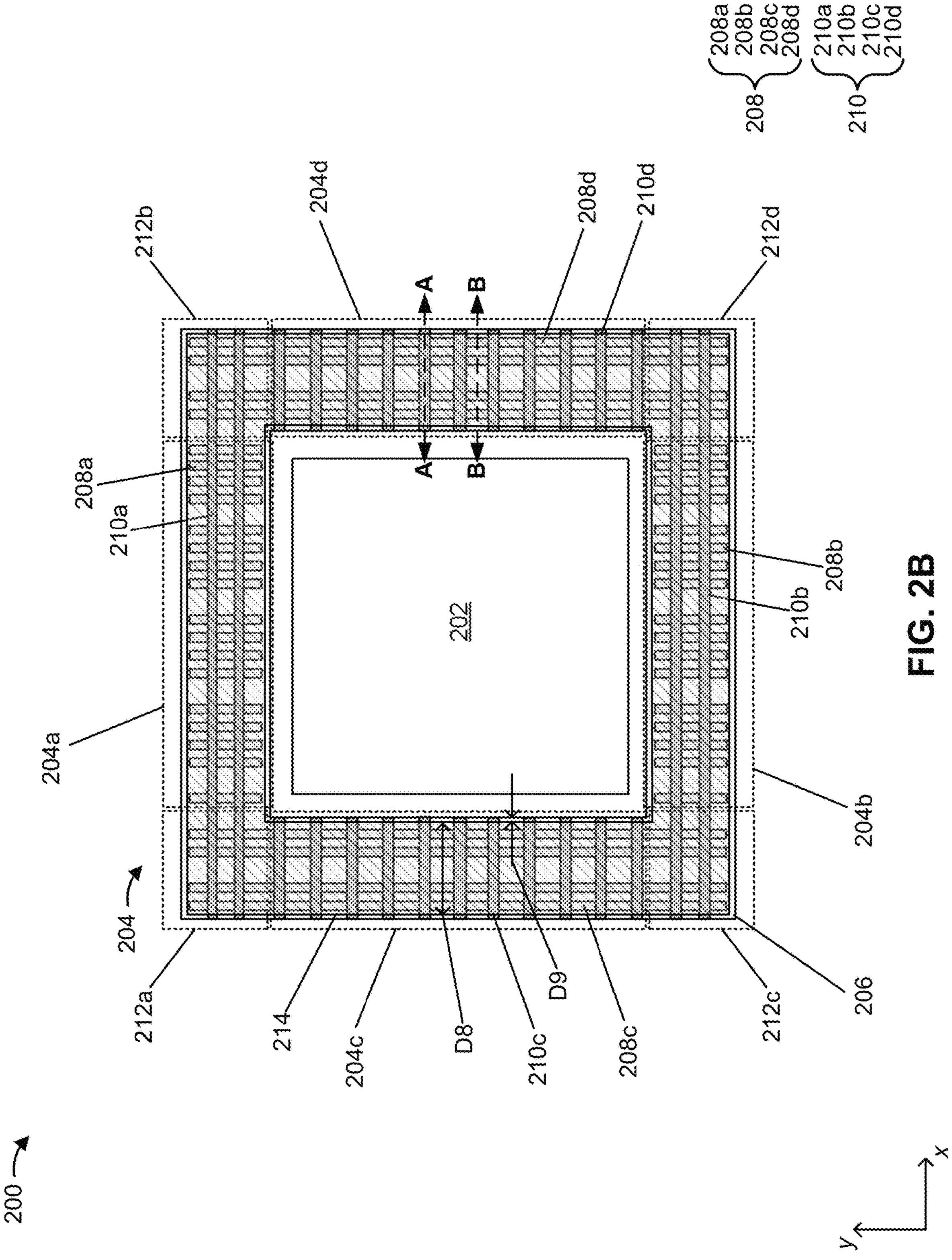

FIGS. 2A and 2B illustrate top-down views of an example implementation of the semiconductor device 200. As shown in FIGS. 2A and 2B, the semiconductor device 200 includes an integrated circuit 202 and a guard ring structure 204 around the integrated circuit 202. The integrated circuit 202 may include one or more transistors, a memory cell array, and/or another type of integrated circuit 202. The transistor(s) may include planar transistor(s), fin-based transistor(s) (e.g., fin field effect transistor(s) (finFET(s)), nanostructure transistor(s) (e.g., nanowire transistor(s), nanosheet transistor(s), nanoribbon transistor(s), nanotube transistor(s), multi-bridge channel transistor(s), gate-all-around (GAA) transistor(s)), and/or another type of transistor(s). The size, shape, and/or orientation of the integrated circuit 202 illustrated in FIGS. 2A and 2B are examples, and other sizes, shapes, and/or orientations for the integrated circuit 202 are within the scope of the present disclosure.

The integrated circuit 202 may be formed in and/or above a substrate of the semiconductor device 200. The substrate may include a silicon (Si) substrate, a substrate formed of a material including silicon, a III-V compound semiconductor material substrate such as gallium arsenide (GaAs), a silicon on insulator (SOI) substrate, a germanium (Ge) substrate, a silicon germanium (SiGe) substrate, a silicon carbide (SiC) substrate, or another type of semiconductor substrate.

The guard ring structure 204 surrounds the integrated circuit 202 in the top view of the semiconductor device 200. The guard ring structure 204 is included around the integrated circuit 202 to provide electrical isolation, electrostatic discharge (ESD) protection, and/or structural integrity, for the integrated circuit 202 and/or other devices of the semiconductor device 200. The guard ring structure 204 includes an active region 206 around the integrated circuit 202 and a plurality of conductive structures 208 and 210 above the active region 206. The conductive structures 208 and 210 intersect to form a conductive grid of the guard ring structure 204 above the active region 206. The conductive structures 208 and 210 absorb charge carriers (e.g., electrons and/or holes) from the active region 206 that form in the substrate of the semiconductor device 200 due to substrate injection. In this way, the guard ring structure 204 prevents or reduces the likelihood of formation of low-impedance paths between the integrated circuit 202 and adjacent devices in the semiconductor device 200 through the substrate.

The active region 206 may include a portion of the substrate of the semiconductor device 200 around the integrated circuit 202. In some implementations, the active region 206 includes a doped portion of the substrate of the semiconductor device 200 around the integrated circuit 202 that is doped with one or more types of dopants (e.g., n-type dopants, p-type dopants). In some implementations, the active region 206 includes a ring of epitaxially grown semiconductor material (e.g., silicon (Si)) in the substrate around the integrated circuit 202. This active region 206 may continuously surround the integrated circuit 202, meaning that there are no discontinuities in the active region 206 around the integrated circuit 202. Alternatively, the active region 206 may include a plurality of discontinuous segments around the integrated circuit 202.

The conductive structures 208 are arranged in an x-direction in the top view of the semiconductor device 200 (e.g., are spaced apart in the x-direction) and extend in ay-direction in the top view of the semiconductor device 200. The conductive structures 208 may be included over and/or on the active region 206. The conductive structures 208 may be formed at the same time as source/drain contacts of the transistors in the integrated circuit 202. The conductive structures 208 may be formed of the same electrically conductive material(s) as the source/drain contacts, such as cobalt (Co), tungsten (W), ruthenium (Ru), titanium (Ti), copper, (Cu), and/or aluminum (Al), among other examples.

The conductive structures 208 may be arranged in the guard ring structure 204 in a plurality of sets of one or more conductive structures 208. For example, the guard ring structure 204 may include a plurality of segments, including a segment 204*a*, a segment 204*b*, a segment 204*c*, and a segment 204*d*, among other examples. The segment 204*a* may include one or more conductive structures 208*a*, the segment 204*b* may include one or more conductive structures 208*b*, the segment 204*c* may include one or more conductive structures 208*c*, and the segment 204*d* may include one or more conductive structures 208*d*.

The segments 204*a* and 204*b* may be on opposing sides of the integrated circuit 202 and may extend in the x-direction such that the segments 204*a* and 204*b* are approximately parallel. The segments 204*c* and 204*d* may be on opposing sides of the integrated circuit 202 and may extend in the y-direction such that the segments 204*c* and 204*d* are approximately parallel. Thus, the segments 204*a* and 204*b* are approximately perpendicular to the segments 204*c* and 204*d*. In some implementations, the segment 204*c* may include a quantity of conductive structures 208*c* that are included in a range from 1 to 8. However, other values for the range are within the scope of the present disclosure. In some implementations, the segment 204*d* may include a quantity of conductive structures 208*d* that are included in a range from 1 to 8. However, other values for the range are within the scope of the present disclosure.

The segments 204*a* and 204*b* may each have a y-direction width corresponding to a dimension D1 in FIG. 2A. In some implementations, the dimension D1 is included in a range of approximately 0.1 microns to approximately 5 microns. However, other values for the range are within the scope of the present disclosure.

In the example implementation illustrated in FIGS. 2A and 2B, ay-direction length of the conductive structures 208*a* and, in some implementations, a y-direction length of the conductive structures 208*b* (corresponding to dimension D2) may be less than the y-direction width of the segments 204*a* and 204*b*. Thus, the conductive structures 208*a* and/or 208*b* are fully contained within a top view footprint of the active region 206 in the example implementation illustrated in FIGS. 2A and 2B.

A distance between an end of a conductive structure 208*a* and an edge of the active region 206 in the segment 204*a* (corresponding to dimension D3), and/or a distance between an end of a conductive structure 208*b* and an edge of the active region 206 in the segment 204*b*, may be included in a range of approximately 0.01 microns to approximately 1 micron. However, other values for the range are within the scope of the present disclosure.

Additionally and/or alternatively, at least a subset of the conductive structures 208*a* and/or at least a subset of the conductive structures 208*b* may have a y-direction length that is approximately equal to the y-direction width of the active region 206 in the segments 204*a* and/or 204*b* (e.g., dimension D2 may be approximately equal to dimension D1).

An x-direction width of a conductive structure 208 (corresponding to dimension D4) may be included in a range of approximately 0.02 microns to approximately 1 micron. However, other values for the range are within the scope of the present disclosure.

The conductive structures 210 are arranged in the y-direction in the top view of the semiconductor device 200 (e.g., are spaced apart in the y-direction) and extend in the x-direction in the top view of the semiconductor device 200. The conductive structures 210 may be included over and/or on the active region 206. Thus, the conductive structures 210 are approximately perpendicular to the conductive structures 208. The conductive structures 210 may be formed at the same time as gate contacts of the transistors in the integrated circuit 202. The conductive structures 210 may be formed of the same electrically conductive material(s) as the source/drain contacts, such as cobalt (Co), tungsten (W), ruthenium (Ru), titanium (Ti), copper, (Cu), and/or aluminum (Al), among other examples.

The conductive structures 210 may be arranged in the guard ring structure 204 in a plurality of sets of one or more conductive structures 210. For example, the segment 204*a* may include one or more conductive structures 210*a*, the segment 204*b* may include one or more conductive structures 210*b*, the segment 204*c* may include one or more conductive structures 210*c*, and the segment 204*d* may include one or more conductive structures 210*d*. In some implementations, the segment 204*a* may include a quantity of conductive structures 210*a* that are included in a range from 1 to 8. However, other values for the range are within the scope of the present disclosure. In some implementations, the segment 204*b* may include a quantity of conductive structures 210*b* that are included in a range from 1 to 8. However, other values for the range are within the scope of the present disclosure.

The segments 204*c* and 204*d* may each have an x-direction width corresponding to a dimension D5 in FIG. 2A. In the example implementation illustrated in FIGS. 2A and 2B, an x-direction length of the conductive structures 210*d* and, in some implementations, an x-direction length of the conductive structures 210*c* (corresponding to dimension D6) may be approximately equal to the y-direction width of the segments 204*c* and 204*d*. Thus, the conductive structures 210*c* and/or 210*d* are fully contained within a top view footprint of the active region 206 in the example implementation illustrated in FIGS. 2A and 2B.

Additionally and/or alternatively, at least a subset of the conductive structures 210*c* and/or at least a subset of the conductive structures 210*d* may have an x-direction length that is less than the x-direction width of the active region 206 in the segments 204*c* and/or 204*d* (e.g., dimension D5 may be less than dimension D6). In these implementations, a distance between an end of a conductive structure 210*d* and an edge of the active region 206 in the segment 204*d*, and/or a distance between an end of a conductive structure 210*c* and an edge of the active region 206 in the segment 204*c*, may be included in a range of approximately 0.01 microns to approximately 1 micron. However, other values for the range are within the scope of the present disclosure.

A y-direction width of a conductive structure 210 (corresponding to dimension D7) may be included in a range of approximately 0.02 microns to approximately 1 micron. However, other values for the range are within the scope of the present disclosure.

The conductive structures 208*a* in the segment 204*a* intersect with conductive structures 210*a* in the segment 204*a*. The conductive structures 210*a* may be continuous along the x-direction in the segment 204*a*, and the conductive structures 208*a* may be discontinuous in the y-direction in that the continuity of the conductive structures 208*a* is interrupted by the conductive structures 210*a*. The conductive structures 208*b* in the segment 204*b* intersect with conductive structures 210*b* in the segment 204*b*. The conductive structures 210*b* may be continuous along the x-direction in the segment 204*b*, and the conductive structures 208*b* may be discontinuous in the y-direction in that the continuity of the conductive structures 208*b* is interrupted by the conductive structures 210*b*.

The conductive structures 208*c* in the segment 204*c* intersect with conductive structures 210*c* in the segment 204*c*. The conductive structures 210*c* may be continuous along the x-direction in the segment 204*c*, and the conductive structures 208*c* may be discontinuous in the y-direction in that the continuity of the conductive structures 208*c* is interrupted by the conductive structures 210*c*. The conductive structures 208*d* in the segment 204*d* intersect with conductive structures 210*d* in the segment 204*d*. The conductive structures 210*d* may be continuous along the x-direction in the segment 204*d*, and the conductive structures 208*d* may be discontinuous in the y-direction in that the continuity of the conductive structures 208*d* is interrupted by the conductive structures 210*d*.

The length of the conductive structures 208*c* and 208*d* respectively in the segments 204*c* and 204*d* is greater than the length of the conductive structures 208*a* and 208*b* respectively in the segments 204*a* and 204*b*. The length of the conductive structures 210*a* and 210*b* respectively in the segments 204*a* and 204*b* is greater than the length of the conductive structures 210*c* and 210*d* respectively in the segments 204*c* and 204*d*.

The segments 204*a* and 204*c* of the guard ring structure 204 are connected by a corner region 212*a*. The segments 204*a* and 204*d* of the guard ring structure 204 are connected by a corner region 212*b*. The segments 204*b* and 204*c* of the guard ring structure 204 are connected by a corner region 212*c*. The segments 204*b* and 204*d* of the guard ring structure 204 are connected by a corner region 212*d*.

The conductive structures 208*c* continuously extend through the segment 204*c* and intersect with one or more conductive structures 210*a* and 210*b* respectively in the corner regions 212*a* and 212*c*. The conductive structures 208*d* continuously extend through the segment 204*d* and intersect with one or more conductive structures 210*a* and 210*b* respectively in the corner regions 212*b* and 212*d*. The conductive structures 210*a* continuously extend through the segment 204*a* and intersect with one or more conductive structures 208*c* and 208*d* respectively in the corner regions 212*a* and 212*b*. The conductive structures 210*b* continuously extend through the segment 204*b* and intersect with one or more conductive structures 210*c* and 210*d* respectively in the corner regions 212*c* and 212*d*.

As shown in FIG. 2B, an interconnect structure 214 is included above the guard ring structure 204 around the integrated circuit 202. The interconnect structure 214 includes a metallization layer (e.g., an M1 metallization layer), or a portion thereof, of the semiconductor device 200. Charge carriers absorbed from the active region 206 in the guard ring structure 204 may be provided to the interconnect structure 214 through the conductive structures 208 and 210. The conductive grid formed by the conductive structures 208 and 210 provides increased charge carrier absorption relative to including only the conductive structures 208 or only the conductive structures 210 in the guard ring structure 204. The interconnect structure 214 may include one or more electrically conductive materials such as tungsten (W), cobalt (Co), ruthenium (Ru), titanium (Ti), aluminum (Al), copper (Cu), gold (Au), and/or a combination thereof, among other examples of electrically conductive materials.

A top view width (e.g., in the x-direction, in they-direction) of the interconnect structure 214 (corresponding to dimension D8) may be less than the top view width of the active region 206 (e.g., the dimension D1, the dimension D5). In some implementations, the dimension D8 is included in a range of approximately 0.01 microns to approximately 4 microns. However, other values for the range are within the scope of the present disclosure. The interconnect structure 214 may be fully contained within the top view footprint of the active region 206. A distance between an edge of the interconnect structure 214 and an edge of the active region (corresponding to dimension D9) may be included in a range of approximately 0.01 microns to approximately 0.1 microns. However, other values for the range are within the scope of the present disclosure.

In the example implementation in FIG. 2B, the conductive structures 208 are fully contained within the top view footprint of the interconnect structure 214, and less than an entirety of the conductive structures 210 are contained within the top view footprint of the interconnect structure 214. In particular, ends of the conductive structures 210 extend laterally outward from the edges of the interconnect structure 214.

Figure 2C:
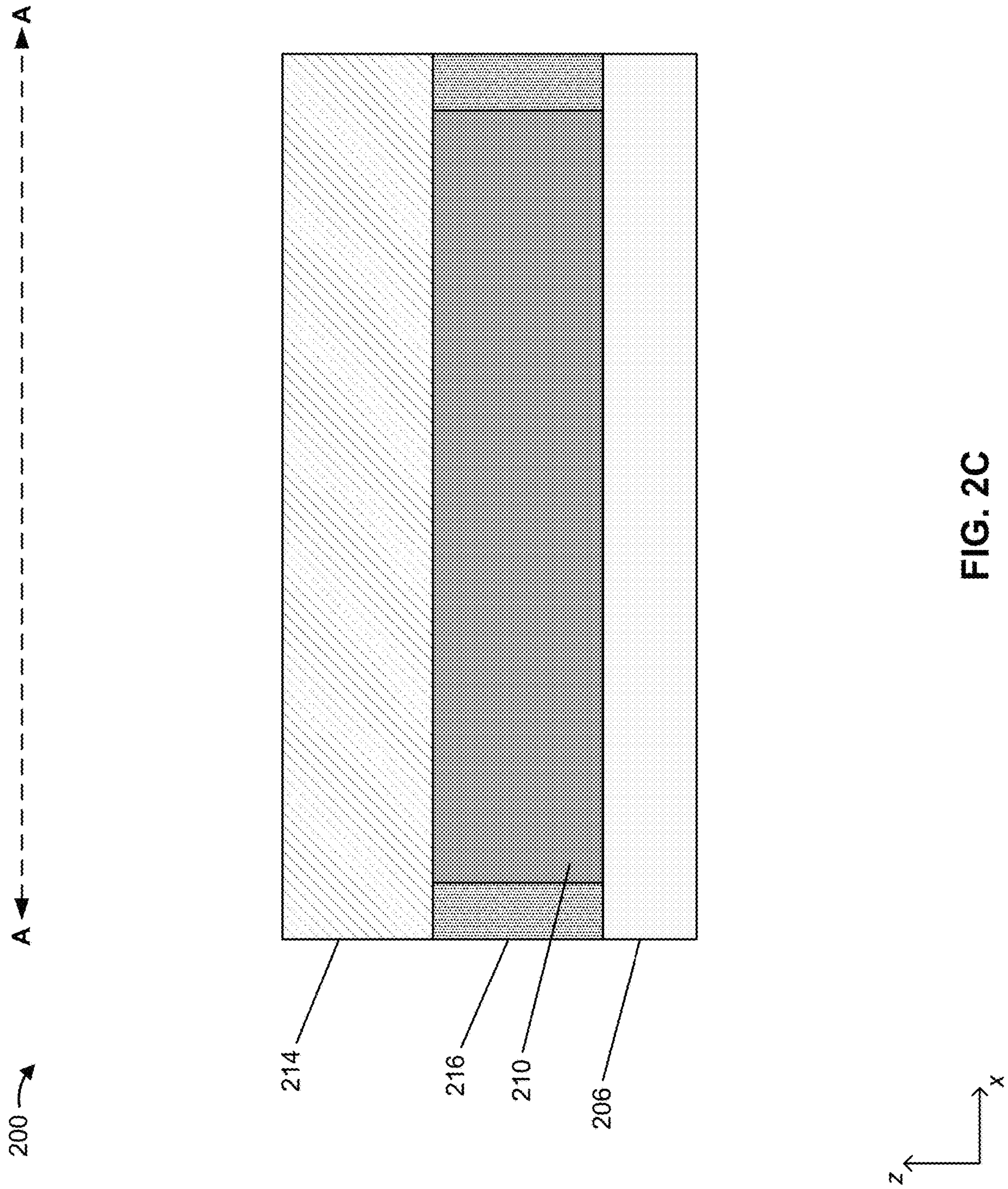
Figure 2D:
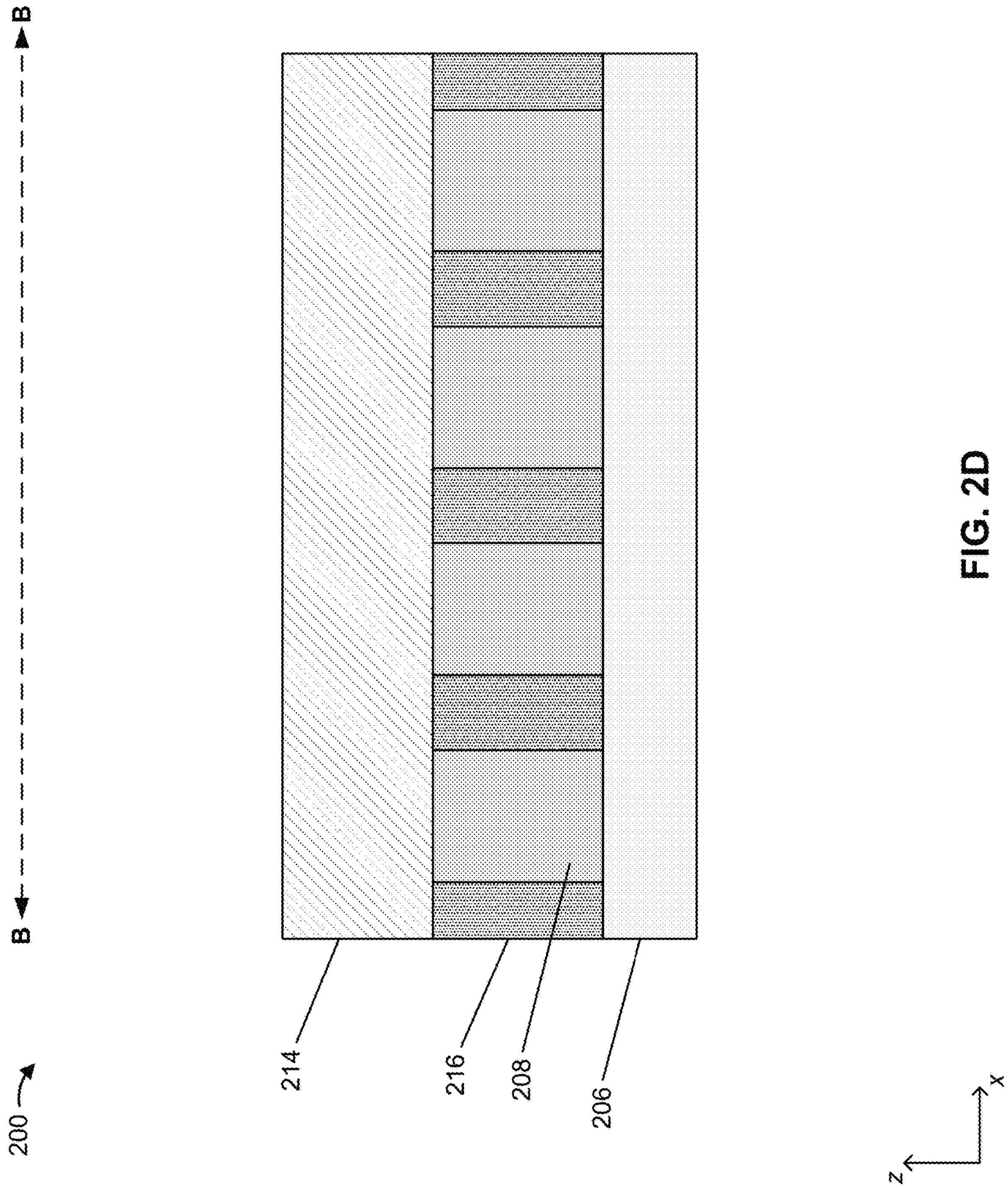

FIGS. 2C and 2D illustrate cross-sectional views of the example implementation of the semiconductor device 200 in FIGS. 2A and 2B. FIG. 2C illustrates a cross-sectional view along a line A-A in FIG. 2B. FIG. 2D illustrates a cross-sectional view along a line B-B in FIG. 2B.

As shown in FIG. 2C, the conductive structures 210 are located above and/or on the active region 206 in a z-direction in the semiconductor device 200, and the interconnect structure 214 is located above and/or on the conductive structures 210 in the z-direction. The conductive structures 210 may be physically isolated and/or electrically isolated from one another by dielectric regions 216. The dielectric regions 216 may include an interlayer dielectric (ILD) layer and/or another type of dielectric layer of the semiconductor device 200. The z-direction height of the conductive structures 210 and the z-direction height of the dielectric regions 216 may be approximately the same z-direction height such that the conductive structures 210 and the dielectric regions 216 are approximately co-planar.

The dielectric regions 216 may include an oxide (e.g., a silicon oxide ($SiO_x$) and/or another oxide material), an undoped silicate glass (USG), a boron-containing silicate glass (BSG), a fluorine-containing silicate glass (FSG), tetraethyl orthosilicate (TEOS), hydrogen silsesquioxane (HSQ), and/or another suitable dielectric material. In some implementations, the dielectric regions 216 include an extreme low dielectric constant (ELK) dielectric material having a dielectric constant that is less than approximately 2.5. Examples of ELK dielectric materials include carbon doped silicon oxide (C—$SiO_x$), amorphous fluorinated carbon (a-$C_xF_y$), parylene, bis-benzocyclobutenes (BCB), polytetrafluoroethylene (PTFE), a silicon oxycarbide (SiOC) polymer, porous hydrogen silsesquioxane (HSQ), porous methyl silsesquioxane (MSQ), porous polyarylether (PAE), and/or porous silicon oxide ($SiO_x$), among other examples.

As shown in FIG. 2D, the conductive structures 208 are located above and/or on the active region 206 in the z-direction in the semiconductor device 200, and the interconnect structure 214 is located above and/or on the conductive structures 208 in the z-direction. The conductive structures 208 may be physically isolated and/or electrically isolated from one another by the dielectric regions 216. The z-direction height of the conductive structures 208 and the z-direction height of the dielectric regions 216 may be approximately the same z-direction height such that the conductive structures 208 and the dielectric regions 216 are approximately co-planar. Moreover, the z-direction height of the conductive structures 208 and the z-direction height of the conductive structures 210 may be approximately the same z-direction height such that the conductive structures 208 and the conductive structures 210 are approximately co-planar.

Figure 2E:
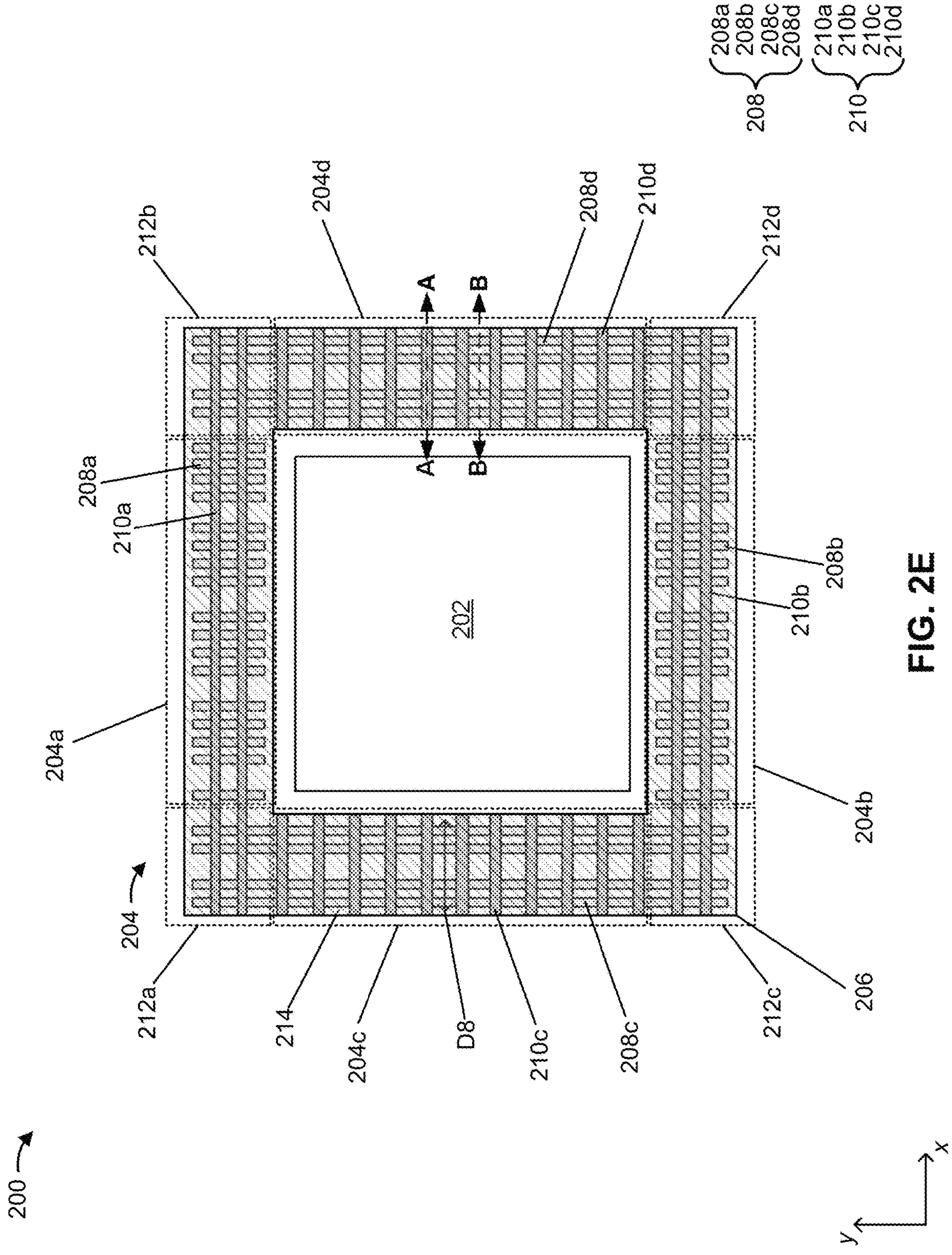

FIG. 2E illustrates a top-down view of another example implementation of the semiconductor device 200. The example implementation of the semiconductor device 200 illustrated in FIG. 2E is similar to the example implementation of the semiconductor device 200 illustrated in FIGS. 2A-2D, except that the edges of the interconnect structure 214 are substantially aligned with the edges of the active region 206. In other words, the top view width (dimension D8) of the interconnect structure 214, and the top view width (dimension D1, dimension D5) of the active region 206 are approximately equal. Thus, the conductive structures 208 and the conductive structures 210 are fully contained within the top view footprint of the interconnect structure 214 in the example implementation of the semiconductor device 200 illustrated in FIG. 2E.

Figure 2F:
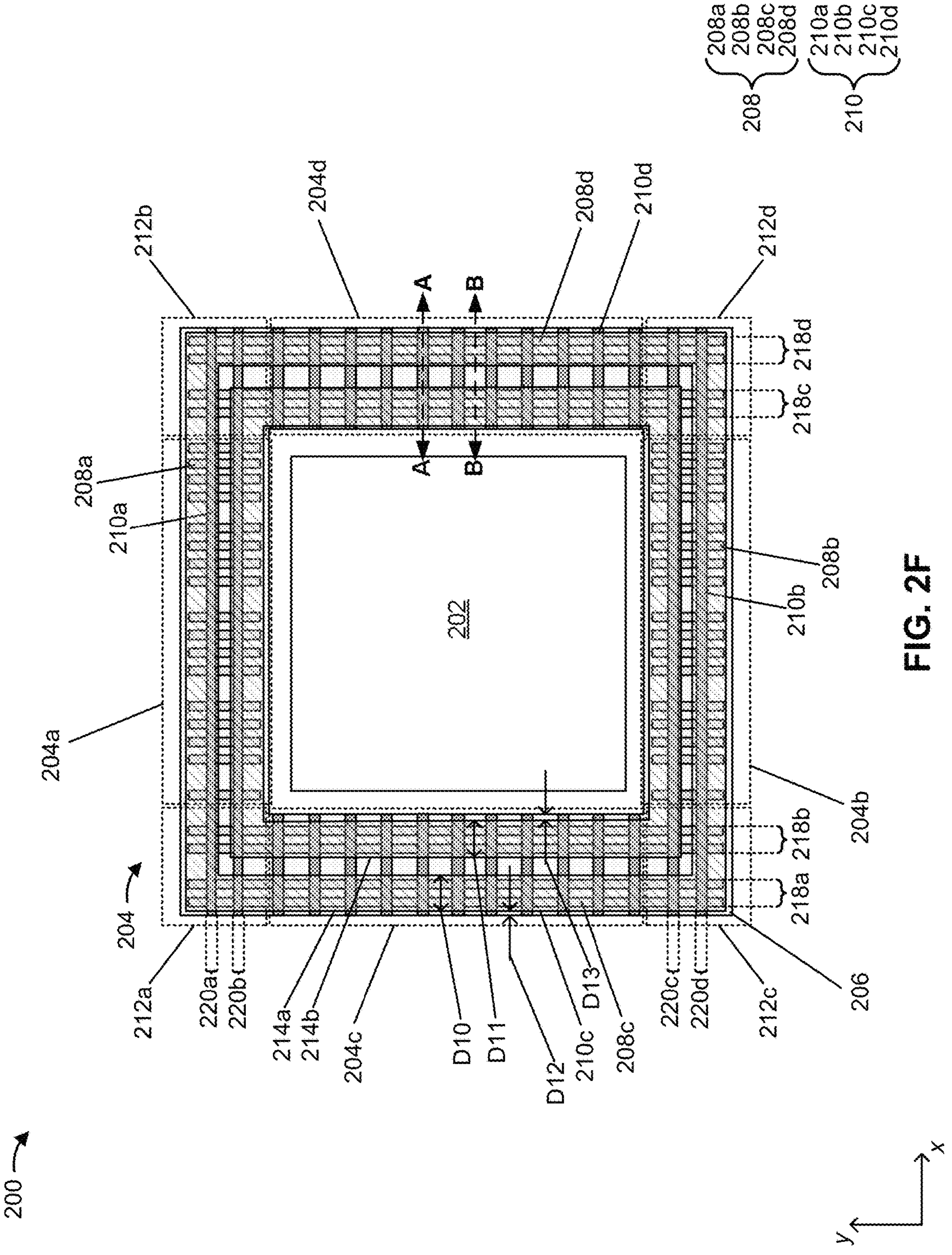

FIG. 2F illustrates a top-down view of another example implementation of the semiconductor device 200. The example implementation of the semiconductor device 200 illustrated in FIG. 2F is similar to the example implementation of the semiconductor device 200 illustrated in FIGS. 2A-2D, except that a plurality of interconnect structures **214*a* and 214*b* are included above the guard ring structure 204. The interconnect structure 214*a* may be an outer interconnect structure that surrounds the interconnect structure 214*b*, which may be an inner interconnect structure. The interconnect structures 214*a* and 214*b* may be spaced apart such that the interconnect structures 214*a* and 214*b*** are not in direct physical contact.

The interconnect structure **214*a* is located above a subset 218*a* of the conductive structures 208*c* in the segment 204*c* of the guard ring structure 204, and the interconnect structure 214*b* is located above another subset 218*b* of the conductive structures 208*c* in the segment 204*c*. The interconnect structures 214*a* and 214*b* extend in the y-direction across the conductive structures 210*c* in the segment 204*c*. In some implementations, the conductive structures 210*c* in the segment 204*c* extend in the x-direction laterally outward past the interconnect structures 214*a* and 214*b* such that portions of the conductive structures 210*c* are not under the interconnect structures 214*a* and 214*b***.

The interconnect structure **214*a* is located above a subset 218*c* of the conductive structures 208*d* in the segment 204*d* of the guard ring structure 204, and the interconnect structure 214*b* is located above another subset 218*d* of the conductive structures 208*d* in the segment 204*d*. The interconnect structures 214*a* and 214*b* extend in the y-direction across the conductive structures 210*d* in the segment 204*d*. In some implementations, the conductive structures 210*d* in the segment 204*d* extend in the x-direction laterally outward past the interconnect structures 214*a* and 214*b* such that portions of the conductive structures 210*d* are not under the interconnect structures 214*a* and 214*b***.

The interconnect structure **214*a* is located above a subset 220*a* of the conductive structures 210*a* in the segment 204*a* of the guard ring structure 204, and the interconnect structure 214*b* is located above another subset 220*b* of the conductive structures 208*a* in the segment 204*a*. The interconnect structures 214*a* and 214*b* extend in the x-direction across the conductive structures 208*a* in the segment 204*a***.

The interconnect structure **214*a* is located above a subset 220*c* of the conductive structures 210*b* in the segment 204*b* of the guard ring structure 204, and the interconnect structure 214*b* is located above another subset 220*d* of the conductive structures 210*b* in the segment 204*b*. The interconnect structures 214*a* and 214*b* extend in the y-direction across the conductive structures 210*d* in the segment 204*d***.

In the corner region **212*a*, the interconnect structure 214*a* is located over the subset 218*a* of the conductive structures 208*c*, over a portion of the subset 218*b* of the conductive structures 208*c*, over the subset 220*a* of the conductive structures 210*a*, and over a portion of the subset 220*b* of the conductive structures 210*a*. In the corner region 212*a*, the interconnect structure 214*b* is located over another portion of the subset 218*b* of the conductive structures 208*c*, and over another portion of the subset 220*b* of the conductive structures 210*d***.

In the corner region **212*b*, the interconnect structure 214*a* is located over the subset 218*d* of the conductive structures 208*d*, over a portion of the subset 218*c* of the conductive structures 208*d*, over the subset 220*a* of the conductive structures 210*a*, and over a portion of the subset 220*b* of the conductive structures 210*a*. In the corner region 212*b*, the interconnect structure 214*b* is located over another portion of the subset 218*c* of the conductive structures 208*d*, and over another portion of the subset 220*b* of the conductive structures 210*d***.

In the corner region **212*c*, the interconnect structure 214*a* is located over the subset 218*a* of the conductive structures 208*c*, over a portion of the subset 218*b* of the conductive structures 208*c*, over the subset 220*d* of the conductive structures 210*b*, and over a portion of the subset 220*c* of the conductive structures 210*b*. In the corner region 212*b*, the interconnect structure 214*b* is located over another portion of the subset 218*b* of the conductive structures 208*c*, and over another portion of the subset 220*c* of the conductive structures 210*b***.

In the corner region **212*d*, the interconnect structure 214*a* is located over the subset 218*d* of the conductive structures 208*d*, over a portion of the subset 218*c* of the conductive structures 208***d*, over the subset 220*d* of the conductive structures 210*b*, and over a portion of the subset 220*c* of the conductive structures 210*b*. In the corner region 212*b*, the interconnect structure 214*b* is located over another portion of the subset 218*c* of the conductive structures 208*d*, and over another portion of the subset 220*c* of the conductive structures 210*b*.

The interconnect structure 214*a* may have a top view width in the x-direction and/or in the y-direction (corresponding to dimension D10) that is included in a range of approximately 0.02 microns to approximately 1 micron. However, other values for the range are within the scope of the present disclosure. The interconnect structure 214*a* may have a top view width in the x-direction and/or in the y-direction (corresponding to dimension D11) that is included in a range of approximately 0.02 microns to approximately 1 micron. However, other values for the range are within the scope of the present disclosure. In some implementations, the dimension D10 and the dimension D11 are approximately equal values. In some implementations, the dimension D10 and the dimension D11 are different values.

In some implementations, a distance between an outer edge of the active region 206 and an outer edge of the interconnect structure 214*a* (corresponding to dimension D12) may be included in a range of approximately 0.01 microns to approximately 0.1 microns. However, other values for the range are within the scope of the present disclosure. In some implementations, a distance between an inner edge of the active region 206 and an inner edge of the interconnect structure 214*b* (corresponding to dimension D13) may be included in a range of approximately 0.01 microns to approximately 0.1 microns. However, other values for the range are within the scope of the present disclosure.

Figure 2G:
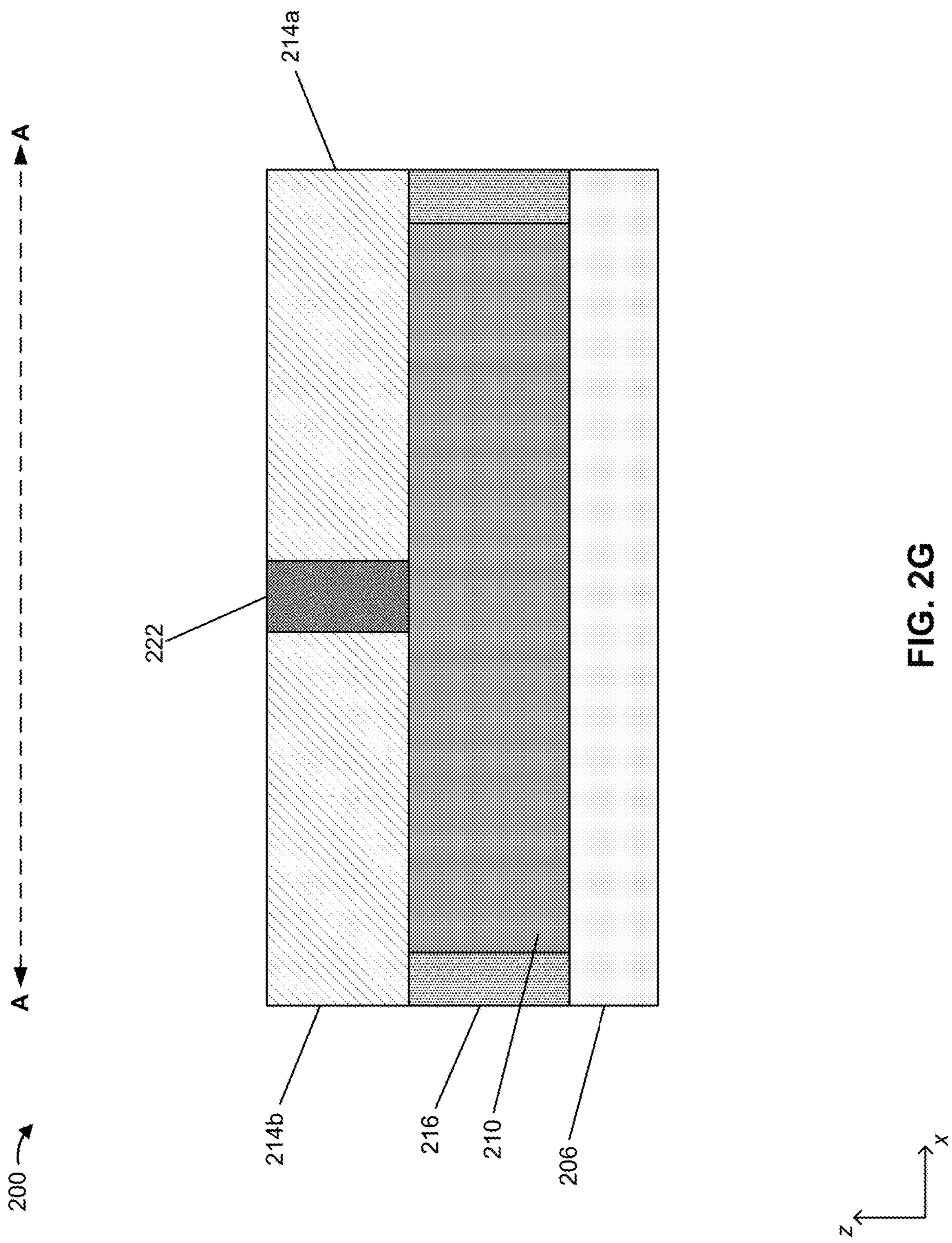
Figure 2H:
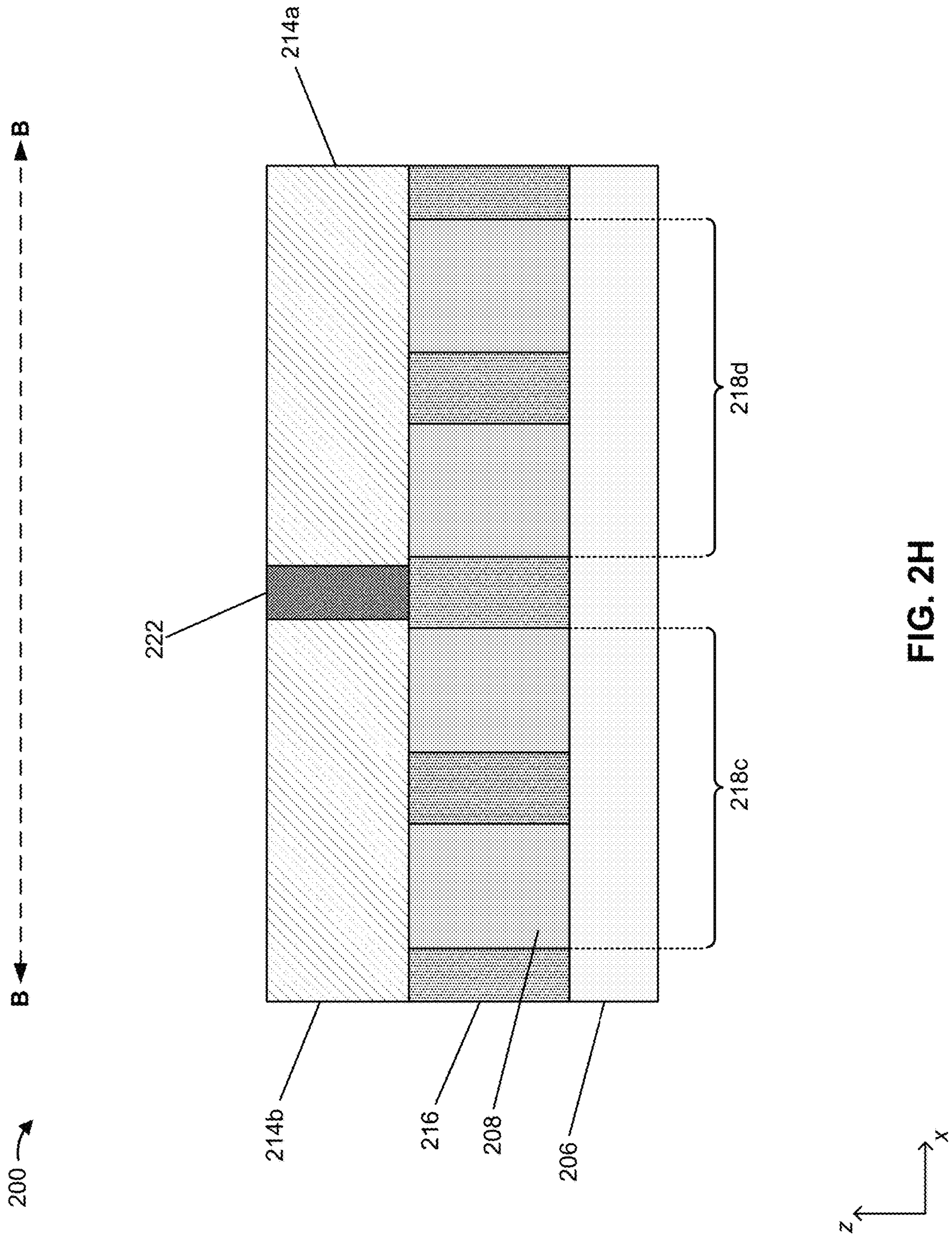

FIGS. 2G and 2H illustrate cross-sectional views of the example implementation of the semiconductor device 200 in FIG. 2F. FIG. 2G illustrates a cross-sectional view along the line A-A in FIG. 2F. FIG. 2H illustrates a cross-sectional view along a line B-B in FIG. 2F.

As shown in FIG. 2G, the interconnect structures 214*a* and 214*b* are located above and/or on at least a subset of the conductive structures 210 in the z-direction. As shown in FIG. 2H, the interconnect structures 214*a* and 214*b* are located above and/or on at least a subset (e.g., a subset 218*c*, a subset 218*d*) of the conductive structures 208 in the z-direction. The interconnect structures 214*a* and 214*b* may be physically isolated and/or electrically isolated from one another by dielectric regions 222. The dielectric regions 222 may include an ILD layer and/or another type of dielectric layer of the semiconductor device 200. The z-direction height of the interconnect structures 214*a* and 214*b*, and the z-direction height of the dielectric regions 222, may be approximately the same z-direction height such that the interconnect structures 214*a* and 214*b*, and the dielectric regions 222, are approximately co-planar.

The dielectric regions 222 may include an oxide (e.g., a silicon oxide ($SiO_x$) and/or another oxide material), an undoped silicate glass (USG), a boron-containing silicate glass (BSG), a fluorine-containing silicate glass (FSG), tetraethyl orthosilicate (TEOS), hydrogen silsesquioxane (HSQ), and/or another suitable dielectric material. In some implementations, the dielectric regions 222 include an ELK dielectric material having a dielectric constant that is less than approximately 2.5.

Figure 2I:
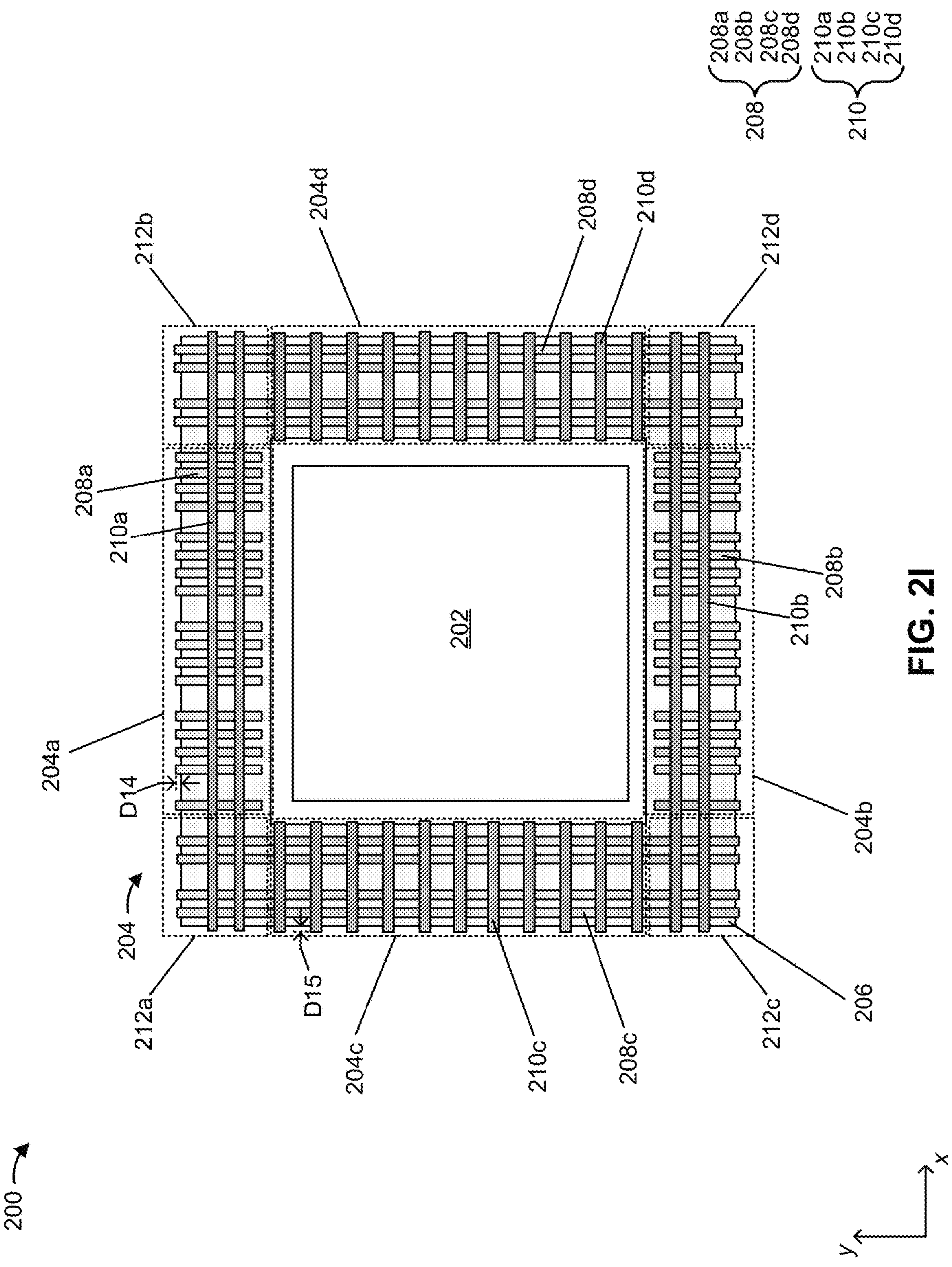

FIG. 2I illustrates a top-down view of another example implementation of the semiconductor device 200. The example implementation of the semiconductor device 200 illustrated in FIG. 2I is similar to the example implementation of the semiconductor device 200 illustrated in FIGS. 2A-2D, except that one or more of the conductive structures 208 extend laterally outward past the edges of the active region 206, and/or one or more of the conductive structures 210 extend laterally outward past the edges of the active region 206. A conductive structure 208 may extend laterally outward past an edge of the active region 206 by a distance (corresponding to dimension D14) that is included in a range of approximately 0.01 microns to approximately 1 micron. However, other values for the range are within the scope of the present disclosure. A conductive structure 210 may extend laterally outward past an edge of the active region 206 by a distance (corresponding to dimension D15) that is included in a range of approximately 0.01 microns to approximately 1 micron. However, other values for the range are within the scope of the present disclosure.

As indicated above, FIGS. 2A-2I are provided as examples. Other examples may differ from what is described with regard to FIGS. 2A-2I.

FIGS. 3A-3D are diagrams of an example implementation 300 of forming a guard ring of a semiconductor device 200 described herein. The operations and/or techniques described in connection with the example implementation 300 may be performed to form one or more of the example implementations of the semiconductor device 200 illustrated and described in connection with FIGS. 2A-2D, 2E, 2F-2H, and/or 2I, among other examples. In some implementations, one or more of the semiconductor processing operations described in connection with FIGS. 3A-3D may be performed using one or more of the semiconductor processing tools 102-112 and/or the wafer/die transport tool 114. In some implementations, one or more of the semiconductor processing operations described in connection with FIGS. 3A-3D may be performed using another semiconductor processing tool.

Figure 3A:
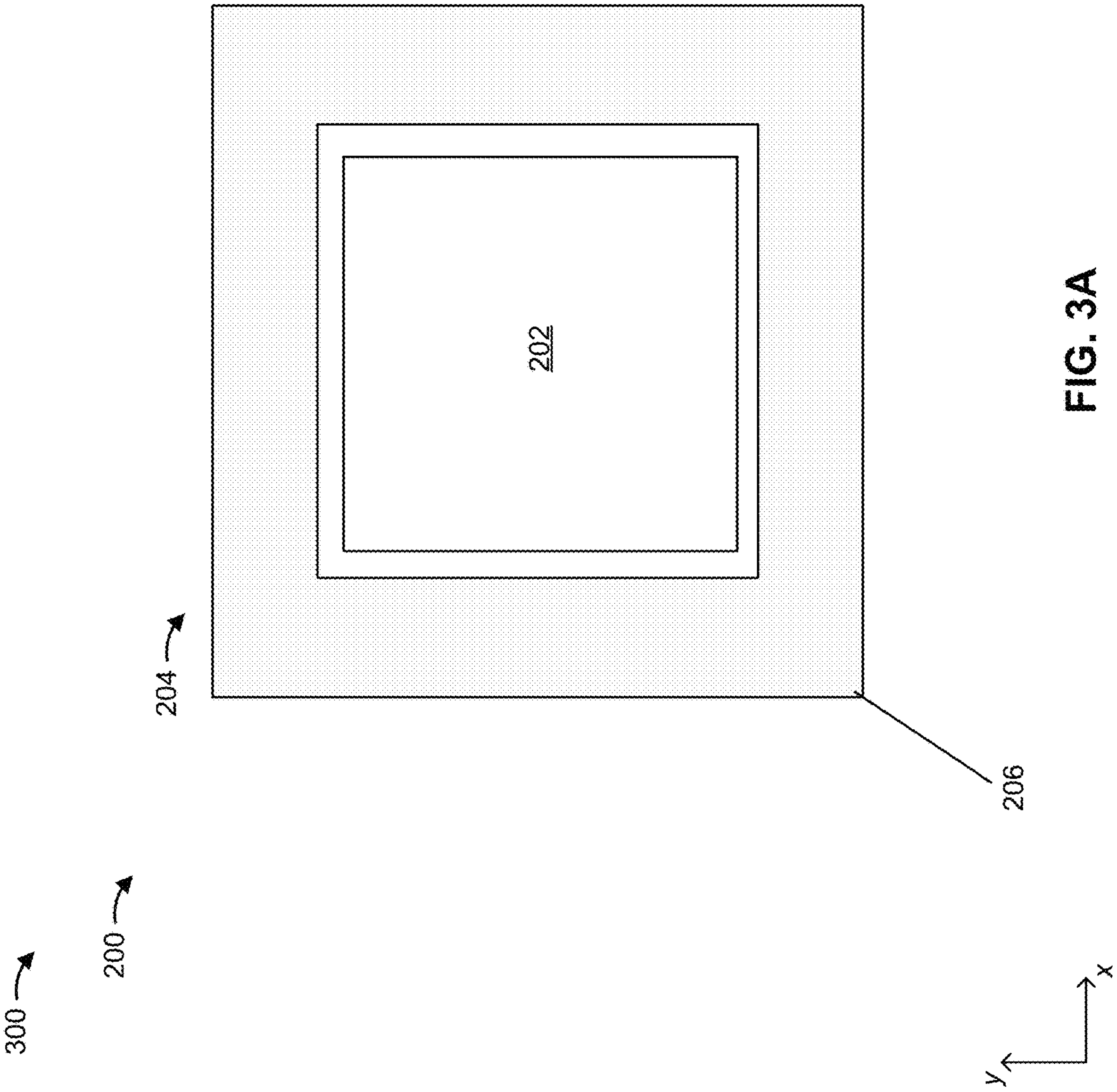
FIGS. 3A-3D are diagrams of an example implementation of forming a guard ring of a semiconductor device described herein.

As shown in FIG. 3A, the active region 206 of the guard ring structure 204 is provided around the integrated circuit 202 of the semiconductor device 200. In some implementations, the active region 206 is provided as a portion of a substrate of the semiconductor device 200. In some implementations, the active region 206 is formed by doping the substrate around the integrated circuit 202 with one or more types of dopants. For example, an ion implantation tool 112 may be used to implant dopants in the substrate around the integrated circuit 202 using an ion implantation technique and/or another type of technique to form the active region 206. In some implementations, a deposition tool 102 may be used to deposit the active region 206 using a PVD technique, an ALD technique, a CVD technique, an epitaxy technique, another type of deposition technique described in connection with FIG. 1, and/or another suitable deposition technique.

Figure 3B:
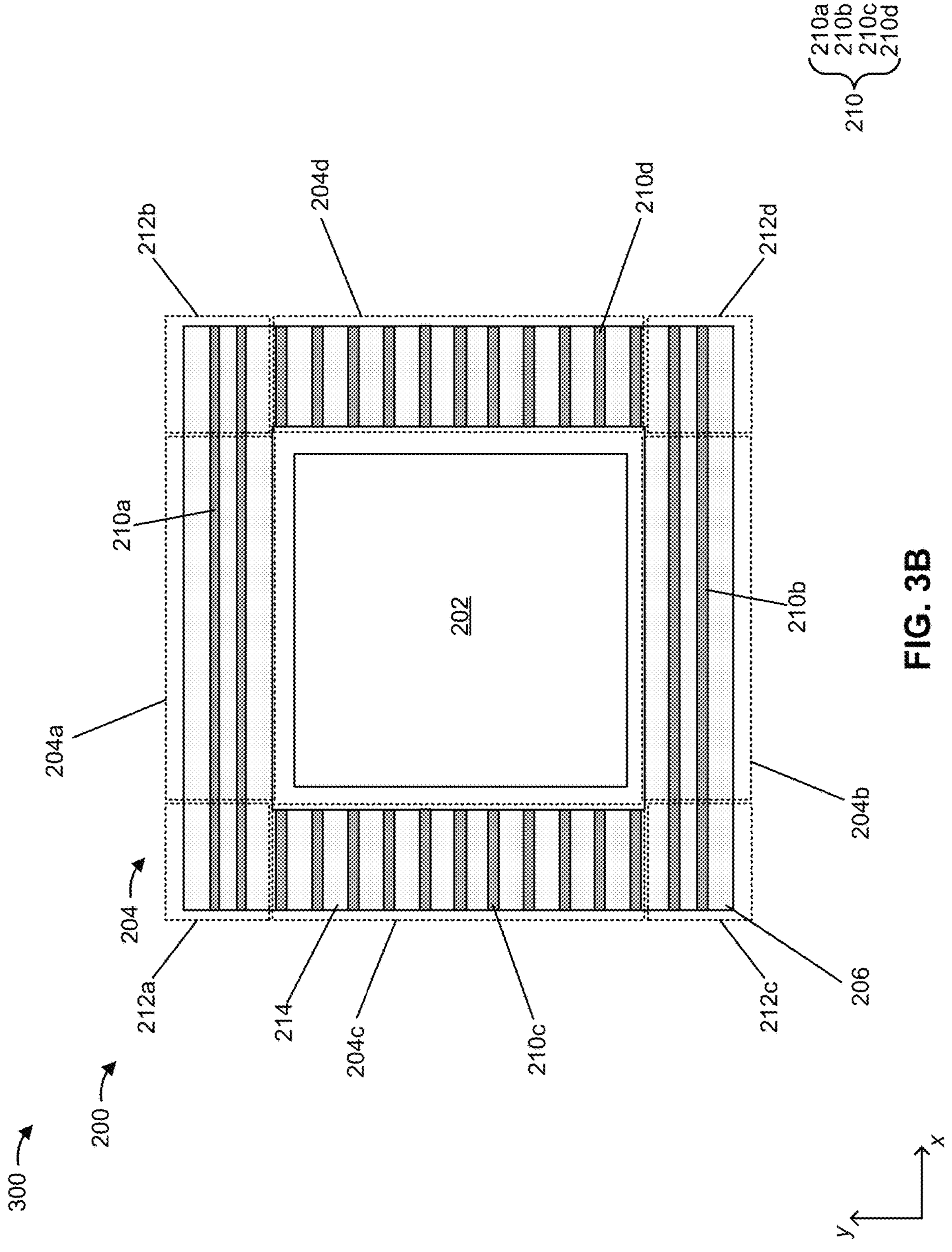

As shown in FIG. 3B, the conductive structures 210 are formed over and/or on the active region 206. The conductive structures 210 are formed such that the conductive structures 210 are arranged in the y-direction and extend in the x-direction in the semiconductor device 200.

A deposition tool 102 may be used to deposit the conductive structures 210 using a CVD technique, a PVD technique, an ALD technique, an electroplating technique, another deposition technique described above in connection with FIG. 1, and/or another suitable deposition technique. The conductive structures 210 may be deposited in one or more deposition operations. In some implementations, a seed layer is first deposited, and the conductive structures 210 are deposited on the seed layer. In some implementations, a planarization tool 110 may be used to planarize the conductive structures 210 after the conductive structures 210 are deposited.

In some implementations, a deposition tool 102 is used to form a dielectric layer, a deposition tool 102, an exposure tool 104, and a developer tool 106 are used to form a patterned masking layer on the dielectric layer, and an etch tool 108 is used to etch the dielectric layer based on the patterned masking layer to form the dielectric regions 216. The conductive structures 210 may then be formed in between the dielectric regions 216.

Figure 3C:
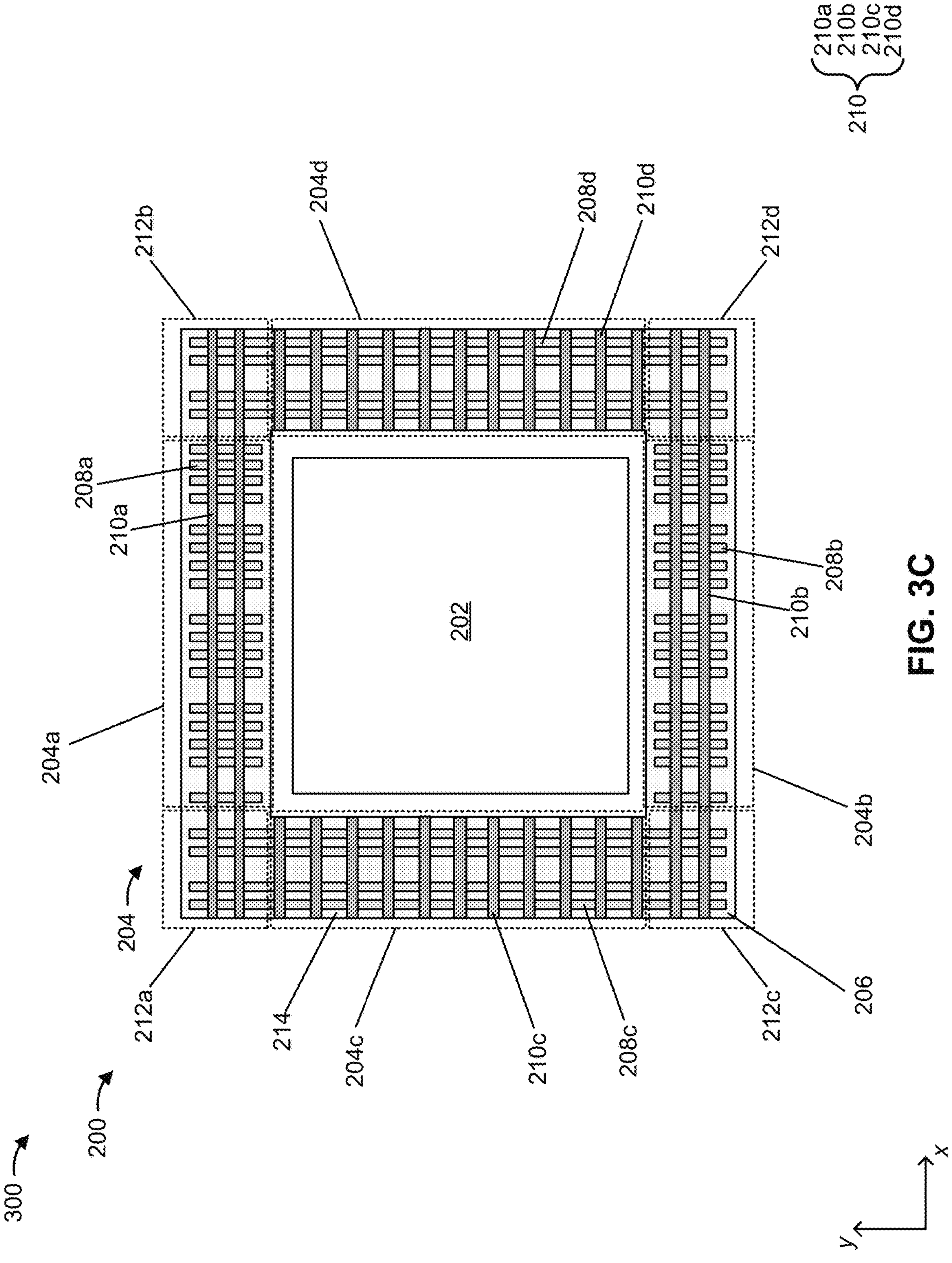

As shown in FIG. 3C, the conductive structures 208 are formed over and/or on the active region 206. The conductive structures 208 are formed such that the conductive structures 208 are arranged in the x-direction and extend in the y-direction in the semiconductor device 200. Moreover, the conductive structures 208 are formed such that the conductive structures 208 and the conductive structures 210 intersect to form a conductive grid above the active region 206.

A deposition tool 102 may be used to deposit the conductive structures 208 using a CVD technique, a PVD technique, an ALD technique, an electroplating technique, another deposition technique described above in connection with FIG. 1, and/or another suitable deposition technique. The conductive structures 208 may be deposited in one or more deposition operations. In some implementations, a seed layer is first deposited, and the conductive structures 208 are deposited on the seed layer. In some implementations, a planarization tool 110 may be used to planarize the conductive structures 208 after the conductive structures 208 are deposited.

In some implementations, a deposition tool 102 is used to form a dielectric layer, a deposition tool 102, an exposure tool 104, and a developer tool 106 are used to form a patterned masking layer on the dielectric layer, and an etch tool 108 is used to etch the dielectric layer based on the patterned masking layer to form the dielectric regions 216. The conductive structures 208 may then be formed in between the dielectric regions 216.

The order of operations illustrated and described in connection with FIGS. 3B and 3C are an example, and another order of operations may be used to form the conductive structures 208 and 210. For example, the conductive structures 208 may be formed first, and then the conductive structures 210 may be formed after the conductive structures 208.

Figure 3D:
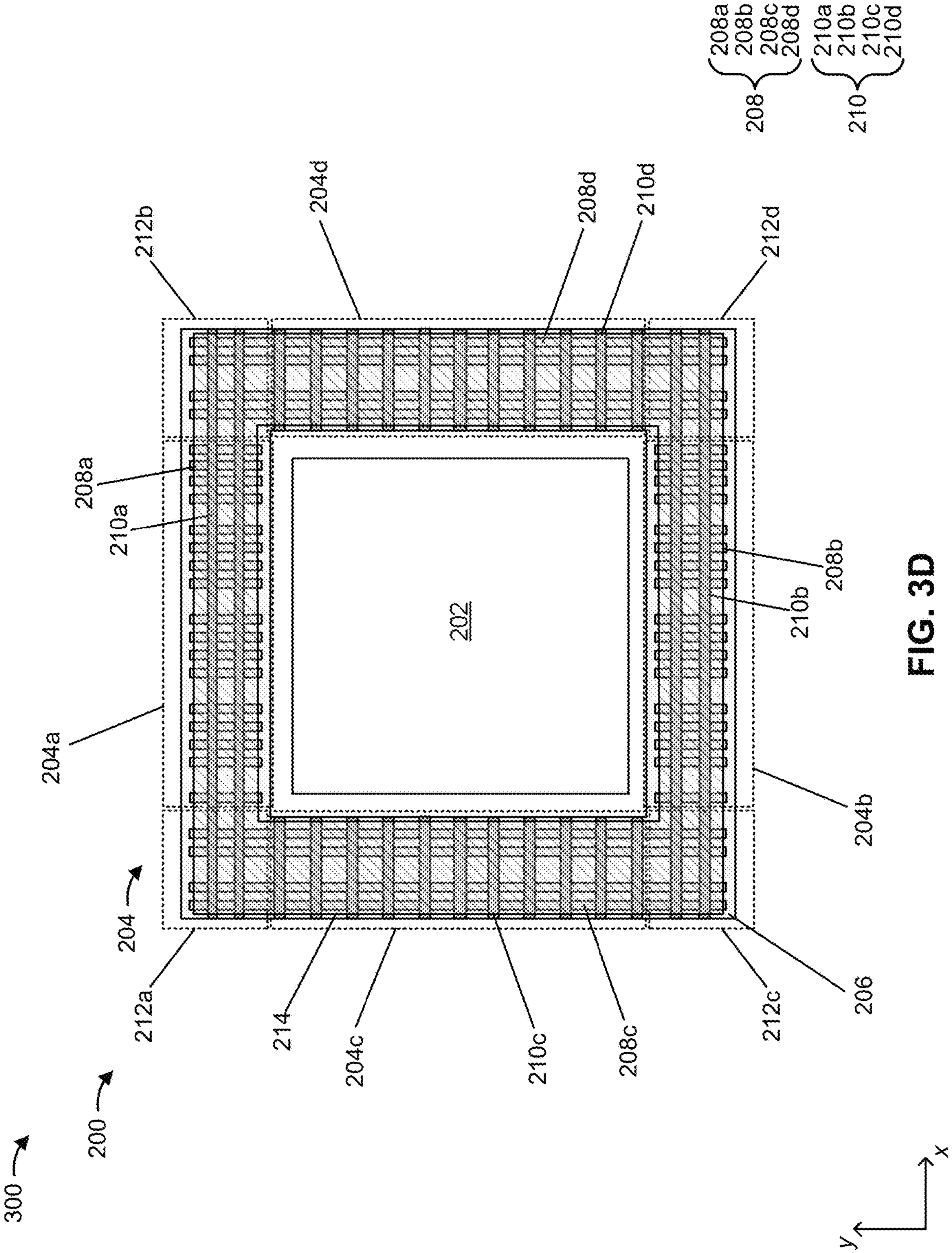

As shown in FIG. 3D, an interconnect structure 214 is formed over and/or on the guard ring structure 204 such that the interconnect structure 214 is physically coupled and/or electrically coupled with the conductive structures 208 and the conductive structures 210. In some implementations, a plurality of interconnect structures 214*a* and 214*b* are formed over and/or on the guard ring structure 204 such that the interconnect structures 214*a* and 214*b* are spaced apart and are not in physical contact with one another.

A deposition tool 102 may be used to deposit the interconnect structure(s) 214 using a CVD technique, a PVD technique, an ALD technique, an electroplating technique, another deposition technique described above in connection with FIG. 1, and/or another suitable deposition technique. The interconnect structure(s) 214 may be deposited in one or more deposition operations. In some implementations, a seed layer is first deposited, and the interconnect structure(s) 214 are deposited on the seed layer. In some implementations, a planarization tool 110 may be used to planarize the interconnect structure(s) 214 after the interconnect structure(s) 214 are deposited.

In some implementations, a deposition tool 102 is used to form a dielectric layer, a deposition tool 102, an exposure tool 104, and a developer tool 106 are used to form a patterned masking layer on the dielectric layer, and an etch tool 108 is used to etch the dielectric layer based on the patterned masking layer to form the dielectric regions 222. The interconnect structure(s) 214 may then be formed in between the dielectric regions 222.

As indicated above, FIGS. 3A-3D are provided as an example. Other examples may differ from what is described with regard to FIGS. 3A-3D.

FIGS. 4A-4F are diagrams of example implementations of a semiconductor device 400 described herein. The semiconductor device 400 includes an example of a semiconductor device, such as a microprocessor, a memory device, an image sensor, and/or an RF device, among other examples.

Figure 4A:
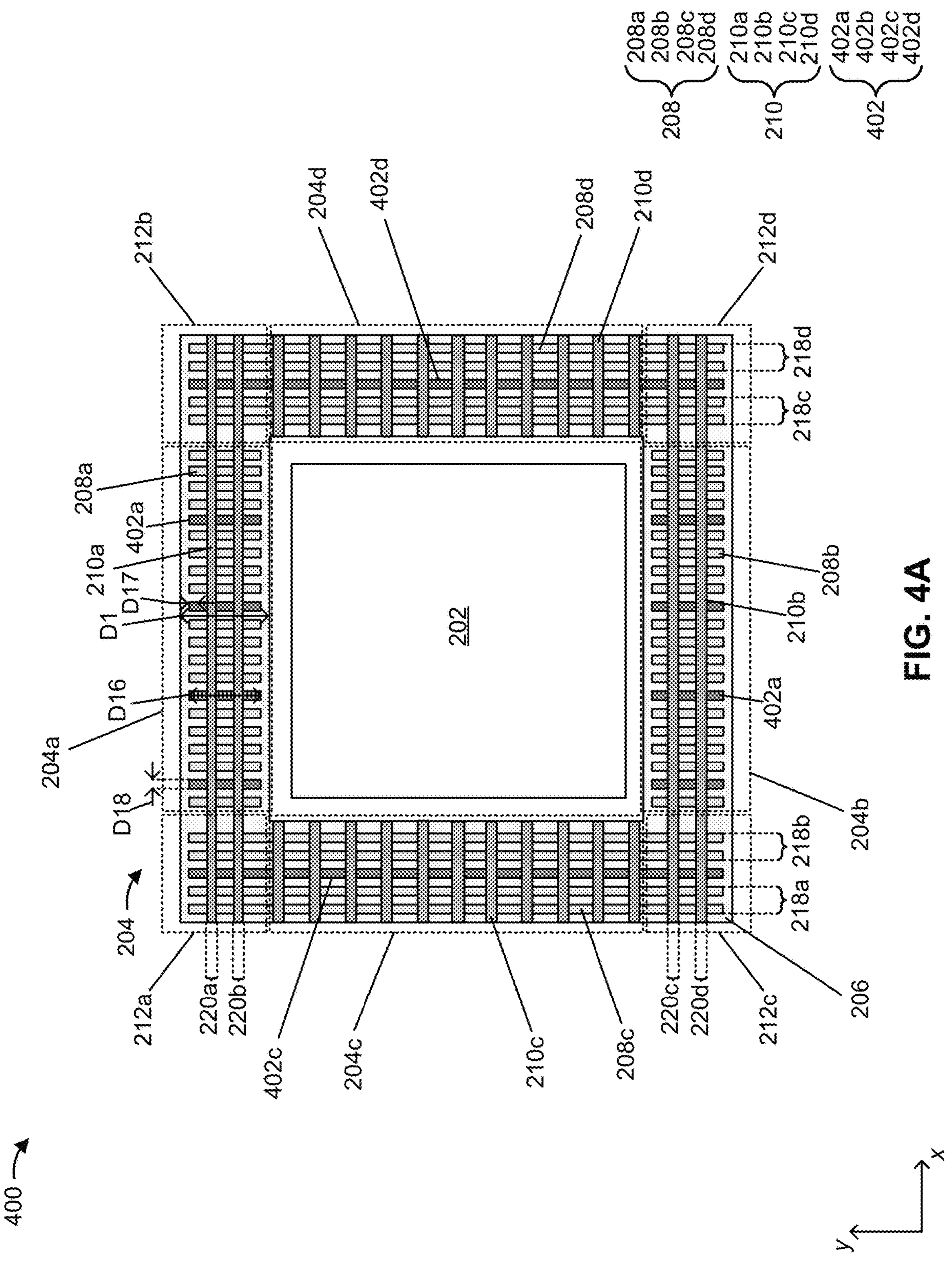
FIGS. 4A-4F are diagrams of example implementations of a semiconductor device described herein.
Figure 4B:
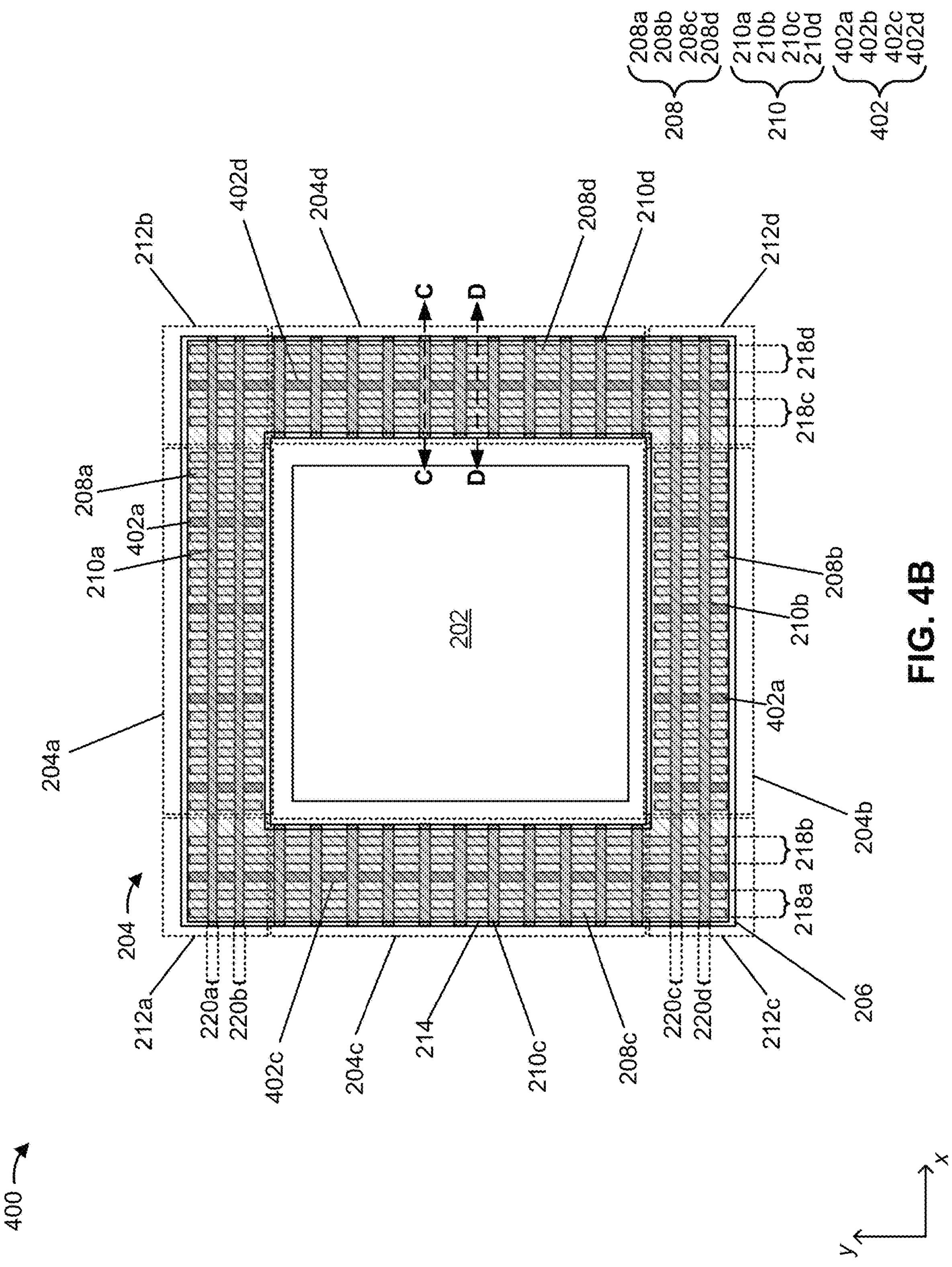

FIGS. 4A and 4B illustrate top-down views of an example implementation of the semiconductor device 400. The example implementation of the semiconductor device 400 illustrated in FIGS. 4A and 4B is similar to the example implementation of the semiconductor device 200 illustrated in FIGS. 2A-2D, except that the edges of the example implementation of the semiconductor device 400 further include a plurality of polysilicon structures 402. The polysilicon structures 402 may be formed during the same semiconductor processing operations in which the gate structures (or dummy gate structures) of the transistors in the integrated circuit 202 are formed.

The polysilicon structures 402 may be included in the guard ring structure 204 to reduce, minimize, and/or prevent dishing in the guard ring structure 204. Dishing may occur in the dielectric layer from which the dielectric regions 216 are formed. In particular, dishing may occur during a planarization operation (or a CMP operation) to planarize the dielectric layer, and dishing may occur in regions in the dielectric layer between the gate structures of the semiconductor device 400. As the spacing between gate structures in the semiconductor device 400 increases, the likelihood and/or magnitude of dishing in this dielectric layer increases. The inclusion of the polysilicon structures 402 in the guard ring structure 204 reduces the distance of polysilicon structures between adjacent integrated circuits 202 of the semiconductor device 400, which may reduce the likelihood and/or magnitude of dishing in the dielectric layer.

As shown in FIGS. 4A and 4B, the polysilicon structures 402 extend in the y-direction and are arranged in the x-direction, similar to the conductive structures 208. The polysilicon structures 402 and the conductive structures 208 may be approximately parallel, and the polysilicon structures 402 and the conductive structures 210 may be approximately perpendicular. The polysilicon structures 402 may be formed of a polysilicon material and/or another suitable material.

The polysilicon structures 402 include one or more polysilicon structures 402*a* in the segment 204*a* of the guard ring structure 204, one or more polysilicon structures 402*b* in the segment 204*b* of the guard ring structure 204, one or more polysilicon structures 402*c* in the segment 204*c* of the guard ring structure 204, and/or one or more polysilicon structures 402*d* in the segment 204*d* of the guard ring structure 204. The polysilicon structure(s) 402*c* may extend into the corner regions 212*a* and 212*c* where the polysilicon structure(s) 402*c* intersect with the conductive structures 210*a* and 210*b*, respectively. The polysilicon structure(s) 402*d* may extend into the corner regions 212*b* and 212*d* where the polysilicon structure(s) 402*d* intersect with the conductive structures 210*a* and 210*b*, respectively.

The polysilicon structures 402*a* may be located between two or more of the conductive structures 208*a* and may intersect with the conductive structures 210*a*. The polysilicon structures 402*b* may be located between two or more of the conductive structures 208*b* and may intersect with the conductive structures 210*b*. The polysilicon structures 402*c* may be located between two or more of the conductive structures 208*c* and may intersect with the conductive structures 210*c*. A polysilicon structure 402*c* in the segment 204*c* may be located between subsets 218*a* and 218*b* of the conductive structures 208*c*. A polysilicon structure 402*d* in the segment 204*d* may be located between subsets 218*c* and 218*d* of the conductive structures 208*d* and may intersect with the conductive structures 210*d*. In some implementations, the segment 204*c* includes a quantity of polysilicon structures 402*c* that are included in a range from 1 to 4. However, other values for the range are within the scope of the present disclosure. The polysilicon structures 402*d* may be located between two or more of the conductive structures 208*d*. In some implementations, the segment 204*d* includes a quantity of polysilicon structures 402*d* that are included in a range from 1 to 4. However, other values for the range are within the scope of the present disclosure.

A y-direction length of the polysilicon structures 402*a* and, in some implementations, a y-direction length of the polysilicon structures 402*b* (corresponding to dimension D16) may be less than the y-direction width of the active region 206 in the segments 204*a* and 204*b* (e.g., the dimension D1). Thus, the polysilicon structures 402*a* and/or 402*b* are fully contained within a top view footprint of the active region 206 in the example implementation illustrated in FIGS. 4A and 4B.

A distance between an end of a polysilicon structure 402*a* and an edge of the active region 206 in the segment 204*a* (corresponding to dimension D17), and/or a distance between an end of a polysilicon structure 402*b* and an edge of the active region 206 in the segment 204*b*, may be included in a range of approximately 0.01 microns to approximately 1 micron. However, other values for the range are within the scope of the present disclosure.

Additionally and/or alternatively, at least a subset of the polysilicon structures 402*a* and/or at least a subset of the polysilicon structures 402*b* may have a y-direction length that is approximately equal to the y-direction width of the active region 206 in the segments 204*a* and/or 204*b* (e.g., dimension D17 may be approximately equal to dimension D16).

A y-direction length of the polysilicon structures 402*c* and, in some implementations, a y-direction length of the polysilicon structures 402*d* may be greater than the y-direction length of the polysilicon structures 402*a* and/or 402*b*. An x-direction width of the polysilicon structures 402 (corresponding to dimension D18) may be included in a range of approximately 0.01 microns to approximately 1 micron. However, other values for the range are within the scope of the present disclosure.

As shown in FIG. 4B, an interconnect structure 214 is included above the guard ring structure 204 around the integrated circuit 202. In the example implementation in FIGS. 4A and 4B, the polysilicon structures 402 are fully contained within the top view footprint of the interconnect structure 214.

Figure 4C:
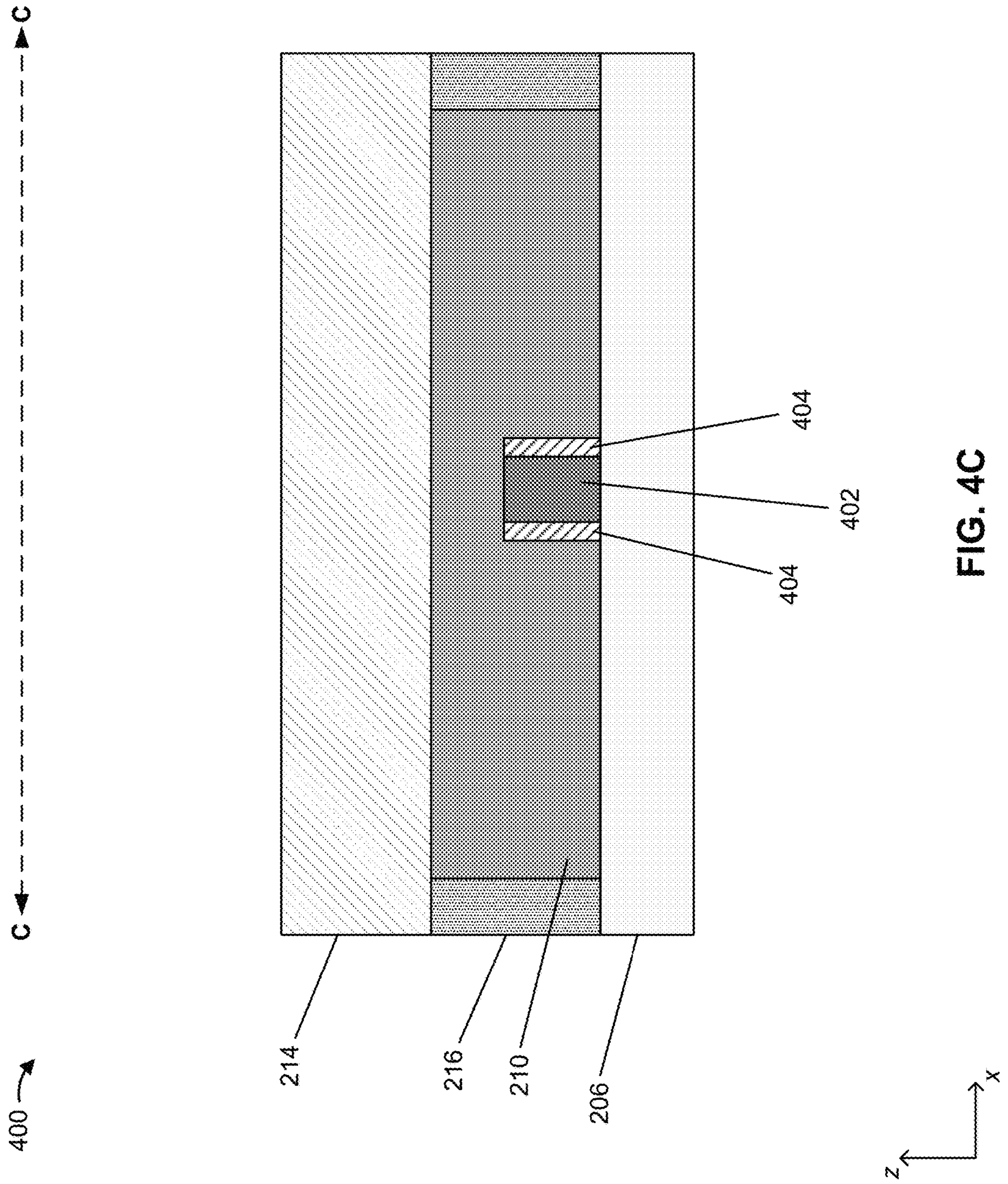
Figure 4D:
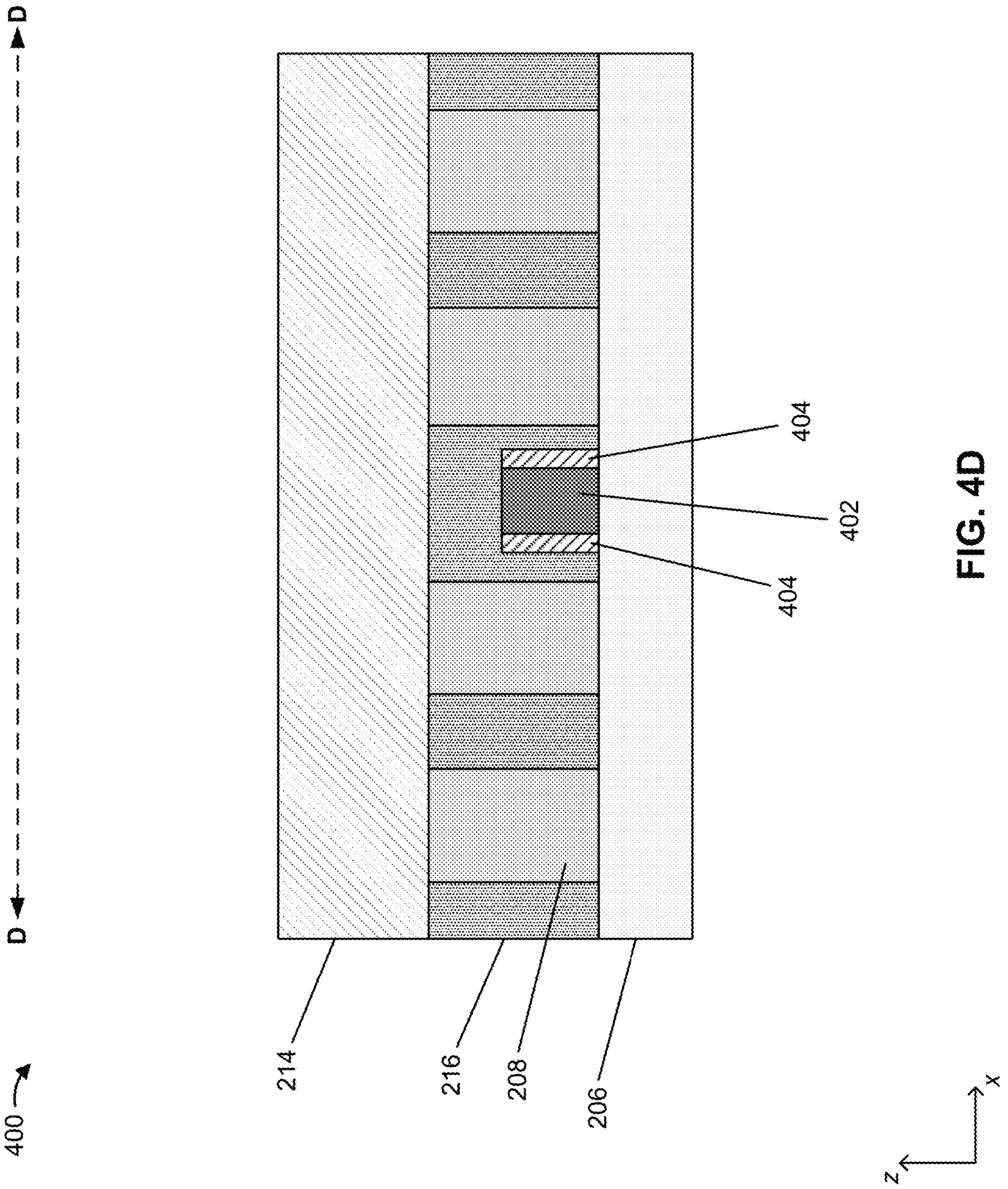

FIGS. 4C and 4D illustrate cross-sectional views of the example implementation of the semiconductor device 400 in FIGS. 4A and 4B. FIG. 4C illustrates a cross-sectional view along a line C-C in FIG. 4B. FIG. 4D illustrates a cross-sectional view along a line D-D in FIG. 4B.

As shown in FIG. 4C, in regions of the semiconductor device 400 in which a polysilicon structure 402 intersects with a conductive structure 210, the polysilicon structure 402 is located under a conductive structure 210. The conductive structure 210 wraps around the polysilicon structure 402 on at least three sides of the polysilicon structure 402. As shown in FIG. 4D, in regions of the semiconductor device 400 in which a polysilicon structure 402 does not intersect with a conductive structure 210, the polysilicon structure 402 is located under a dielectric region 216. The dielectric region 216 wraps around the polysilicon structure 402 on at least three sides of the polysilicon structure 402.

As further shown in FIGS. 4C and 4D, sidewall spacers 404 may be included on sidewalls of the polysilicon structure 402. The sidewall spacers 404 may include one or more dielectric materials such as a silicon oxycarbide (SiOC), a silicon nitride ($Si_xN_y$ such as $Si_3N_4$), and/or another suitable dielectric layer. The sidewall spacers 404 may be formed during the same set of semiconductor processing operations in which gate spacers of the gate structures of the transistors in the integrated circuit 202 are formed.

Figure 4E:
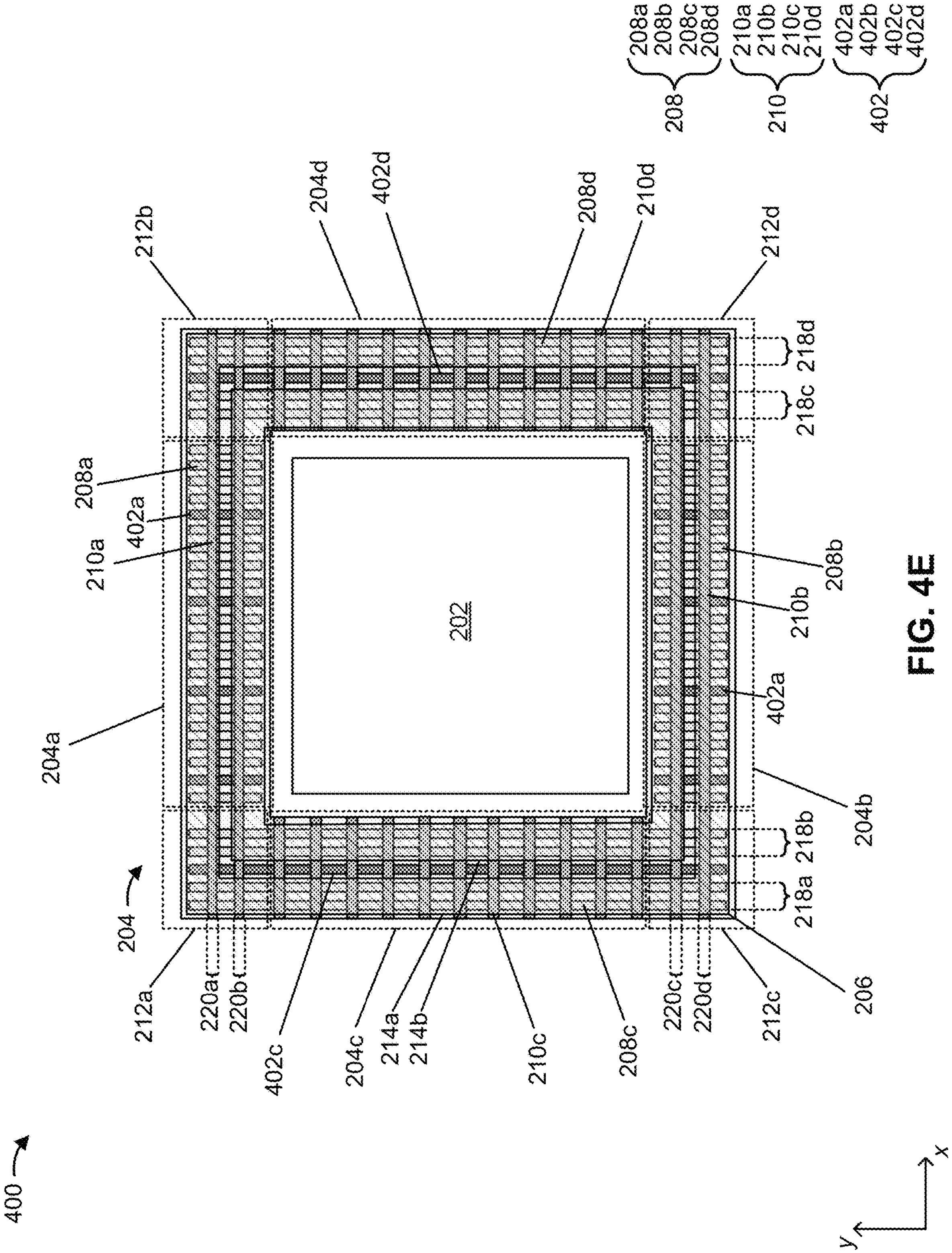

FIG. 4E illustrates a top-down view of another example implementation of the semiconductor device 400. The example implementation of the semiconductor device 400 illustrated in FIG. 4E is similar to the example implementation of the semiconductor device 400 illustrated in FIGS. 4A-4D, except that a plurality of interconnect structures 214*a* and 214*b* are included above the guard ring structure 204.

The interconnect structure 214*a* is located above portions of the polysilicon structures 402*a* in the segment 204*a* of the guard ring structure 204, and the interconnect structure 214*b* is located above other portions of the polysilicon structures 402*a* in the segment 204*a* of the guard ring structure 204. The interconnect structure 214*a* is located above portions of the polysilicon structures 402*b* in the segment 204*b* of the guard ring structure 204, and the interconnect structure 214*b* is located above other portions of the polysilicon structures 402*b* in the segment 204*b* of the guard ring structure 204. The polysilicon structures 402*c* may be located between the interconnect structures 214*a* and 214*b* in the segment 204*c* of the guard ring structure 204. The polysilicon structures 402*d* may be located between the interconnect structures 214*a* and 214*b* in the segment 204*d* of the guard ring structure 204. The interconnect structure 214*a* may be located over a portion of the polysilicon structures 402*c* in the corner regions 212*a* and 212*c* of the guard ring structure 204. The interconnect structure 214*a* may be located over a portion of the polysilicon structures 402*d* in the corner regions 212*a* and 212*c* of the guard ring structure 204.

Figure 4F:
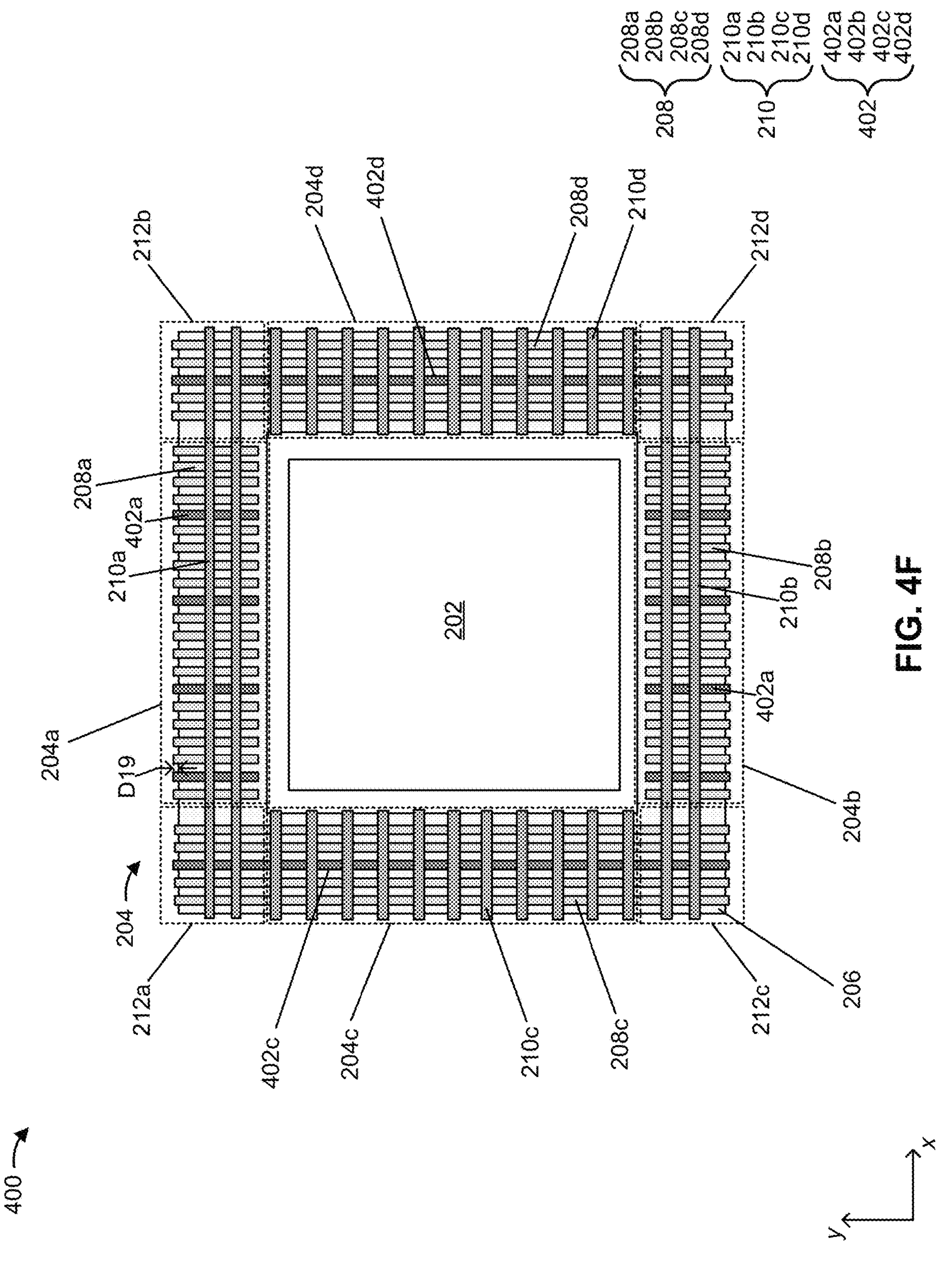

FIG. 4F illustrates a top-down view of another example implementation of the semiconductor device 400. The example implementation of the semiconductor device 400 illustrated in FIG. 4F is similar to the example implementation of the semiconductor device 200 illustrated in FIGS. 4A-4D, except that one or more of the polysilicon structures 402, one or more of the conductive structures 208, and/or one or more of the conductive structures 210 extend laterally outward past the edges of the active region 206. A polysilicon structure 402 may extend laterally outward past an edge of the active region 206 by a distance (corresponding to dimension D19) that is included in a range of approximately 0.01 microns to approximately 1 micron. However, other values for the range are within the scope of the present disclosure.

As indicated above, FIGS. 4A-4F are provided as examples. Other examples may differ from what is described with regard to FIGS. 4A-4F.

FIGS. 5A-5E are diagrams of an example implementation 500 of forming a guard ring of a semiconductor device 400 described herein. The operations and/or techniques described in connection with the example implementation 500 may be performed to form one or more of the example implementations of the semiconductor device 400 illustrated and described in connection with FIGS. 4A-4D, 4E, and/or 4F, among other examples. In some implementations, one or more of the semiconductor processing operations described in connection with FIGS. 5A-5E may be performed using one or more of the semiconductor processing tools 102-112 and/or the wafer/die transport tool 114. In some implementations, one or more of the semiconductor processing operations described in connection with FIGS. 5A-5E may be performed using another semiconductor processing tool.

Figure 5A:
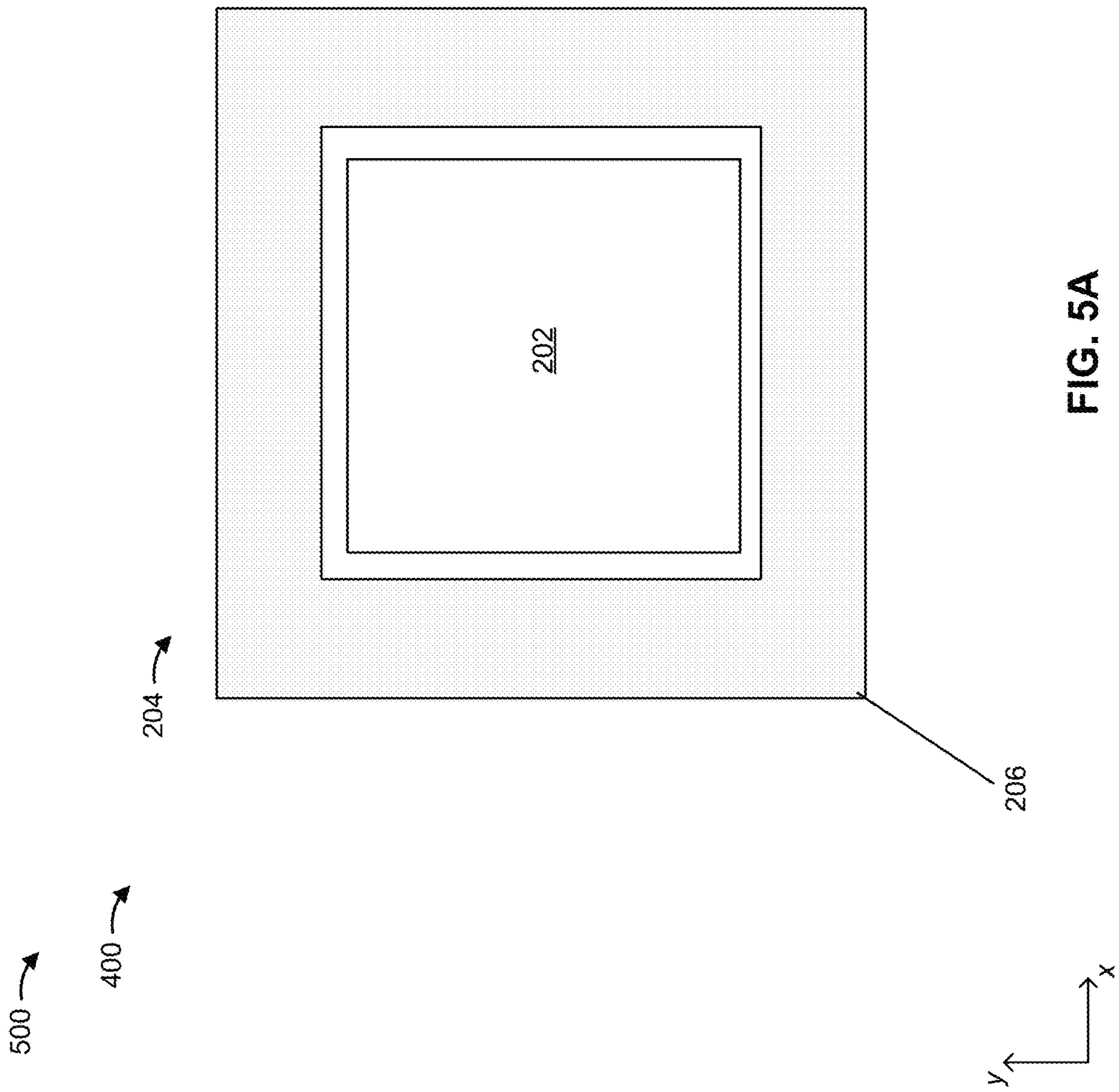
FIGS. 5A-5E are diagrams of an example implementation of forming a guard ring of a semiconductor device described herein.

As shown in FIG. 5A, the active region 206 of the guard ring structure 204 is provided around the integrated circuit 202 of the semiconductor device 400. In some implementations, the active region 206 is provided as a portion of a substrate of the semiconductor device 400. In some implementations, the active region 206 is formed by doping the substrate around the integrated circuit 202 with one or more types of dopants. For example, an ion implantation tool 112 may be used to implant dopants in the substrate around the integrated circuit 202 using an ion implantation technique and/or another type of technique to form the active region 206. In some implementations, a deposition tool 102 may be used to deposit the active region 206 using a PVD technique, an ALD technique, a CVD technique, an epitaxy technique, another type of deposition technique described in connection with FIG. 1, and/or another suitable deposition technique.

Figure 5B:
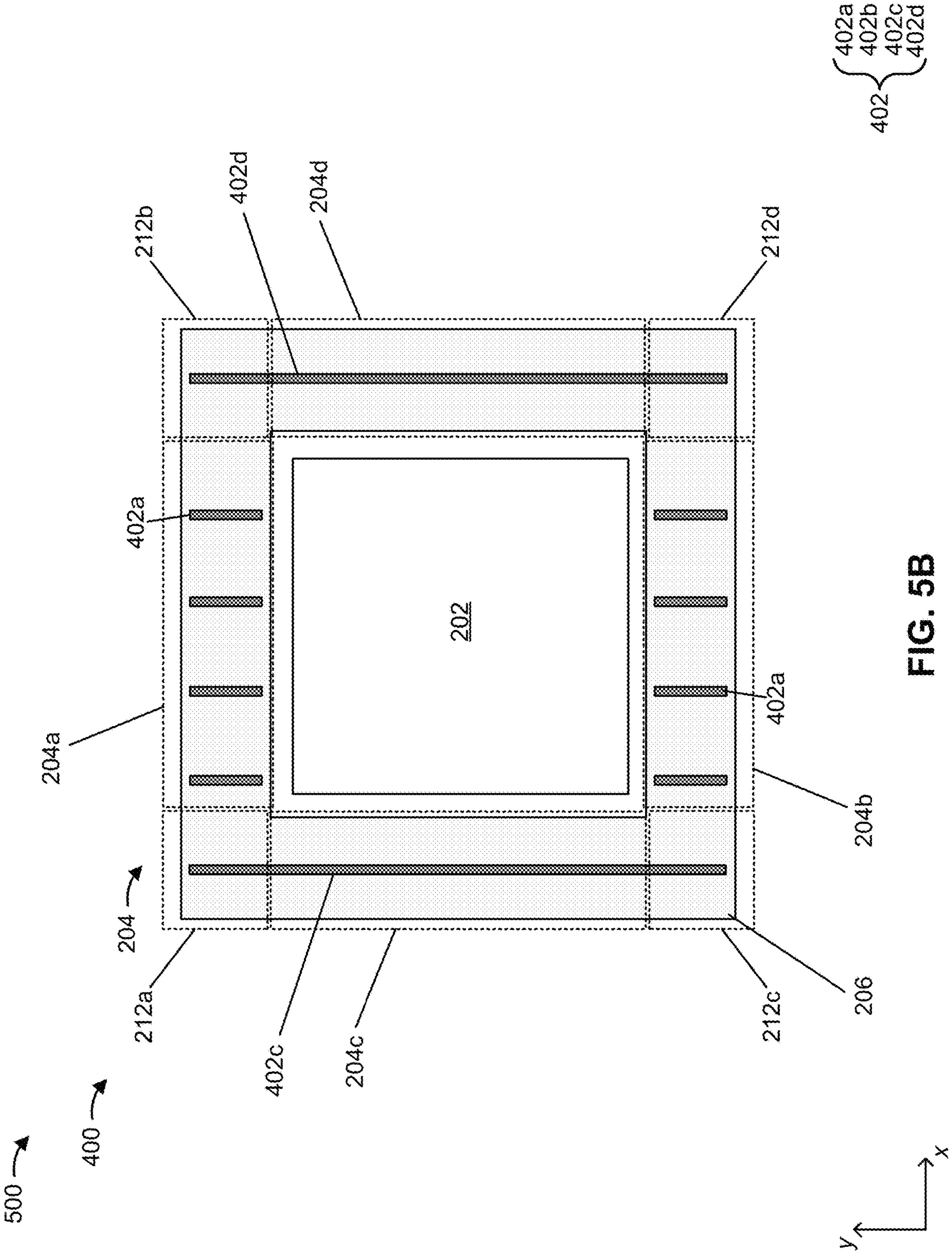

As shown in FIG. 5B, the polysilicon structures 402 are formed over and/or on the active region 206. The polysilicon structures 402 are formed such that the polysilicon structures 402 are arranged in the x-direction and extend in the y-direction in the semiconductor device 400. A deposition tool 102 may be used to deposit the polysilicon structures 402 using a CVD technique, a PVD technique, an ALD technique, another deposition technique described above in connection with FIG. 1, and/or another suitable deposition technique.

Figure 5C:
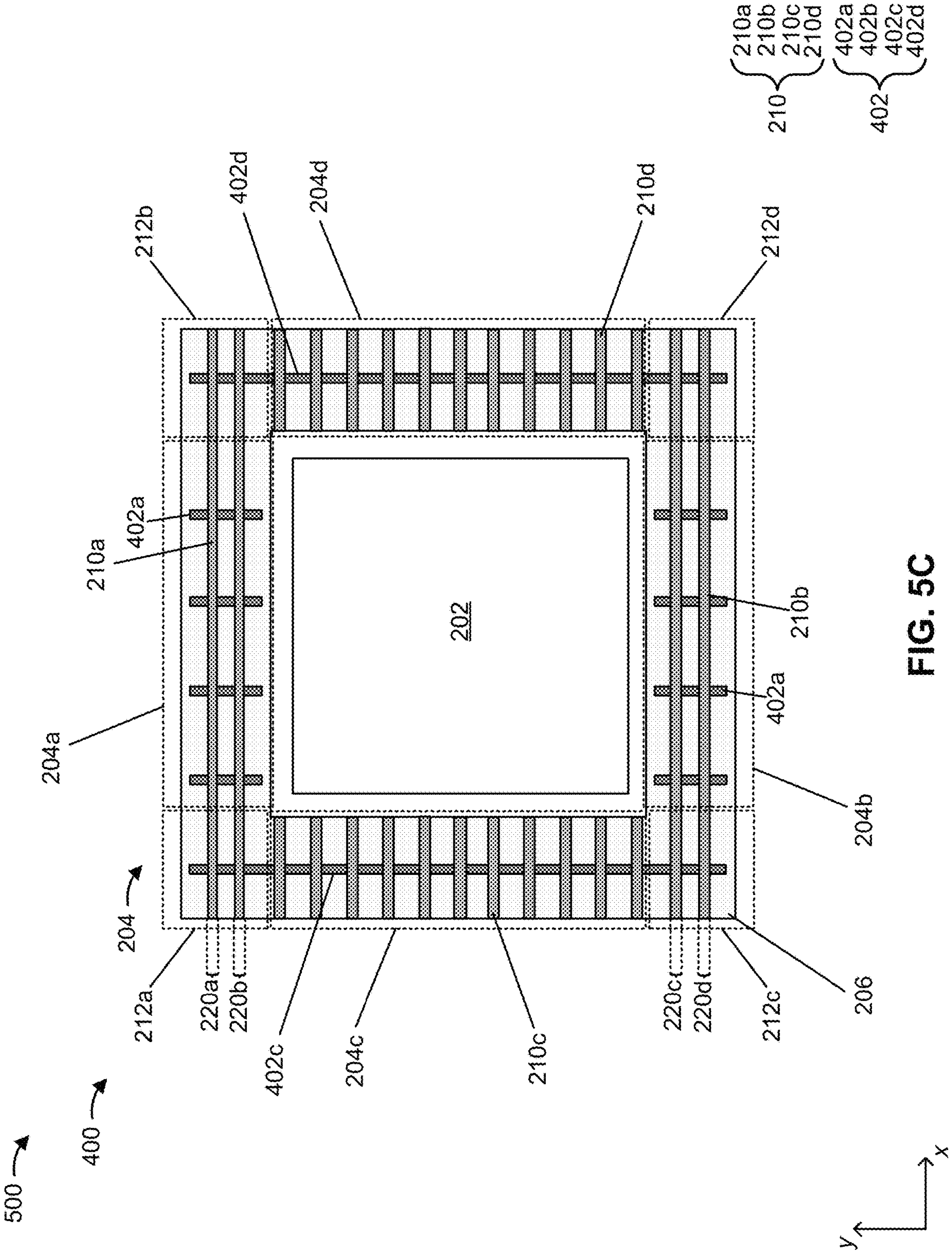

As shown in FIG. 5C, the conductive structures 210 are formed over and/or on the active region 206, and over and/or on the polysilicon structures 402. The conductive structures 210 are formed such that the conductive structures 210 are arranged in the y-direction and extend in the x-direction in the semiconductor device 400.

A deposition tool 102 may be used to deposit the conductive structures 210 using a CVD technique, a PVD technique, an ALD technique, an electroplating technique, another deposition technique described above in connection with FIG. 1, and/or another suitable deposition technique. The conductive structures 210 may be deposited in one or more deposition operations. In some implementations, a seed layer is first deposited, and the conductive structures 210 are deposited on the seed layer. In some implementations, a planarization tool 110 may be used to planarize the conductive structures 210 after the conductive structures 210 are deposited.

In some implementations, a deposition tool 102 is used to form a dielectric layer, a deposition tool 102, an exposure tool 104, and a developer tool 106 are used to form a patterned masking layer on the dielectric layer, and an etch tool 108 is used to etch the dielectric layer based on the patterned masking layer to form the dielectric regions 216. The conductive structures 210 may then be formed in between the dielectric regions 216.

Figure 5D:
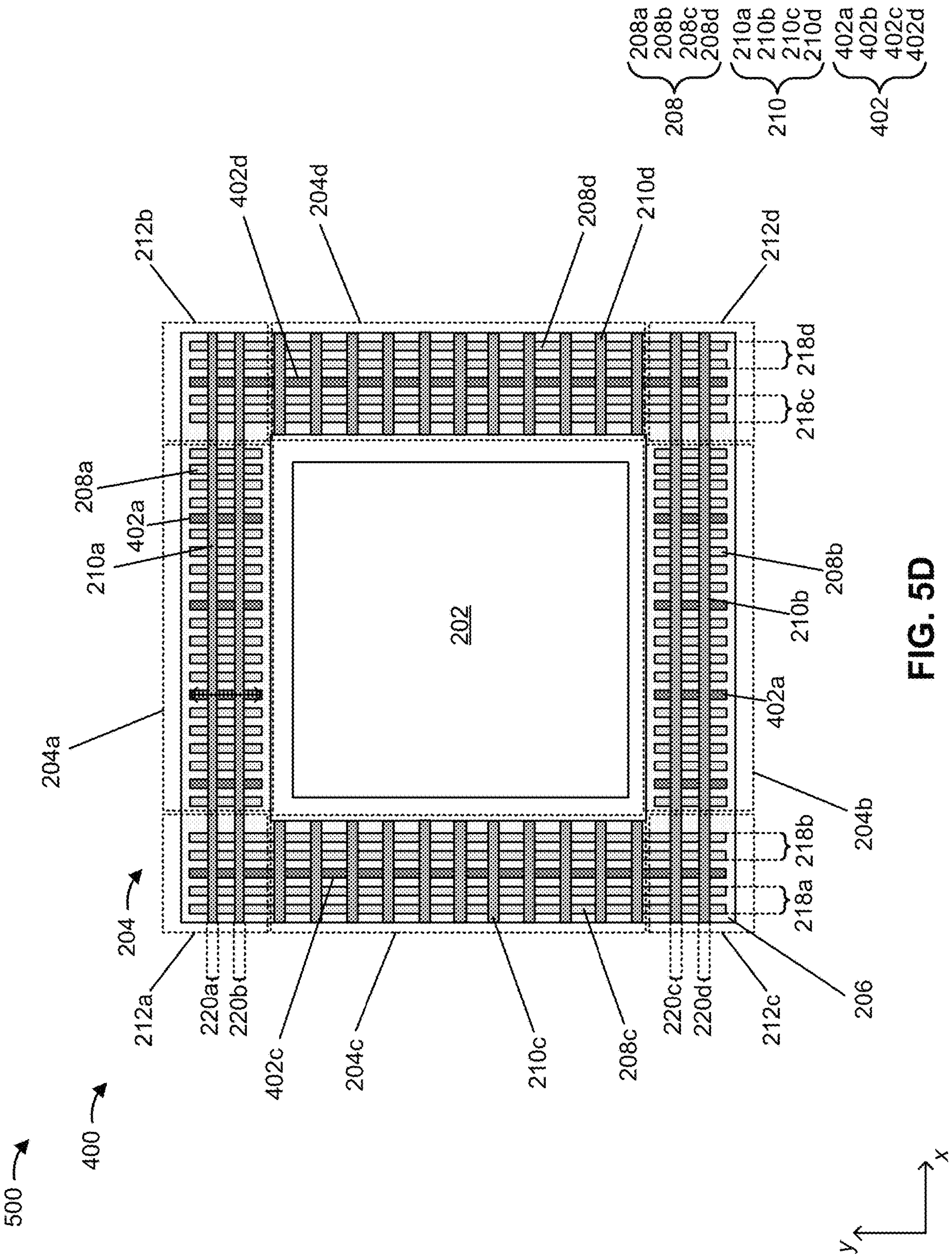

As shown in FIG. 5D, the conductive structures 208 are formed over and/or on the active region 206. The conductive structures 208 are formed such that the conductive structures 208 are arranged in the x-direction and extend in the y-direction in the semiconductor device 400. Moreover, the conductive structures 208 are formed such that the conductive structures 208 and the conductive structures 210 intersect to form a conductive grid above the active region 206. At least a subset of the conductive structures 208 are formed adjacent to opposing sides of one or more polysilicon structures 402.

A deposition tool 102 may be used to deposit the conductive structures 208 using a CVD technique, a PVD technique, an ALD technique, an electroplating technique, another deposition technique described above in connection with FIG. 1, and/or another suitable deposition technique. The conductive structures 208 may be deposited in one or more deposition operations. In some implementations, a seed layer is first deposited, and the conductive structures 208 are deposited on the seed layer. In some implementations, a planarization tool 110 may be used to planarize the conductive structures 208 after the conductive structures 208 are deposited.

In some implementations, a deposition tool 102 is used to form a dielectric layer, a deposition tool 102, an exposure tool 104, and a developer tool 106 are used to form a patterned masking layer on the dielectric layer, and an etch tool 108 is used to etch the dielectric layer based on the patterned masking layer to form the dielectric regions 216. The conductive structures 208 may then be formed in between the dielectric regions 216.

Figure 5E:
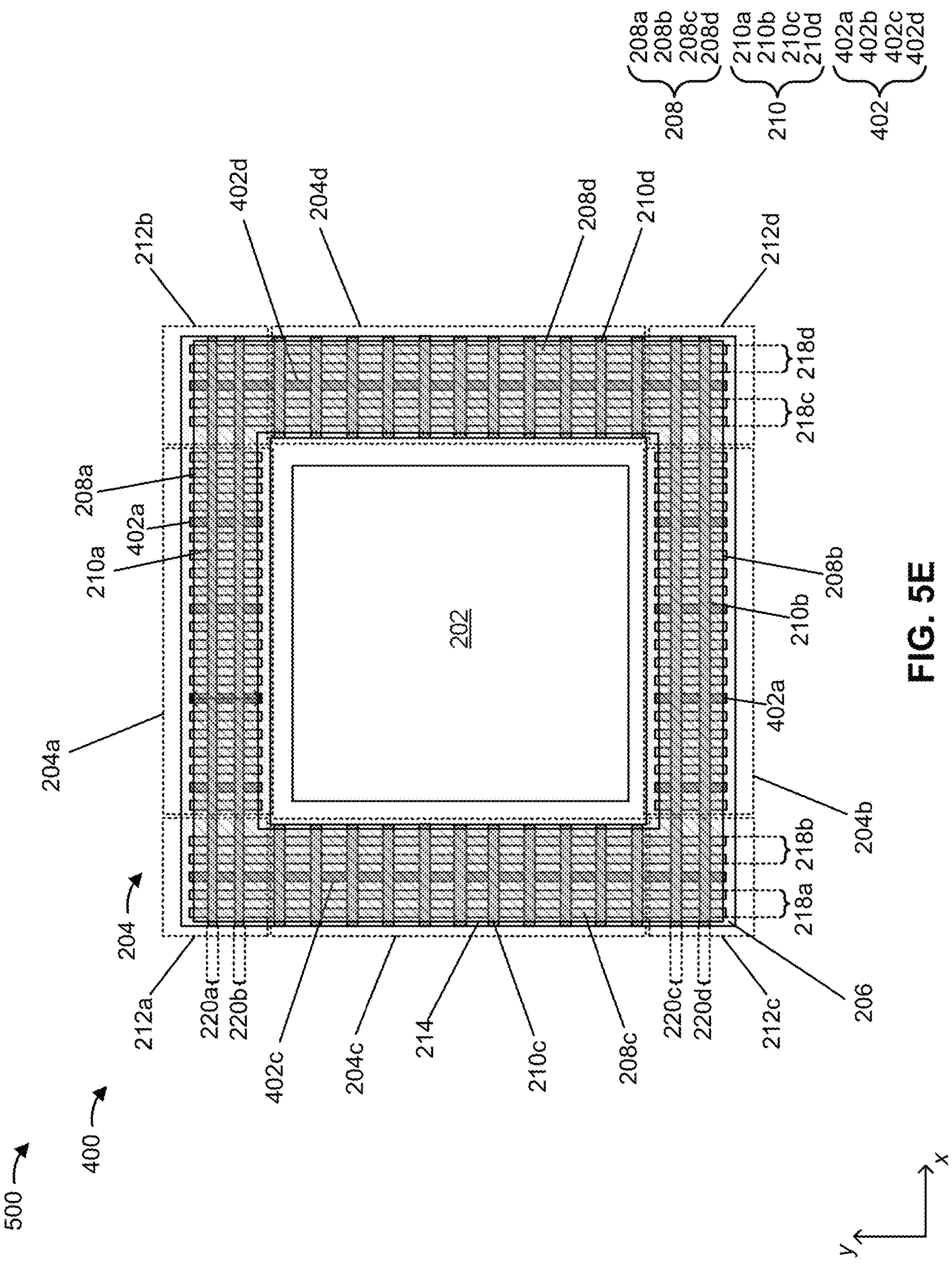

As shown in FIG. 5E, an interconnect structure 214 is formed over and/or on the guard ring structure 204 such that the interconnect structure 214 is physically coupled and/or electrically coupled with the conductive structures 208 and the conductive structures 210. In some implementations, a plurality of interconnect structures **214*a* and 214*b* are formed over and/or on the guard ring structure 204 such that the interconnect structures 214*a* and 214*b*** are spaced apart and are not in physical contact with one another.

A deposition tool 102 may be used to deposit the interconnect structure(s) 214 using a CVD technique, a PVD technique, an ALD technique, an electroplating technique, another deposition technique described above in connection with FIG. 1, and/or another suitable deposition technique. The interconnect structure(s) 214 may be deposited in one or more deposition operations. In some implementations, a seed layer is first deposited, and the interconnect structure(s) 214 are deposited on the seed layer. In some implementations, a planarization tool 110 may be used to planarize the interconnect structure(s) 214 after the interconnect structure(s) 214 are deposited.

In some implementations, a deposition tool 102 is used to form a dielectric layer, a deposition tool 102, an exposure tool 104, and a developer tool 106 are used to form a patterned masking layer on the dielectric layer, and an etch tool 108 is used to etch the dielectric layer based on the patterned masking layer to form the dielectric regions 222. The interconnect structure(s) 214 may then be formed in between the dielectric regions 222.

As indicated above, FIGS. 5A-5E are provided as an example. Other examples may differ from what is described with regard to FIGS. 5A-5E.

Figure 6:
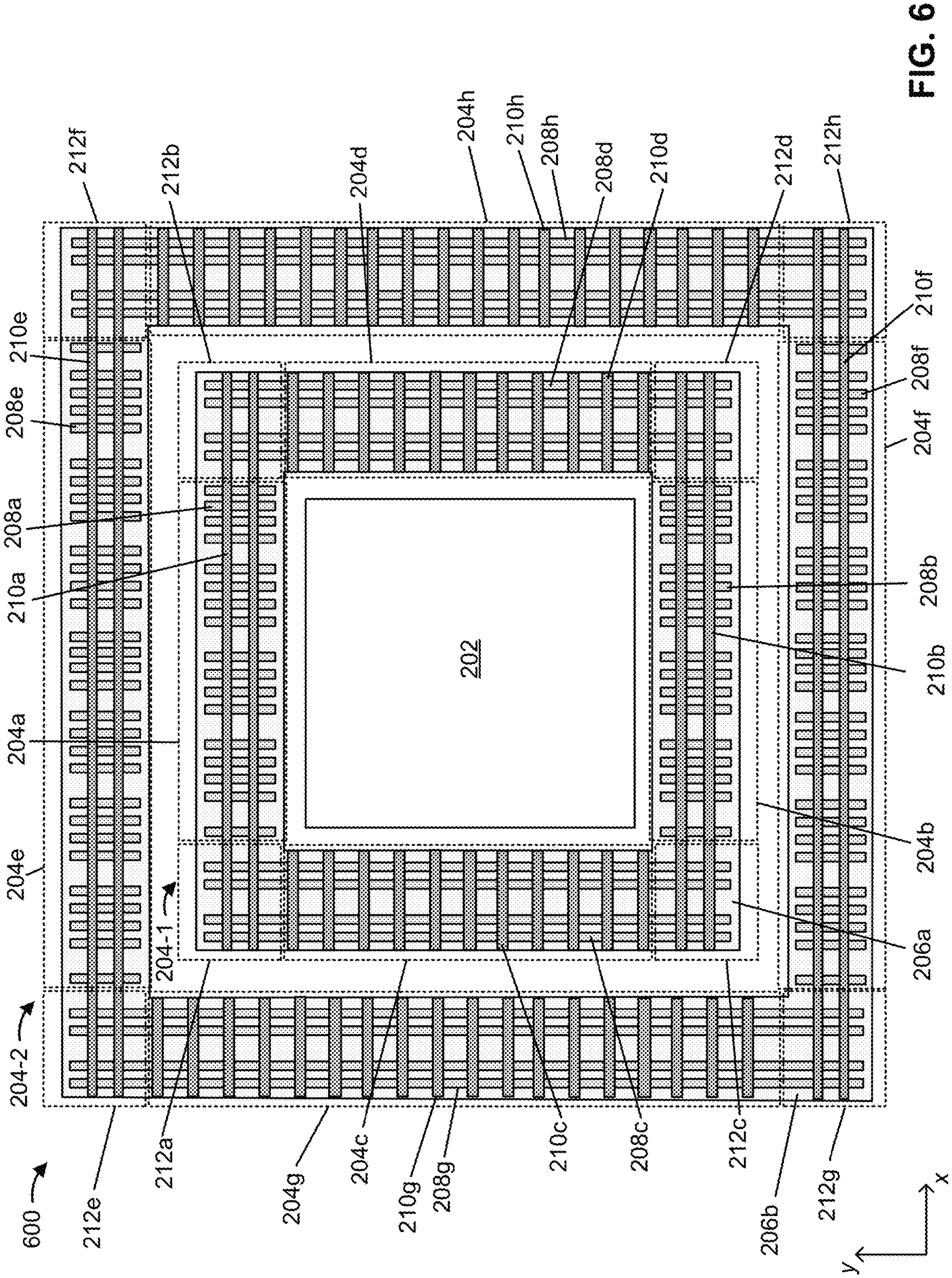
FIG. 6 is a diagram of an example implementation of a semiconductor device described herein.

FIG. 6 is a diagram of an example implementation of a semiconductor device 600 described herein. The semiconductor device 600 includes an example of a semiconductor device, such as a microprocessor, a memory device, an image sensor, and/or an RF device, among other examples. FIG. 6 illustrates a top-down view of the example implementation of the semiconductor device 600. The example implementation of the semiconductor device 600 illustrated in FIG. 6 is similar to the example implementations of the semiconductor device 200 illustrated in FIGS. 2A-2I, except that the semiconductor device 600 includes a plurality of guard ring structures around the integrated circuit 202. For example, the semiconductor device 600 includes a guard ring structure 204-1 (e.g., an inner guard ring) around the integrated circuit 202, and a guard ring structure 204-2 (e.g., an outer guard ring) around the guard ring structure 204-1.

Including a plurality of guard ring structures around the integrated circuit 202 provides additional charge carrier absorption around the integrated circuit 202, and therefore provides increased latch-up protection. However, the single guard ring implementations described herein may be formed using less complex semiconductor manufacturing processes, and therefore consume fewer semiconductor manufacturing resources.

As shown in FIG. 6, the guard ring structure 204-1 includes a plurality of segments 204*a*, 204*b*, 204*c*, and/or 204*d*, and a plurality of corner regions 212*a*, 212*b*, 212*c*, and/or 212*d*. The guard ring structure 204-1 includes an active region 206*a*, a plurality of conductive structures 208 (e.g., conductive structures 208*a*, 208*b*, 208*c*, and/or 208*d*) arranged in the x-direction and extending in they-direction, and a plurality of conductive structures 210 (e.g., conductive structures 210*a*, 210*b*, 210*c*, and/or 210*d*) arranged in the y-direction and extending in the x-direction. The guard ring structure 204-1 additionally includes one or more interconnect structures (e.g., an interconnect structure 214, interconnect structures 214*a* and 214*b*) that are not shown in FIG. 6 for the purpose of clarity. The guard ring structure 204-1 and/or the interconnect structure(s) 214 may be arranged according to any of the example implementations illustrated in FIGS. 2A-2I.

As further shown in FIG. 6, the guard ring structure 204-2 includes a plurality of segments 204*e*, 204*f*, 204*g*, and/or 204*h*, and a plurality of corner regions 212*e*, 212*f*, 212*g*, and/or 212*h*. The guard ring structure 204-2 includes an active region 206*b*, a plurality of conductive structures 208 (e.g., conductive structures 208*e*, 208*f*, 208*g*, and/or 208*h*) arranged in the x-direction and extending in they-direction, and a plurality of conductive structures 210 (e.g., conductive structures 210*e*, 210*f*, 210*g*, and/or 210*h*) arranged in the y-direction and extending in the x-direction. The guard ring structure 204-2 additionally includes one or more interconnect structures (e.g., an interconnect structure 214, interconnect structures 214*a* and 214*b*) that are not shown in FIG. 6 for the purpose of clarity. The guard ring structure 204-2 and/or the interconnect structure(s) 214 may be arranged according to any of the example implementations illustrated in FIGS. 2A-2I.

In some implementations, the guard ring structures 204-1 and 204-2 are arranged in similar configurations. For example, the guard ring structures 204-1 and 204-2 may each be arranged according to the example implementation illustrated in FIGS. 2A-2D. In some implementations, the guard ring structures 204-1 and 204-2 are arranged in different configurations. For example, the guard ring structure 204-1 may be arranged according to the example implementation illustrated in FIG. 2E, and the guard ring structure 204-2 may be arranged according to the example implementation illustrated in FIGS. 2F-2H.

As indicated above, FIG. 6 is provided as an example. Other examples may differ from what is described with regard to FIG. 6.

Figure 7:
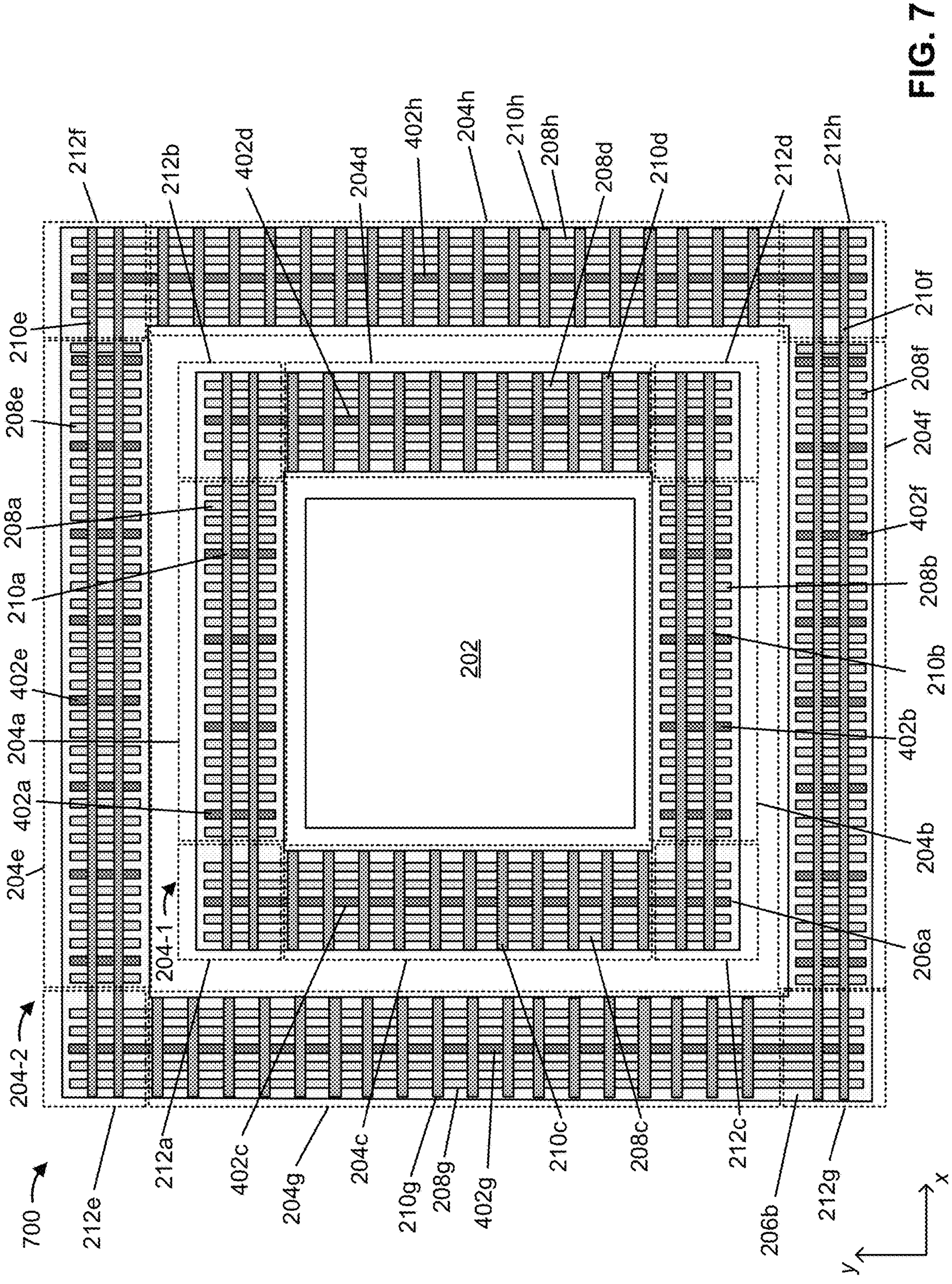
FIG. 7 is a diagram of an example implementation of a semiconductor device described herein.

FIG. 7 is a diagram of an example implementation of a semiconductor device 700 described herein. The semiconductor device 700 includes an example of a semiconductor device, such as a microprocessor, a memory device, an image sensor, and/or an RF device, among other examples. FIG. 7 illustrates a top-down view of the example implementation of the semiconductor device 700. The example implementation of the semiconductor device 700 illustrated in FIG. 7 is similar to the example implementations of the semiconductor device 400 illustrated in FIGS. 4A-4F, except that the semiconductor device 700 includes a plurality of guard ring structures around the integrated circuit 202. For example, the semiconductor device 700 includes a guard ring structure 204-1 (e.g., an inner guard ring) around the integrated circuit 202, and a guard ring structure 204-2 (e.g., an outer guard ring) around the guard ring structure 204-1. The guard ring structure 204-1 and/or the guard ring structure 204-2 may further include a plurality of polysilicon structures 402.

Including a plurality of guard ring structures around the integrated circuit 202 provides additional charge carrier absorption around the integrated circuit 202, and therefore provides increased latch-up protection. However, the single guard ring implementations described herein may be formed using less complex semiconductor manufacturing processes, and therefore consume fewer semiconductor manufacturing resources. Additionally, the polysilicon structures 402 in the guard ring structure 204-1 and/or in the guard ring structure 204-2 may reduce the likelihood of dishing in a dielectric layer above the guard ring structure 204-1 and/or above the guard ring structure 204-2.

As shown in FIG. 7, the guard ring structure 204-1 includes a plurality of segments 204*a*, 204*b*, 204*c*, and/or 204*d*, and a plurality of corner regions 212*a*, 212*b*, 212*c*, and/or 212*d*. The guard ring structure 204-1 includes an active region 206*a*, a plurality of conductive structures 208 (e.g., conductive structures 208*a*, 208*b*, 208*c*, and/or 208*d*) arranged in the x-direction and extending in they-direction, and a plurality of conductive structures 210 (e.g., conductive structures 210*a*, 210*b*, 210*c*, and/or 210*d*) arranged in the y-direction and extending in the x-direction. The guard ring structure 204-1 includes a plurality of polysilicon structures 402 (e.g., polysilicon structures 402*a*, 402*b*, 402*c*, and/or 402*d* arranged in the x-direction and extending in they-direction. The guard ring structure 204-1 additionally includes one or more interconnect structures (e.g., an interconnect structure 214, interconnect structures 214*a* and 214*b*) that are not shown in FIG. 7 for the purpose of clarity. The guard ring structure 204-1 and/or the interconnect structure(s) 214 may be arranged according to any of the example implementations illustrated in FIGS. 4A-4F.

As further shown in FIG. 7, the guard ring structure 204-2 includes a plurality of segments 204*e*, 204*f*, 204*g*, and/or 204*h*, and a plurality of corner regions 212*e*, 212*f*, 212*g*, and/or 212*h*. The guard ring structure 204-2 includes an active region 206*b*, a plurality of conductive structures 208 (e.g., conductive structures 208*e*, 208*f*, 208*g*, and/or 208*h*) arranged in the x-direction and extending in they-direction, and a plurality of conductive structures 210 (e.g., conductive structures 210*e*, 210*f*, 210*g*, and/or 210*h*) arranged in the y-direction and extending in the x-direction. The guard ring structure 204-2 includes a plurality of polysilicon structures 402 (e.g., polysilicon structures 402*e*, 402*f*, 402*g*, and/or 402*h* arranged in the x-direction and extending in the y-direction. The guard ring structure 204-2 additionally includes one or more interconnect structures (e.g., an interconnect structure 214, interconnect structures 214*a* and 214*b*) that are not shown in FIG. 7 for the purpose of clarity. The guard ring structure 204-2 and/or the interconnect structure(s) 214 may be arranged according to any of the example implementations illustrated in FIGS. 4A-4F.

In some implementations, the guard ring structures 204-1 and 204-2 are arranged in similar configurations. For example, the guard ring structures 204-1 and 204-2 may each be arranged according to the example implementation illustrated in FIGS. 4A-4D. In some implementations, the guard ring structures 204-1 and 204-2 are arranged in different configurations. For example, the guard ring structure 204-1 may be arranged according to the example implementation illustrated in FIG. 4E, and the guard ring structure 204-2 may be arranged according to the example implementation illustrated in FIG. 4F.

As indicated above, FIG. 7 is provided as an example. Other examples may differ from what is described with regard to FIG. 7.

Figure 8:
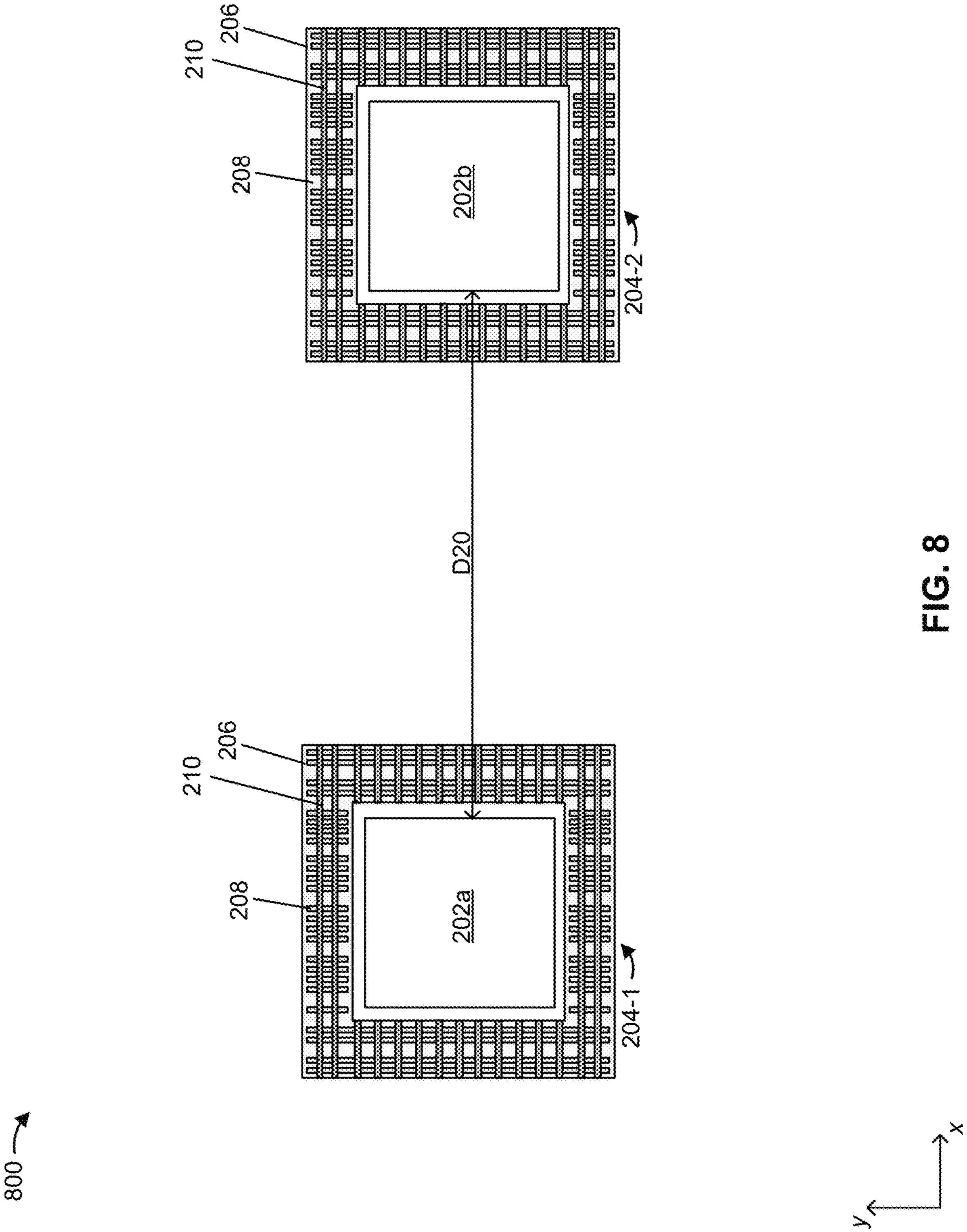
FIG. 8 is a diagram of an example implementation of a semiconductor device described herein.

FIG. 8 is a diagram of an example implementation of a semiconductor device 800 described herein. The semiconductor device 800 includes an example of a semiconductor device, such as a microprocessor, a memory device, an image sensor, and/or an RF device, among other examples. FIG. 8 illustrates a top-down view of the example implementation of the semiconductor device 800. The example implementation of the semiconductor device 800 illustrated in FIG. 8 is similar to the example implementations of the semiconductor device 200 illustrated in FIGS. 2A-2I, except that the semiconductor device 800 includes a plurality of integrated circuits 202*a* and 202*b*. Respective guard ring structures 204 are included around each of the integrated circuits 202*a* and 202*b*. For example, the semiconductor device 800 includes a guard ring structure 204-1 around the integrated circuit 202*a*, and a guard ring structure 204-2 around the integrated circuit 202*b*.

Including a plurality of guard ring structures around each of the integrated circuits 202*a* and 202*b* provides charge carrier absorption for complementary metal oxide semiconductor (CMOS) circuitry of the semiconductor device 800. For example, the integrated circuit 202*a* may include a p-type metal oxide semiconductor (PMOS) integrated circuit (e.g., an integrated circuit that includes PMOS transistor(s)), and the integrated circuit 202*b* may include an n-type metal oxide semiconductor (NMOS) integrated circuit (e.g., an integrated circuit that includes NMOS transistor(s)). The guard ring structures 204-1 and 204-2 absorb charge carriers around the integrated circuits 202*a* and 202*b*, which prevents or reduces the likelihood of formation of a low-impedance path between the integrated circuits 202*a* and 202*b* through a substrate of the semiconductor device 800. Thus, the guard ring structures 204-1 and 204-2 prevent or reduce the likelihood of electrical shorting between the integrated circuits 202*a* and 202*b* (which might otherwise result in latch-up of the integrated circuits 202*a* and 202*b*). Moreover, the conductive grids formed in the guard ring structures 204-1 and 204-2 by the conductive structures 208 and 210 provide increased charge carrier absorption (e.g., due to the increased surface area coverage of the active regions 206 by the conductive structures 208 and 210) without increasing a distance between the integrated circuits 202*a* and 202*b* (corresponding to a dimension D20). Thus, the guard ring structures 204-1 and 204-2 enable the size of the semiconductor device 800 to be maintained or decreased.

As shown in FIG. 8, the guard ring structure 204-1 includes an active region 206, a plurality of conductive structures 208 above the active region 206 of the guard ring structure 204-1, and a plurality of conductive structures 210 above the active region 206 of the guard ring structure 204-1. The plurality of conductive structures 208 are arranged in the x-direction and extend in the y-direction. The plurality of conductive structures 210 are arranged in the y-direction and extend in the x-direction. The guard ring structure 204-1 additionally includes one or more interconnect structures (e.g., an interconnect structure 214, interconnect structures 214*a* and 214*b*) that are not shown in FIG. 8 for the purpose of clarity. The guard ring structure 204-1 and/or the interconnect structure(s) 214 may be arranged according to any of the example implementations illustrated in FIGS. 2A-2I.

The guard ring structure 204-2 includes an active region 206, a plurality of conductive structures 208 above the active region 206 of the guard ring structure 204-2, and a plurality of conductive structures 210 above the active region 206 of the guard ring structure 204-2. The plurality of conductive structures 208 are arranged in the x-direction and extend in the y-direction. The plurality of conductive structures 210 are arranged in the y-direction and extend in the x-direction. The guard ring structure 204-2 additionally includes one or more interconnect structures (e.g., an interconnect structure 214, interconnect structures 214*a* and 214*b*) that are not shown in FIG. 8 for the purpose of clarity. The guard ring structure 204-2 and/or the interconnect structure(s) 214 may be arranged according to any of the example implementations illustrated in FIGS. 2A-2I.

In some implementations, the guard ring structures 204-1 and 204-2 are arranged in similar configurations. For example, the guard ring structures 204-1 and 204-2 may each be arranged according to the example implementation illustrated in FIGS. 2A-2D. In some implementations, the guard ring structures 204-1 and 204-2 are arranged in different configurations. For example, the guard ring structure 204-1 may be arranged according to the example implementation illustrated in FIGS. 2A-2D, and the guard ring structure 204-2 may be arranged according to the example implementation illustrated in FIG. 2I.

As indicated above, FIG. 8 is provided as an example. Other examples may differ from what is described with regard to FIG. 8.

Figure 9:
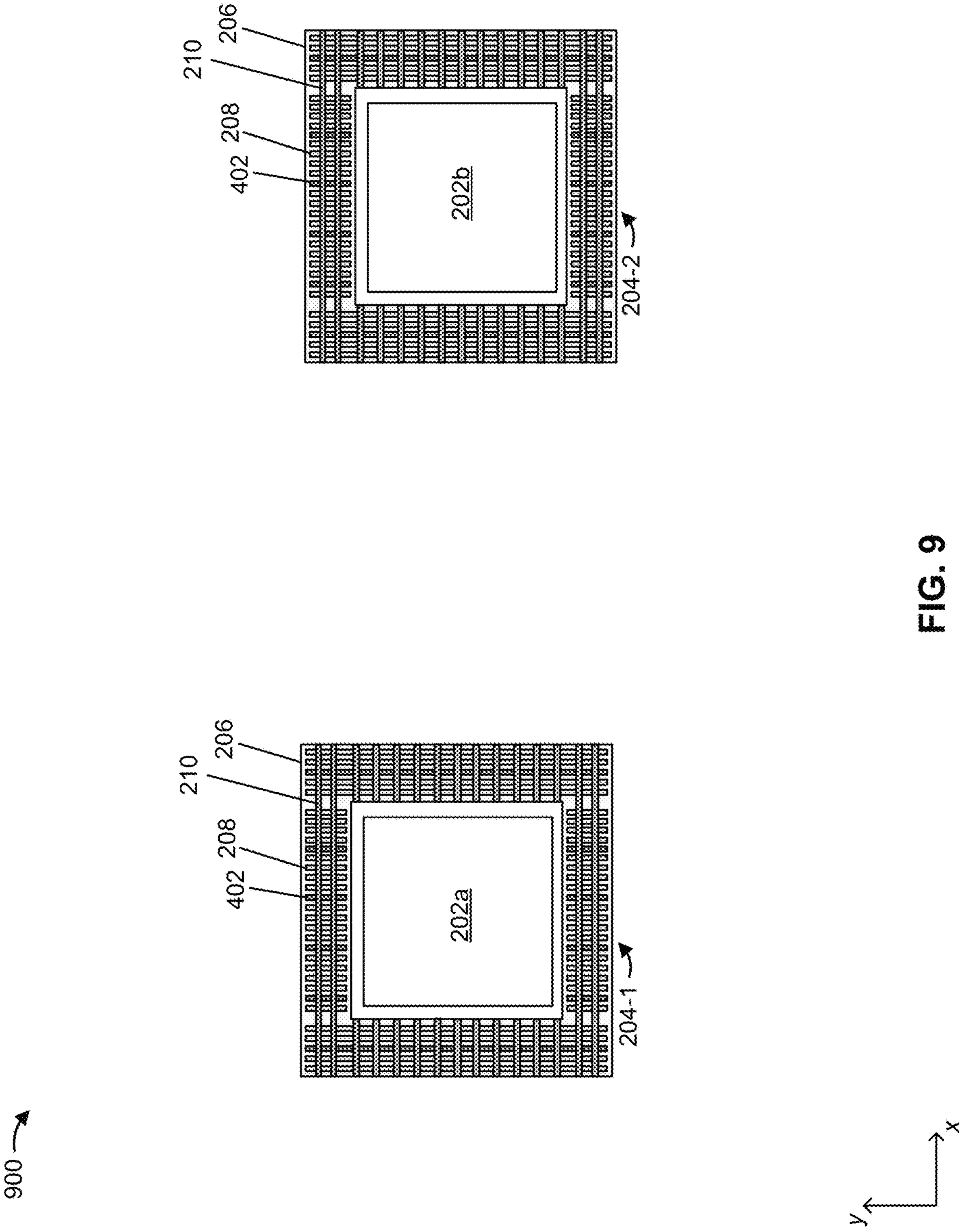
FIG. 9 is a diagram of an example implementation of a semiconductor device described herein.

FIG. 9 is a diagram of an example implementation of a semiconductor device 900 described herein. The semiconductor device 900 includes an example of a semiconductor device, such as a microprocessor, a memory device, an image sensor, and/or an RF device, among other examples. FIG. 9 illustrates a top-down view of the example implementation of the semiconductor device 900. The example implementation of the semiconductor device 900 illustrated in FIG. 9 is similar to the example implementations of the semiconductor device 400 illustrated in FIGS. 4A-4F, except that the semiconductor device 900 includes a plurality of integrated circuits 202*a* and 202*b*. Respective guard ring structures 204 are included around each of the integrated circuits 202*a* and 202*b*. For example, the semiconductor device 900 includes a guard ring structure 204-1 around the integrated circuit 202*a*, and a guard ring structure 204-2 around the integrated circuit 202*b*. The guard ring structure

204-1 and/or the guard ring structure 204-2 may further include a plurality of polysilicon structures 402.

Including a plurality of guard ring structures around each of the integrated circuits 202*a* and 202*b* provides charge carrier absorption for CMOS circuitry of the semiconductor device 900. For example, the integrated circuit 202*a* may include a PMOS integrated circuit and the integrated circuit 202*b* may include an NMOS integrated circuit. The guard ring structures 204-1 and 204-2 absorb charge carriers around the integrated circuits 202*a* and 202*b*, which prevents or reduces the likelihood of formation of a low-impedance path between the integrated circuits 202*a* and 202*b* through a substrate of the semiconductor device 900. Thus, the guard ring structures 204-1 and 204-2 prevent or reduce the likelihood of electrical shorting between the integrated circuits 202*a* and 202*b* (which might otherwise result in latch-up of the integrated circuits 202*a* and 202*b*). Moreover, the conductive grids formed in the guard ring structures 204-1 and 204-2 by the conductive structures 208 and 210 provide increased charge carrier absorption (e.g., due to the increased surface area coverage of the active regions 206 by the conductive structures 208 and 210) without increasing a distance between the integrated circuits 202*a* and 202*b*. Thus, the guard ring structures 204-1 and 204-2 enable the size of the semiconductor device 900 to be maintained or decreased. Additionally, the polysilicon structures 402 in the guard ring structure 204-1 and/or in the guard ring structure 204-2 may reduce the likelihood of dishing in a dielectric layer above the guard ring structure 204-2 and/or above the guard ring structure 204-2.

As shown in FIG. 9, the guard ring structure 204-1 includes an active region 206, a plurality of conductive structures 208 above the active region 206 of the guard ring structure 204-1, a plurality of conductive structures 210 above the active region 206 of the guard ring structure 204-1, and a plurality of polysilicon structures 402 above the active region 206 of the guard ring structure 204-1. The plurality of conductive structures 208 are arranged in the x-direction and extend in they-direction. The plurality of conductive structures 210 are arranged in the y-direction and extend in the x-direction. The plurality of polysilicon structures 402 are arranged in the x-direction and extend in the y-direction. The guard ring structure 204-1 additionally includes one or more interconnect structures (e.g., an interconnect structure 214, interconnect structures 214*a* and 214*b*) that are not shown in FIG. 9 for the purpose of clarity. The guard ring structure 204-1 and/or the interconnect structure(s) 214 may be arranged according to any of the example implementations illustrated in FIGS. 4A-4F.

The guard ring structure 204-2 includes an active region 206, a plurality of conductive structures 208 above the active region 206 of the guard ring structure 204-2, a plurality of conductive structures 210 above the active region 206 of the guard ring structure 204-2, and a plurality of polysilicon structures 402 above the active region 206 of the guard ring structure 204-2. The plurality of conductive structures 208 are arranged in the x-direction and extend in they-direction. The plurality of conductive structures 210 are arranged in the y-direction and extend in the x-direction. The plurality of polysilicon structures 402 are arranged in the x-direction and extend in the y-direction. The guard ring structure 204-2 additionally includes one or more interconnect structures (e.g., an interconnect structure 214, interconnect structures 214*a* and 214*b*) that are not shown in FIG. 9 for the purpose of clarity. The guard ring structure 204-2 and/or the interconnect structure(s) 214 may be arranged according to any of the example implementations illustrated in FIGS. 4A-4F.

In some implementations, the guard ring structures 204-1 and 204-2 are arranged in similar configurations. For example, the guard ring structures 204-1 and 204-2 may each be arranged according to the example implementation illustrated in FIGS. 4A-4D. In some implementations, the guard ring structures 204-1 and 204-2 are arranged in different configurations. For example, the guard ring structure 204-1 may be arranged according to the example implementation illustrated in FIG. 4E, and the guard ring structure 204-2 may be arranged according to the example implementation illustrated in FIG. 4F.

As indicated above, FIG. 9 is provided as an example. Other examples may differ from what is described with regard to FIG. 9. For example, the guard ring structure 204-1 may be arranged according to an example implementation illustrated in FIGS. 2A-2I, and the guard ring structure 204-2 may be arranged according to an example implementation illustrated in FIGS. 4A-4F. As another example, the guard ring structure 204-2 may be arranged according to an example implementation illustrated in FIGS. 2A-2I, and the guard ring structure 204-1 may be arranged according to an example implementation illustrated in FIGS. 4A-4F.

Figure 10:
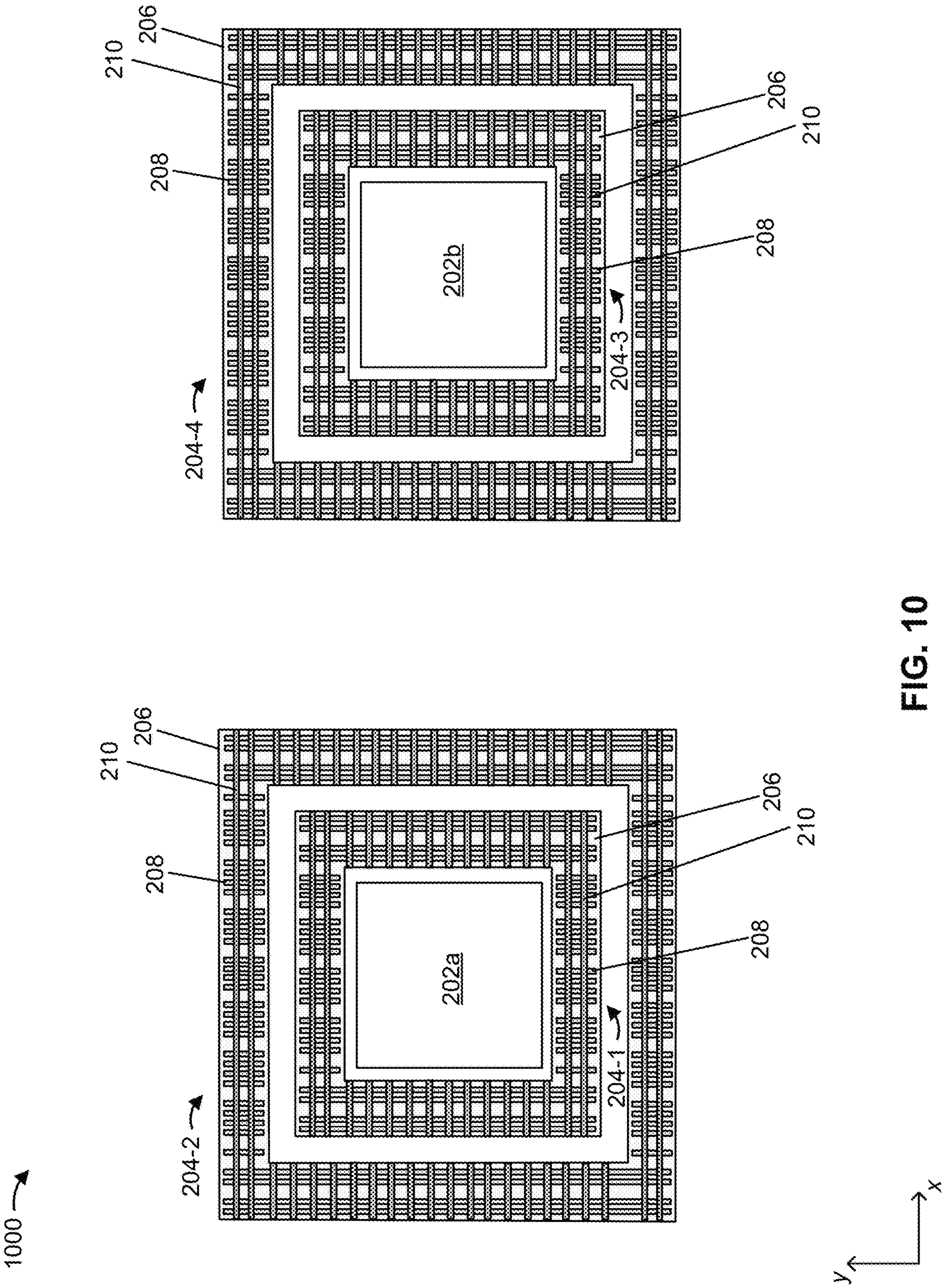
FIG. 10 is a diagram of an example implementation of a semiconductor device described herein.

FIG. 10 is a diagram of an example implementation of a semiconductor device 1000 described herein. The semiconductor device 1000 includes an example of a semiconductor device, such as a microprocessor, a memory device, an image sensor, and/or an RF device, among other examples. FIG. 10 illustrates a top-down view of the example implementation of the semiconductor device 1000. The example implementation of the semiconductor device 1000 illustrated in FIG. 10 is similar to the example implementations of the semiconductor device 800 illustrates in FIG. 8, except that the semiconductor device 1000 includes a plurality of guard ring structures around one or more of the integrated circuits 202*a* and/or 202*b*, similar to the example embodiment illustrated in FIG. 6. For example, the semiconductor device 1000 may include a guard ring structure 204-1 (e.g., an inner guard ring) around the integrated circuit 202*a*, and a guard ring structure 204-2 (e.g., an outer guard ring) around the guard ring structure 204-1. As another example, the semiconductor device 1000 may include a guard ring structure 204-3 (e.g., an inner guard ring) around the integrated circuit 202*b*, and a guard ring structure 204-4 (e.g., an outer guard ring) around the guard ring structure 204-4. In some implementations, guard ring structures 204-1 and 204-2 are included around the integrated circuit 202*a*, and the guard ring structures 204-3 and 204-4 are included around the integrated circuit 202*b*.

Including a plurality of guard ring structures around the integrated circuits 202*a* and/or 202*b* provides additional charge carrier absorption around the integrated circuits 202*a* and/or 202*b*, and therefore provides increased latch-up protection for the semiconductor device 1000.

As shown in FIG. 10, the guard ring structure 204-1 includes an active region 206, a plurality of conductive structures 208 above the active region 206 of the guard ring structure 204-1, and a plurality of conductive structures 210 above the active region 206 of the guard ring structure 204-1. The plurality of conductive structures 208 are arranged in the x-direction and extend in the y-direction. The plurality of conductive structures 210 are arranged in they-direction and extend in the x-direction. The guard ring structure 204-1 additionally includes one or more interconnect structures (e.g., an interconnect structure 214, interconnect structures 214*a* and 214*b*) that are not shown in FIG. 10 for the purpose of clarity. The guard ring structure 204-1 and/or the interconnect structure(s) 214 may be arranged according to any of the example implementations illustrated in FIGS. 2A-2I.

The guard ring structure 204-2 includes an active region 206, a plurality of conductive structures 208 above the active region 206 of the guard ring structure 204-2, and a plurality of conductive structures 210 above the active region 206 of the guard ring structure 204-2. The plurality of conductive structures 208 are arranged in the x-direction and extend in the y-direction. The plurality of conductive structures 210 are arranged in the y-direction and extend in the x-direction. The guard ring structure 204-2 additionally includes one or more interconnect structures (e.g., an interconnect structure 214, interconnect structures **214*a* and 214*b*) that are not shown in FIG. 10 for the purpose of clarity. The guard ring structure 204-2 and/or the interconnect structure(s) 214 may be arranged according to any of the example implementations illustrated in FIGS. 2A-2I**.

The guard ring structure 204-3 includes an active region 206, a plurality of conductive structures 208 above the active region 206 of the guard ring structure 204-3, and a plurality of conductive structures 210 above the active region 206 of the guard ring structure 204-3. The plurality of conductive structures 208 are arranged in the x-direction and extend in the y-direction. The plurality of conductive structures 210 are arranged in the y-direction and extend in the x-direction. The guard ring structure 204-3 additionally includes one or more interconnect structures (e.g., an interconnect structure 214, interconnect structures **214*a* and 214*b*) that are not shown in FIG. 10 for the purpose of clarity. The guard ring structure 204-3 and/or the interconnect structure(s) 214 may be arranged according to any of the example implementations illustrated in FIGS. 2A-2I**.

The guard ring structure 204-3 includes an active region 206, a plurality of conductive structures 208 above the active region 206 of the guard ring structure 204-4, and a plurality of conductive structures 210 above the active region 206 of the guard ring structure 204-4. The plurality of conductive structures 208 are arranged in the x-direction and extend in the y-direction. The plurality of conductive structures 210 are arranged in the y-direction and extend in the x-direction. The guard ring structure 204-4 additionally includes one or more interconnect structures (e.g., an interconnect structure 214, interconnect structures **214*a* and 214*b*) that are not shown in FIG. 10 for the purpose of clarity. The guard ring structure 204-4 and/or the interconnect structure(s) 214 may be arranged according to any of the example implementations illustrated in FIGS. 2A-2I**.

In some implementations, two or more of the guard ring structures 204-1, 204-2, 204-3, and/or 204-4 are arranged in similar configurations. For example, two or more of the guard ring structure 204-1, 204-2, 204-3, and/or 204-4 may each be arranged according to the example implementation illustrated in FIGS. 2A-2D. In some implementations, two or more of the guard ring structures 204-1, 204-2, 204-3, and/or 204-4 are arranged in different configurations. For example, the guard ring structure 204-1 may be arranged according to the example implementation illustrated in FIG. 2E, and the guard ring structure 204-3 may be arranged according to the example implementation illustrated in FIGS. 2F-2H.

As indicated above, FIG. 10 is provided as an example. Other examples may differ from what is described with regard to FIG. 10.

Figure 11:
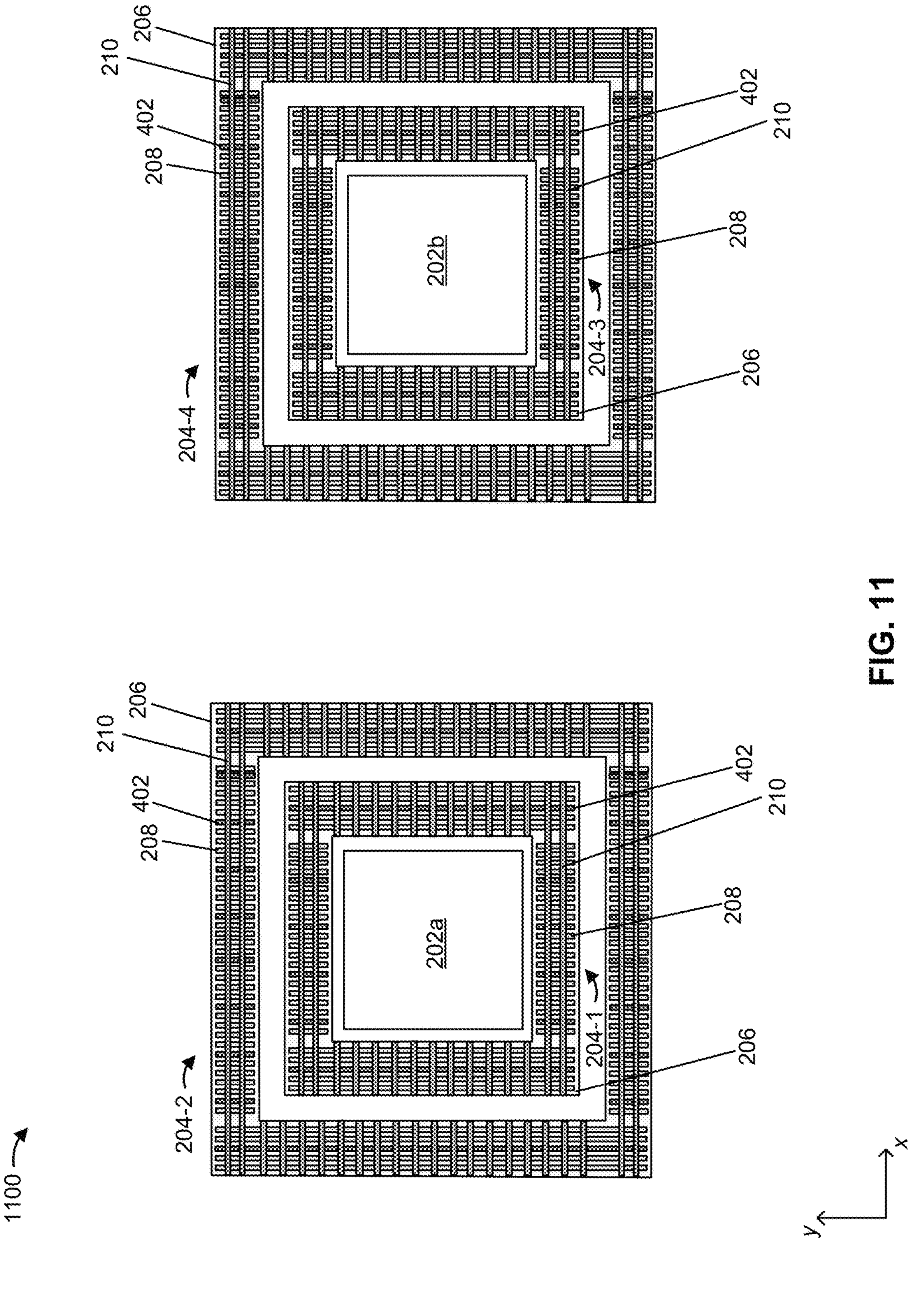
FIG. 11 is a diagram of an example implementation of a semiconductor device described herein.

FIG. 11 is a diagram of an example implementation of a semiconductor device 1100 described herein. The semiconductor device 1100 includes an example of a semiconductor device, such as a microprocessor, a memory device, an image sensor, and/or an RF device, among other examples. FIG. 11 illustrates a top-down view of the example implementation of the semiconductor device 1100. The example implementation of the semiconductor device 1100 illustrated in FIG. 11 is similar to the example implementations of the semiconductor device 700 illustrates in FIG. 7, except that the semiconductor device 1100 includes a plurality of guard ring structures around the integrated circuit **202*a* and/or around the integrated circuit 202*b*. For example, the semiconductor device 1100 may include a guard ring structure 204-1 (e.g., an inner guard ring) around the integrated circuit 202*a*, and a guard ring structure 204-2 (e.g., an outer guard ring) around the guard ring structure 204-1. As another example, the semiconductor device 1100 may include a guard ring structure 204-3 (e.g., an inner guard ring) around the integrated circuit 202*b*, and a guard ring structure 204-4 (e.g., an outer guard ring) around the guard ring structure 204-3. In some implementations, guard ring structures 204-1 and 204-2 are included around the integrated circuit 202*a*, and the guard ring structures 204-3 and 204-4 are included around the integrated circuit 202*b*. One or more of the guard ring structures 204-1, 204-2, 204-3, and/or 204-4 may further include a plurality of polysilicon structures 402**.

Including a plurality of guard ring structures around the integrated circuits **202*a* and/or 202*b* provides additional charge carrier absorption around the integrated circuits 202*a* and/or 202*b*, and therefore provides increased latch-up protection for the semiconductor device 1100. Additionally, the polysilicon structures 402 in the guard ring structures 204-1, 204-2, 204-3, and/or 204-4 may reduce the likelihood of dishing in a dielectric layer above the guard ring structures 204-1, 204-2, 204-3, and/or 204-4**.

As shown in FIG. 11, the guard ring structure 204-1 includes an active region 206, a plurality of conductive structures 208 above the active region 206 of the guard ring structure 204-1, a plurality of conductive structures 210 above the active region 206 of the guard ring structure 204-1, and a plurality of polysilicon structures 402. The plurality of conductive structures 208 are arranged in the x-direction and extend in the y-direction. The plurality of conductive structures 210 are arranged in the y-direction and extend in the x-direction. The plurality of polysilicon structures 402 are arranged in the x-direction and extend in the y-direction. The guard ring structure 204-1 additionally includes one or more interconnect structures (e.g., an interconnect structure 214, interconnect structures **214*a* and 214*b*) that are not shown in FIG. 11 for the purpose of clarity. The guard ring structure 204-1 and/or the interconnect structure(s) 214 may be arranged according to any of the example implementations illustrated in FIGS. 4A-4F**.

As shown in FIG. 11, the guard ring structure 204-2 includes an active region 206, a plurality of conductive structures 208 above the active region 206 of the guard ring structure 204-2, a plurality of conductive structures 210 above the active region 206 of the guard ring structure 204-2, and a plurality of polysilicon structures 402. The plurality of conductive structures 208 are arranged in the x-direction and extend in the y-direction. The plurality of conductive structures 210 are arranged in the y-direction and extend in the x-direction. The plurality of polysilicon structures 402 are arranged in the x-direction and extend in the y-direction. The guard ring structure 204-2 additionally includes one or more interconnect structures (e.g., an interconnect structure 214, interconnect structures **214*a* and 214*b*) that are not shown in FIG. 11 for the purpose of clarity. The guard ring structure 204-2 and/or the interconnect structure(s) 214 may be arranged according to any of the example implementations illustrated in FIGS. 4A-4**F.

As shown in FIG. 11, the guard ring structure 204-3 includes an active region 206, a plurality of conductive structures 208 above the active region 206 of the guard ring structure 204-3, a plurality of conductive structures 210 above the active region 206 of the guard ring structure 204-3, and a plurality of polysilicon structures 402. The plurality of conductive structures 208 are arranged in the x-direction and extend in the y-direction. The plurality of conductive structures 210 are arranged in the y-direction and extend in the x-direction. The plurality of polysilicon structures 402 are arranged in the x-direction and extend in the y-direction. The guard ring structure 204-3 additionally includes one or more interconnect structures (e.g., an interconnect structure 214, interconnect structures 214*a* and 214*b*) that are not shown in FIG. 11 for the purpose of clarity. The guard ring structure 204-3 and/or the interconnect structure(s) 214 may be arranged according to any of the example implementations illustrated in FIGS. 4A-4F.

As shown in FIG. 11, the guard ring structure 204-4 includes an active region 206, a plurality of conductive structures 208 above the active region 206 of the guard ring structure 204-4, a plurality of conductive structures 210 above the active region 206 of the guard ring structure 204-4, and a plurality of polysilicon structures 402. The plurality of conductive structures 208 are arranged in the x-direction and extend in the y-direction. The plurality of conductive structures 210 are arranged in the y-direction and extend in the x-direction. The plurality of polysilicon structures 402 are arranged in the x-direction and extend in the y-direction. The guard ring structure 204-4 additionally includes one or more interconnect structures (e.g., an interconnect structure 214, interconnect structures 214*a* and 214*b*) that are not shown in FIG. 11 for the purpose of clarity. The guard ring structure 204-4 and/or the interconnect structure(s) 214 may be arranged according to any of the example implementations illustrated in FIGS. 4A-4F.

In some implementations, two or more of the guard ring structures 204-1, 204-2, 204-3, and/or 204-4 are arranged in similar configurations. For example, two or more of the guard ring structure 204-1, 204-2, 204-3, and/or 204-4 may each be arranged according to the example implementation illustrated in FIGS. 4A-4D. In some implementations, two or more of the guard ring structures 204-1, 204-2, 204-3, and/or 204-4 are arranged in different configurations. For example, the guard ring structure 204-2 may be arranged according to the example implementation illustrated in FIG. 4F, and the guard ring structure 204-4 may be arranged according to the example implementation illustrated in FIG. 5E.

As indicated above, FIG. 11 is provided as an example. Other examples may differ from what is described with regard to FIG. 11. For example, a single guard ring structure 204 may be included around the integrated circuit 202*a*, and a plurality of guard ring structures 204-3 and 204-4 may be included around the integrated circuit 202*b*, where the guard ring structures 204, 204-3, and 204-4 have the same configuration or different configurations according to the example implementations in FIGS. 2A-2I, 4A-4F, 6, and/or 7. As another example, a single guard ring structure 204 may be included around the integrated circuit 202*b*, and a plurality of guard ring structures 204-1 and 204-2 may be included around the integrated circuit 202*a*, where the guard ring structures 204, 204-1, and 204-2 have the same configuration or different configurations according to the example implementations in FIGS. 2A-2I, 4A-4F, 6, and/or 7. As another example, a plurality of guard ring structures 204-1 and 204-2 may be included around the integrated circuit 202*a*, and a plurality of guard ring structures 204-3 and 204-4 may be included around the integrated circuit 202*d*, where the guard ring structures 204-1, 204-2, 204-3, and 204-4 have the same configuration or different configurations according to the example implementations in FIGS. 2A-2I, 4A-4F, 6, and/or 7.

Figure 12:
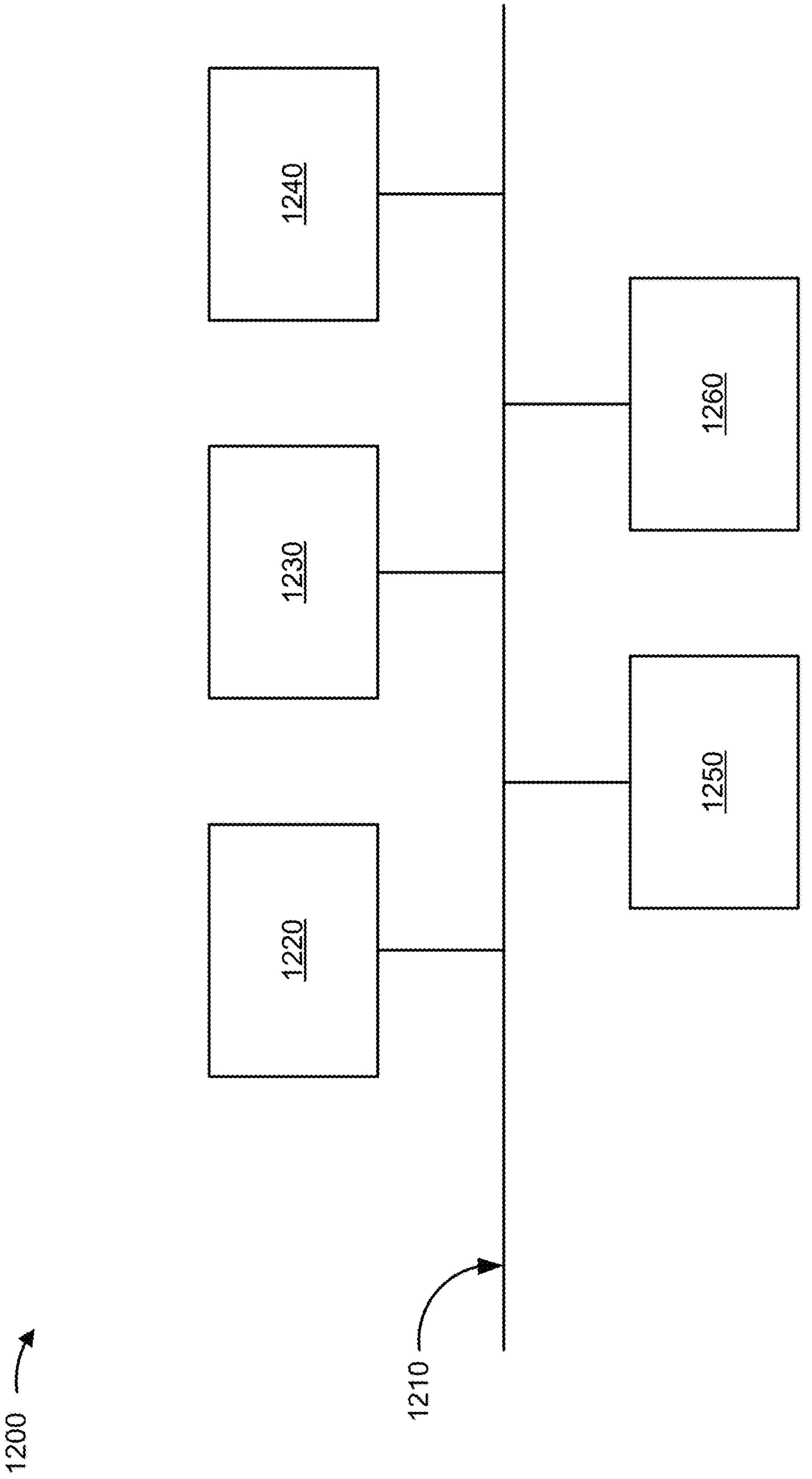
FIG. 12 is a diagram of example components of a device described herein.

FIG. 12 is a diagram of example components of a device 1200 described herein. In some implementations, one or more of the semiconductor processing tools 102-112 and/or the wafer/die transport tool 114 may include one or more devices 1200 and/or one or more components of the device 1200. As shown in FIG. 12, the device 1200 may include a bus 1210, a processor 1220, a memory 1230, an input component 1240, an output component 1250, and/or a communication component 1260.

The bus 1210 may include one or more components that enable wired and/or wireless communication among the components of the device 1200. The bus 1210 may couple together two or more components of FIG. 12, such as via operative coupling, communicative coupling, electronic coupling, and/or electric coupling. For example, the bus 1210 may include an electrical connection (e.g., a wire, a trace, and/or a lead) and/or a wireless bus. The processor 1220 may include a central processing unit, a graphics processing unit, a microprocessor, a controller, a microcontroller, a digital signal processor, a field-programmable gate array, an application-specific integrated circuit, and/or another type of processing component. The processor 1220 may be implemented in hardware, firmware, or a combination of hardware and software. In some implementations, the processor 1220 may include one or more processors capable of being programmed to perform one or more operations or processes described elsewhere herein.

The memory 1230 may include volatile and/or nonvolatile memory. For example, the memory 1230 may include random access memory (RAM), read only memory (ROM), a hard disk drive, and/or another type of memory (e.g., a flash memory, a magnetic memory, and/or an optical memory). The memory 1230 may include internal memory (e.g., RAM, ROM, or a hard disk drive) and/or removable memory (e.g., removable via a universal serial bus connection). The memory 1230 may be a non-transitory computer-readable medium. The memory 1230 may store information, one or more instructions, and/or software (e.g., one or more software applications) related to the operation of the device 1200. In some implementations, the memory 1230 may include one or more memories that are coupled (e.g., communicatively coupled) to one or more processors (e.g., processor 1220), such as via the bus 1210. Communicative coupling between a processor 1220 and a memory 1230 may enable the processor 1220 to read and/or process information stored in the memory 1230 and/or to store information in the memory 1230.

The input component 1240 may enable the device 1200 to receive input, such as user input and/or sensed input. For example, the input component 1240 may include a touch screen, a keyboard, a keypad, a mouse, a button, a microphone, a switch, a sensor, a global positioning system sensor, a global navigation satellite system sensor, an accelerometer, a gyroscope, and/or an actuator. The output component 1250 may enable the device 1200 to provide output, such as via a display, a speaker, and/or a light-emitting diode. The communication component 1260 may enable the device 1200 to communicate with other devices via a wired connection and/or a wireless connection. For example, the communication component 1260 may include a receiver, a transmitter, a transceiver, a modem, a network interface card, and/or an antenna.

The device 1200 may perform one or more operations or processes described herein. For example, a non-transitory computer-readable medium (e.g., memory 1230) may store a set of instructions (e.g., one or more instructions or code) for execution by the processor 1220. The processor 1220 may execute the set of instructions to perform one or more operations or processes described herein. In some implementations, execution of the set of instructions, by one or more processors 1220, causes the one or more processors 1220 and/or the device 1200 to perform one or more operations or processes described herein. In some implementations, hardwired circuitry may be used instead of or in combination with the instructions to perform one or more operations or processes described herein. Additionally, or alternatively, the processor 1220 may be configured to perform one or more operations or processes described herein. Thus, implementations described herein are not limited to any specific combination of hardware circuitry and software.

The number and arrangement of components shown in FIG. 12 are provided as an example. The device 1200 may include additional components, fewer components, different components, or differently arranged components than those shown in FIG. 12. Additionally, or alternatively, a set of components (e.g., one or more components) of the device 1200 may perform one or more functions described as being performed by another set of components of the device 1200.

Figure 13:
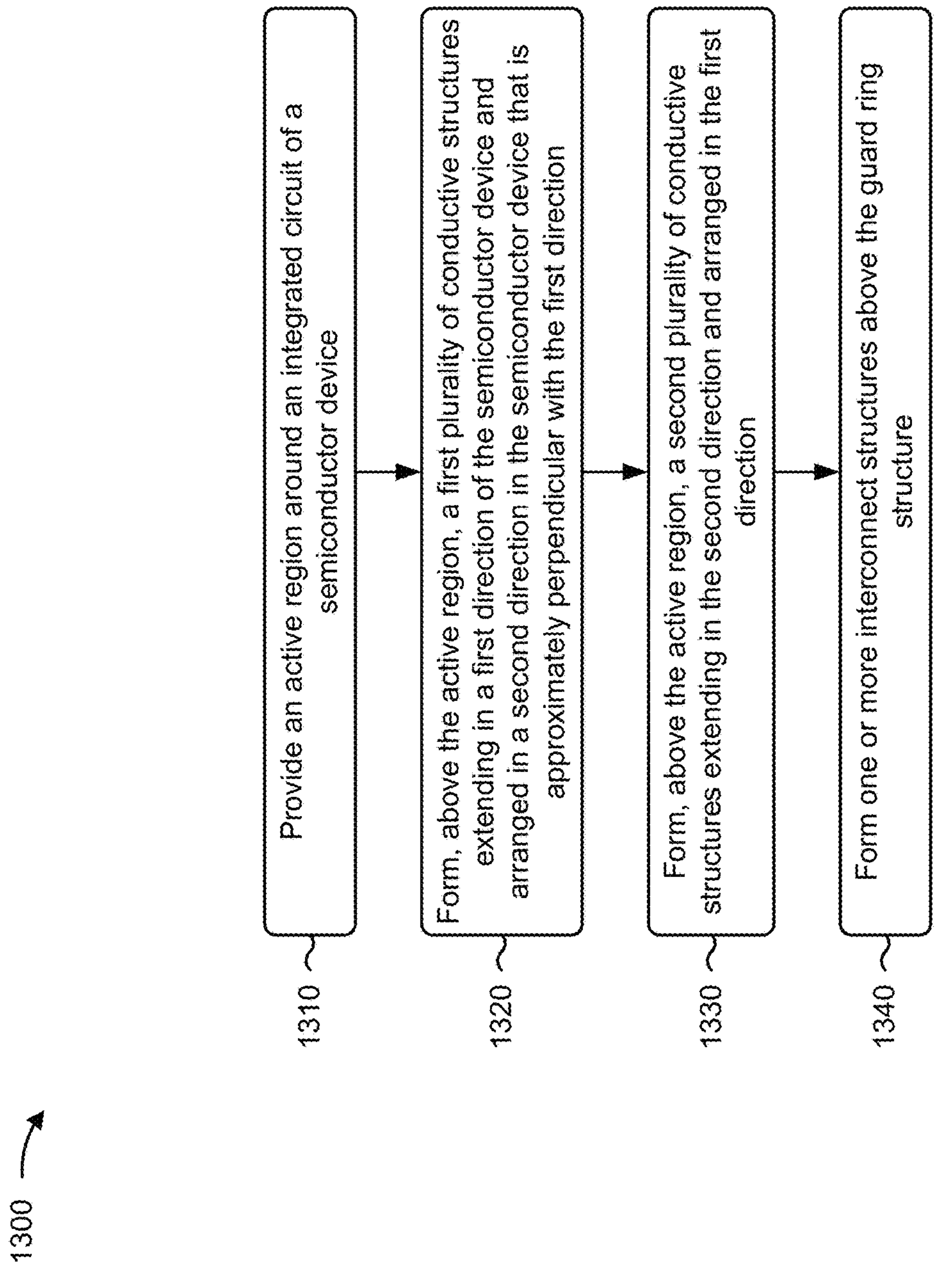
FIG. 13 is a flowchart of an example process associated with forming a semiconductor device described herein.

FIG. 13 is a flowchart of an example process 1300 associated with forming a semiconductor device described herein. In some implementations, one or more process blocks of FIG. 13 are performed using one or more semiconductor processing tools (e.g., one or more of the semiconductor processing tools 102-112 and/or the wafer/die transport tool 114). Additionally, or alternatively, one or more process blocks of FIG. 13 may be performed using one or more components of device 1200, such as processor 1220, memory 1230, input component 1240, output component 1250, and/or communication component 1260.

As shown in FIG. 13, process 1300 may include providing an active region around an integrated circuit device of a semiconductor device (block 1310). For example, one or more of the semiconductor processing tools 102-112 and/or the wafer/die transport tool 114 may be used to provide an active region (e.g., an active region 206, 206*a*, 206*b*, 206*c*, and/or 206*d*) around an integrated circuit (e.g., an integrated circuit 202, 202*a*, and/or 202*b*) of a semiconductor device (e.g., a semiconductor device 200, 400, 600, 700, 800, 900, and/or 1000), as described herein.

As further shown in FIG. 13, process 1300 may include forming, above the active region, a first plurality of conductive structures extending in a first direction of the semiconductor device and arranged in a second direction in the semiconductor device that is approximately perpendicular with the first direction (block 1320). For example, one or more of the semiconductor processing tools 102-112 may be used to form, above the active region, a first plurality of conductive structures (e.g., conductive structures 208, 208*a*, 208*b*, 208*c*, 208*d*, 208*e*, 208*f*, 208*g*, and/or 208*h*) extending in a first direction (e.g., a y-direction) of the semiconductor device and arranged in a second direction (e.g., an x-direction) in the semiconductor device that is approximately perpendicular with the first direction, as described herein.

As further shown in FIG. 13, process 1300 may include forming, above the active region, a second plurality of conductive structures extending in the second direction and arranged in the first direction (block 1330). For example, one or more of the semiconductor processing tools 102-112 may be used to form, above the active region, a second plurality of conductive structures (e.g., conductive structures 210, 210*a*, 210*b*, 210*c*, 210*d*, 210*e*, 210*f*, 210*g*, and/or 210*h*) extending in the second direction and arranged in the first direction, as described herein. In some implementations, the first plurality of conductive structures and the second plurality of conductive structures intersect to form a guard ring structure (e.g., guard ring structure 204, 204-1, 204-2, 204-3, and/or 204-4) above the active region.

As further shown in FIG. 13, process 1300 may include forming one or more interconnect structures above the guard ring structure (block 1340). For example, one or more of the semiconductor processing tools 102-112 may be used to form one or more interconnect structures (e.g., interconnect structures 214, 214*a*, and/or 214*b*) above the guard ring structure, as described herein.

Process 1300 may include additional implementations, such as any single implementation or any combination of implementations described below and/or in connection with one or more other processes described elsewhere herein.

In a first implementation, the active region is a first active region (e.g., an active region 206*a*) of the semiconductor device, the guard ring structure is a first guard ring structure (e.g., a guard ring structure 204-1, a guard ring structure 204-3) of the semiconductor device, and the process 1300 includes providing a second active region (e.g., an active region 206*b*) around the first active region, forming, above the second active region, a third plurality of conductive structures (e.g., conductive structures 208*e*, 208*f*, 208*g*, and/or 208*h*) extending in the first direction and arranged in the second direction, and forming, above the second active region, a fourth plurality of conductive structures (e.g., conductive structures 210*e*, 210*f*, 210*g*, and/or 210*h*) extending in the second direction and arranged in the first direction, where the third plurality of conductive structures and the fourth plurality of conductive structures intersect to form a second guard ring structure (e.g., a guard ring structure 204-2, a guard ring structure 204-4) above the second active region.

In a second implementation, alone or in combination with the first implementation, process 1300 includes forming a first a plurality of polysilicon structures (e.g., polysilicon structures 402*a*, polysilicon structures 402*b*) above the first active region, the first plurality of polysilicon structures extending in the first direction, and forming a second plurality of polysilicon structures (e.g., polysilicon structures 402*a*, polysilicon structures 402*b*) above the second active region, the second plurality of polysilicon structures extending in the first direction.

In a third implementation, alone or in combination with one or more of the first and second implementations, the integrated circuit is a first integrated circuit (e.g., an integrated circuit 202*a*) of the semiconductor device, the active region is a first active region (e.g., an active region 206*a*) of the semiconductor device, the guard ring structure is a first guard ring structure (e.g., a guard ring structure 204-1, a guard ring structure 204-3) of the semiconductor device, and the process 1300 includes providing a second active region (e.g., an active region 206*a*, and active region 206*b*) around a second integrated circuit (e.g., an integrated circuit 202*b*) that is adjacent to the first integrated circuit, forming, above the second active region, a third plurality of conductive structures (e.g., conductive structures 208) extending in the first direction and arranged in the second direction, and forming, above the second active region, a fourth plurality of conductive structures (e.g., conductive structures 210) extending in the second direction and arranged in the first direction, wherein the third plurality of conductive structures and the fourth plurality of conductive structures intersect to form a second guard ring structure (e.g., a guard ring structure 204-2, a guard ring structure 204-4) above the second active region.

In a fourth implementation, alone or in combination with one or more of the first through third implementations, process 1300 includes forming a first a plurality of polysilicon structures (e.g., polysilicon structures 402*a*, polysilicon structures 402*b*) above the first active region, where the first plurality of polysilicon structures extend in the first direction, and forming a second plurality of polysilicon structures (e.g., polysilicon structures 402*a*, polysilicon structures 402*b*) above the second active region, where the second plurality of polysilicon structures extend in the first direction.

In a fifth implementation, alone or in combination with one or more of the first through fourth implementations, process 1300 includes providing a third active region (e.g., an active region 206*b*) around the first active region, forming, above the third active region, a fifth plurality of conductive structures (e.g., conductive structure 208) extending in the first direction and arranged in the second direction, and forming, above the second active region, a sixth plurality of conductive structures (e.g., conductive structures 210) extending in the second direction and arranged in the first direction, where the fifth plurality of conductive structures and the sixth plurality of conductive structures intersect to form a third guard ring structure (e.g., a guard ring structure 204-2) above the first active region.

Although FIG. 13 shows example blocks of process 1300, in some implementations, process 1300 includes additional blocks, fewer blocks, different blocks, or differently arranged blocks than those depicted in FIG. 13. Additionally, or alternatively, two or more of the blocks of process 1300 may be performed in parallel.

In this way, a semiconductor device includes an integrated circuit and one or more guard rings around the integrated circuit in a top view of the semiconductor device. At least one guard ring of the one or more guard rings includes an active region in the substrate, a first plurality of elongated conductive structures extending in a first direction in the top view of the semiconductor device and arranged in a second direction in the top view of the semiconductor device, and a second plurality of elongated conductive structures extending in the second direction and arranged in the first direction. The combination of the first and second pluralities of elongated conductive structures forms a conductive grid above the active region, and provides increased coverage of the surface area of the active region relative to including only the first plurality of elongated conductive structures or only the second plurality of elongated conductive structures. The combination of the first and second pluralities of elongated conductive structures enables the coverage of the surface area to be increased in both the first direction and the second direction within a footprint or boundary of an interconnect structure above the first and second pluralities of conductive structures. In this way, the first and second pluralities of conductive structures enable a high amount of charge carrier absorption to be achieved in the semiconductor device (which may reduce the likelihood of latch-up in the semiconductor device) while enabling a short distance or spacing between adjacent integrated circuits in the semiconductor device to be achieved.

As described in greater detail above, some implementations described herein provide a semiconductor device. The semiconductor device includes an integrated circuit. The semiconductor device includes a guard ring structure surrounding the integrated circuit in a top view of the semiconductor device. The guard ring structure includes an active region a first plurality of conductive structures above the active region, where the first plurality of conductive structures extend in a first direction in the semiconductor device and are arranged in a second direction in the semiconductor device that is approximately perpendicular to the first direction a second plurality of conductive structures above the active region, where the second plurality of conductive structures extend in the second direction and are arranged in the first direction. The semiconductor device includes an interconnect structure above the guard ring structure.

As described in greater detail above, some implementations described herein provide a semiconductor device. The semiconductor device includes an integrated circuit. The semiconductor device includes a guard ring structure surrounding the integrated circuit in a top view of the semiconductor device. The guard ring structure includes a first plurality of conductive structures, where the first plurality of conductive structures extend in a first direction in the semiconductor device and are arranged in a second direction in the semiconductor device that is approximately perpendicular to the first direction. The guard ring structure includes a second plurality of conductive structures above the active region, where the second plurality of conductive structures extend in the second direction and are arranged in the first direction and a first length of a first subset of the second plurality of conductive structures is greater than a second length of a second subset of the second plurality of conductive structures. The guard ring structure includes plurality of polysilicon structures extending in the first direction, where each of the polysilicon structures is located between adjacent pairs of the first plurality of conductive structures. The semiconductor device includes a first interconnect structure above the guard ring structure, where at least a first subset of the first plurality of conductive structures is within a footprint of the first interconnect structure. The semiconductor device includes a second interconnect structure above the guard ring structure, where at least a second subset of the first plurality of conductive structures is within a footprint of the second interconnect structure.

As described in greater detail above, some implementations described herein provide a method. The method includes providing an active region around an integrated circuit of a semiconductor device. The method includes forming, above the active region, a first plurality of conductive structures extending in a first direction of the semiconductor device and arranged in a second direction in the semiconductor device that is approximately perpendicular with the first direction. The method includes forming, above the active region, a second plurality of conductive structures extending in the second direction and arranged in the first direction, where the first plurality of conductive structures and the second plurality of conductive structures intersect to form a guard ring structure above the active region. The method includes forming one or more interconnect structures above the guard ring structure.

The terms "approximately" and "substantially" can indicate a value of a given quantity or magnitude that varies within 5% of the value (e.g., ±1%, ±2%, ±3%, ±4%, ±5% of the value). These values are merely examples and are not intended to be limiting. It is to be understood that the terms "approximately" and "substantially" can refer to a percentage of the values of a given quantity in light of this disclosure.

As used herein, "satisfying a threshold" may, depending on the context, refer to a value being greater than the threshold, greater than or equal to the threshold, less than the threshold, less than or equal to the threshold, equal to the threshold, not equal to the threshold, or the like.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
an integrated circuit;
a guard ring structure surrounding the integrated circuit in a top view of the semiconductor device,
wherein the guard ring structure comprises:
an active region;
a first plurality of conductive structures above the active region,
wherein the first plurality of conductive structures extend in a first direction in the semiconductor device and are arranged in a second direction in the semiconductor device that is approximately perpendicular to the first direction; and
a second plurality of conductive structures above the active region,
wherein the second plurality of conductive structures extend in the second direction and are arranged in the first direction; and
an interconnect structure above the guard ring structure.

2. The semiconductor device of claim 1, wherein an entirety of the first plurality of conductive structures is located within a footprint of the interconnect structure; and
wherein portions of the second plurality of conductive structures extend laterally outward from the interconnect structure.

3. The semiconductor device of claim 1, wherein the first plurality of conductive structures extend laterally outward from the active region.

4. The semiconductor device of claim 1, wherein an entirety of the first plurality of conductive structures and an entirety of the second plurality of conductive structures are located within a footprint of the interconnect structure.

5. The semiconductor device of claim 1, wherein the second plurality of conductive structures extend laterally outward from the active region.

6. The semiconductor device of claim 1, wherein the guard ring structure further comprises:
a polysilicon structure above the active region,
wherein the polysilicon structure extends in the first direction and is located between a first subset of the first plurality of conductive structures and a second subset of the first plurality of conductive structures.

7. The semiconductor device of claim 6, wherein the polysilicon structure extends laterally outward from the active region.

8. A semiconductor device, comprising:
an integrated circuit;
a guard ring structure surrounding the integrated circuit in a top view of the semiconductor device,
wherein the guard ring structure comprises:
a first plurality of conductive structures,
wherein the first plurality of conductive structures extend in a first direction in the semiconductor device and are arranged in a second direction in the semiconductor device that is approximately perpendicular to the first direction;
a second plurality of conductive structures,
wherein the second plurality of conductive structures extend in the second direction and are arranged in the first direction, and
wherein a first length of a first subset of the second plurality of conductive structures is greater than a second length of a second subset of the second plurality of conductive structures; and
plurality of polysilicon structures extending in the first direction,
wherein each of the polysilicon structures is located between adjacent pairs of the first plurality of conductive structures;
a first interconnect structure above the guard ring structure,
wherein at least a first subset of the first plurality of conductive structures is within a footprint of the first interconnect structure; and
a second interconnect structure above the guard ring structure,
wherein at least a second subset of the first plurality of conductive structures is within a footprint of the second interconnect structure.

9. The semiconductor device of claim 8, wherein at least a third subset of the first plurality of conductive structures are located under and extend between the first interconnect structure and the second interconnect structure.

10. The semiconductor device of claim 8, wherein a third length of a third subset of the first plurality of conductive structures is greater than a fourth length of a fourth subset of the first plurality of conductive structures.

11. The semiconductor device of claim 8, wherein portions of the plurality of polysilicon structures are located under the second plurality of conductive structures.

12. The semiconductor device of claim 8, wherein the guard ring structure further comprises an active region; and
wherein the plurality of polysilicon structures, the first plurality of conductive structures, and the second plurality of conductive structures are located above the active region.

13. The semiconductor device of claim 8, wherein at least one of the plurality of polysilicon structures is located between the first interconnect structure and the second interconnect structure.

14. The semiconductor device of claim 8, wherein at least one of the plurality of polysilicon structures is located under and extends between the first interconnect structure and the second interconnect structure.

15. A method, comprising:
providing an active region around an integrated circuit of a semiconductor device;
forming, above the active region, a first plurality of conductive structures extending in a first direction of the semiconductor device and arranged in a second direction in the semiconductor device that is approximately perpendicular with the first direction;

forming, above the active region, a second plurality of conductive structures extending in the second direction and arranged in the first direction, wherein the first plurality of conductive structures and the second plurality of conductive structures intersect to form a guard ring structure above the active region; and forming one or more interconnect structures above the guard ring structure.

16. The method of claim 15, wherein the active region is a first active region of the semiconductor device;

wherein the guard ring structure is a first guard ring structure of the semiconductor device; and wherein the method further comprises:

providing a second active region around the first active region;

forming, above the second active region, a third plurality of conductive structures extending in the first direction and arranged in the second direction; and forming, above the second active region, a fourth plurality of conductive structures extending in the second direction and arranged in the first direction, wherein the third plurality of conductive structures and the fourth plurality of conductive structures intersect to form a second guard ring structure above the second active region.

17. The method of claim 16, further comprising:

forming a first a plurality of polysilicon structures above the first active region, wherein the first plurality of polysilicon structures extend in the first direction; and forming a second plurality of polysilicon structures above the second active region, wherein the second plurality of polysilicon structures extend in the first direction.

18. The method of claim 15, wherein the integrated circuit is a first integrated circuit of the semiconductor device;

wherein the active region is a first active region of the semiconductor device;

wherein the guard ring structure is a first guard ring structure of the semiconductor device; and wherein the method further comprises:

providing a second active region around a second integrated circuit that is adjacent to the first integrated circuit;

forming, above the second active region, a third plurality of conductive structures extending in the first direction and arranged in the second direction; and forming, above the second active region, a fourth plurality of conductive structures extending in the second direction and arranged in the first direction, wherein the third plurality of conductive structures and the fourth plurality of conductive structures intersect to form a second guard ring structure above the second active region.

19. The method of claim 18, further comprising:

forming a first a plurality of polysilicon structures above the first active region, wherein the first plurality of polysilicon structures extend in the first direction; and forming a second plurality of polysilicon structures above the second active region, wherein the second plurality of polysilicon structures extend in the first direction.

20. The method of claim 18, further comprising:

providing a third active region around the first active region;

forming, above the third active region, a fifth plurality of conductive structures extending in the first direction and arranged in the second direction; and forming, above the second active region, a sixth plurality of conductive structures extending in the second direction and arranged in the first direction, wherein the fifth plurality of conductive structures and the sixth plurality of conductive structures intersect to form a third guard ring structure above the first active region.

* * * * *